United States Patent
Chaves et al.

(10) Patent No.: US 7,286,296 B2
(45) Date of Patent: *Oct. 23, 2007

(54) OPTICAL MANIFOLD FOR LIGHT-EMITTING DIODES

(75) Inventors: Julio C. Chaves, Santa Ana, CA (US); Waqidi Falicoff, Newport Beach, CA (US); Juan C. Miñano, Madrid (ES); Pablo Benitez, Madrid (ES); Oliver Dross, Madrid (ES); William A. Parkyn, Jr., Lomita, CA (US); Roberto Alvarez, South Pasadena, CA (US)

(73) Assignee: Light Prescriptions Innovators, LLC, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/115,055

(22) Filed: Apr. 25, 2005

(65) Prior Publication Data

US 2005/0243570 A1 Nov. 3, 2005

Related U.S. Application Data

(60) Provisional application No. 60/658,713, filed on Mar. 3, 2005, provisional application No. 60/614,565, filed on Sep. 29, 2004, provisional application No. 60/612,558, filed on Sep. 22, 2004, provisional application No. 60/564,847, filed on Apr. 23, 2004.

(51) Int. Cl.
| G02B 27/30 | (2006.01) |
| G02B 13/18 | (2006.01) |
| G02B 3/02 | (2006.01) |
| F21V 9/16 | (2006.01) |
| F21V 7/00 | (2006.01) |

(52) U.S. Cl. .................... 359/641; 359/712; 362/84; 362/341

(58) Field of Classification Search ................ 359/641, 359/720, 708–712; 362/84, 222, 268, 335, 362/341, 346–347
See application file for complete search history.

(56) References Cited

U.S. PATENT DOCUMENTS 3,739,217 A    6/1973  Bergh et al.

(Continued)

OTHER PUBLICATIONS

Miles et al., Hemispheric-filed-of-view, nonimaging narrow-band spectral filter, Optics Letters, vol. 6, No. 12 (Dec. 1981) pp. 616-618.

*Primary Examiner*—Alicia M Harrington
(74) *Attorney, Agent, or Firm*—Drinker Biddle & Reath LLP

(57) ABSTRACT

An optical manifold for efficiently combining a plurality of LED outputs into a single, substantially homogeneous output, in a small, cost-effective package. The optical manifolds can be used to combine multiple LEDs of the same color and provide a high intensity output aperture with very high uniformity and sharp borders, or they can be used to generate a multiwavelength output, such as red, green, and blue LEDs that are combined to generate white light. Embodiments are also disclosed that use a single or multiple LEDs and a remote phosphor and an intermediate wavelength-selective filter arranged so that backscattered photoluminescence is recycled to boost the luminance and flux of the output aperture. The optical manifolds are designed to alleviate substantial luminance inhomogeneities inherent to LEDs. The optical manifold utilizes principles of nonimaging optics to transform light and provide directed, substantially uniform light sources.

28 Claims, 56 Drawing Sheets

U.S. PATENT DOCUMENTS

| | | |
|---|---|---|
| 3,957,031 A | 5/1976 | Winston |
| 4,002,499 A | 1/1977 | Winston |
| 4,362,361 A | 12/1982 | Campbell et al. |
| 5,813,753 A | 9/1998 | Vriens et al. ............... 362/293 |
| 6,186,650 B1 | 2/2001 | Hulse et al. |
| 6,350,041 B1 | 2/2002 | Tarsa et al. |
| 6,549,710 B2 | 4/2003 | Simmons et al. |
| 6,556,754 B2 | 4/2003 | Simmons et al. |
| 6,655,848 B2 | 12/2003 | Simmons et al. |
| 6,784,462 B2 | 8/2004 | Schubert |
| 6,819,687 B1 | 11/2004 | Fein |
| 6,832,032 B2 | 12/2004 | Simmons et al. |
| 6,847,774 B2 | 1/2005 | Simmons et al. |
| 6,850,684 B2 | 2/2005 | Simmons et al. |
| 6,869,206 B2 | 3/2005 | Zimmerman et al. |
| 7,080,932 B2 | 7/2006 | Keuper ....................... 362/613 |
| 7,144,131 B2 | 12/2006 | Rains ......................... 362/231 |
| 2004/0145308 A1 | 7/2004 | Rossner et al. ............. 313/512 |
| 2005/0105301 A1 | 5/2005 | Takeda et al. |
| 2005/0117361 A1 | 6/2005 | Takeda et al. |
| 2005/0269582 A1 | 12/2005 | Mueller et al. ............... 257/94 |
| 2006/0002101 A1* | 1/2006 | Wheatley et al. ............. 362/84 |

* cited by examiner

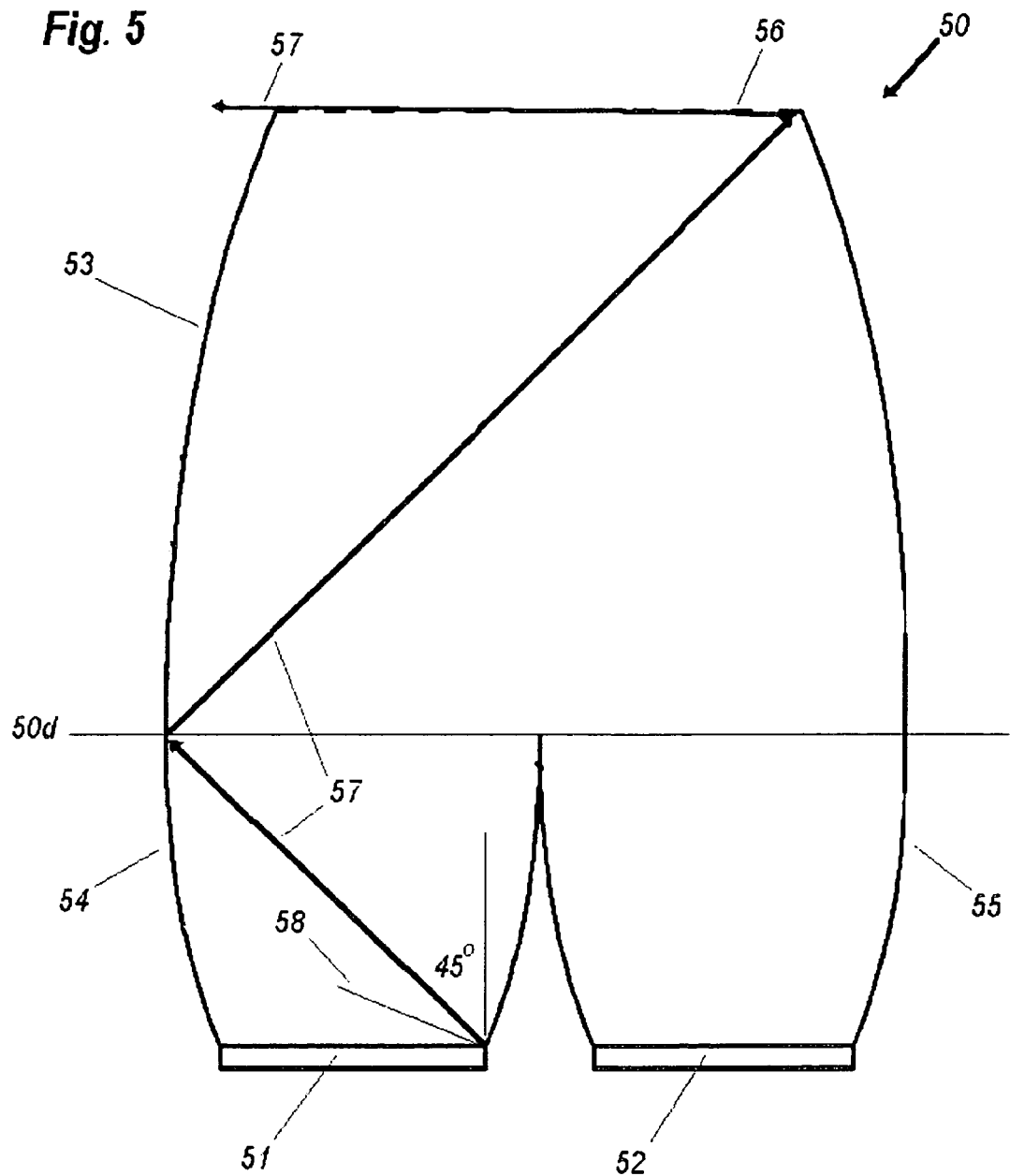

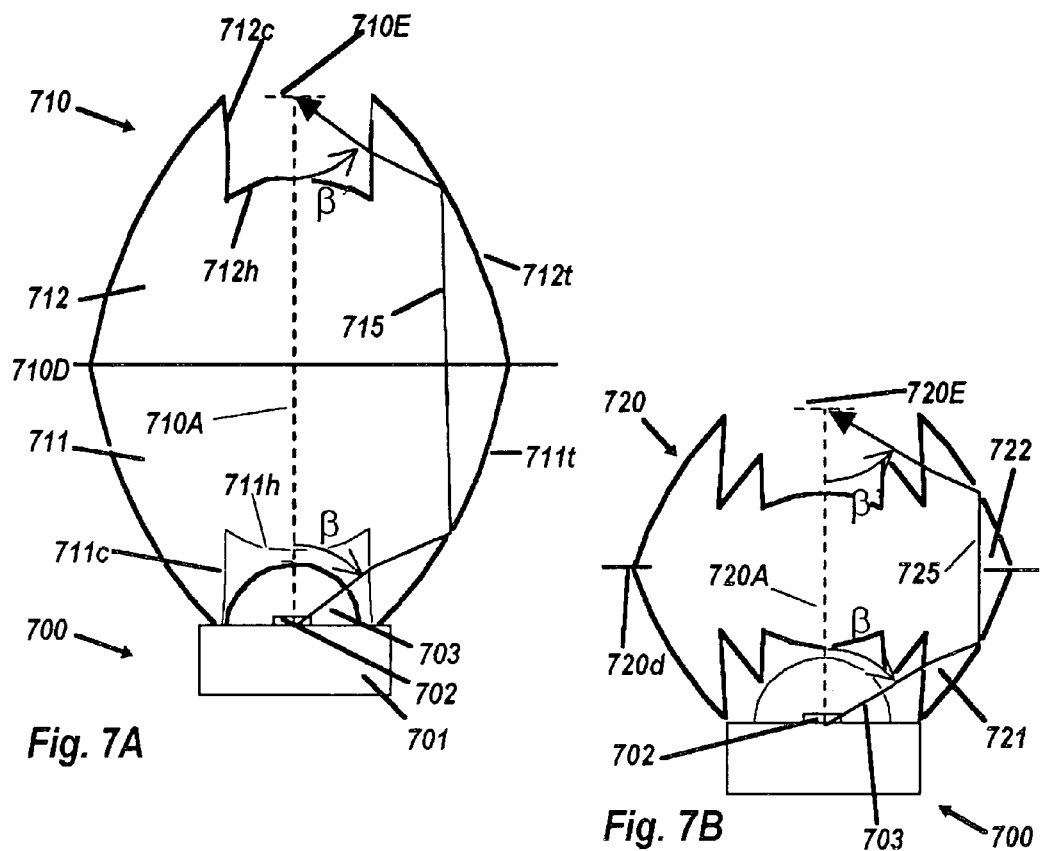
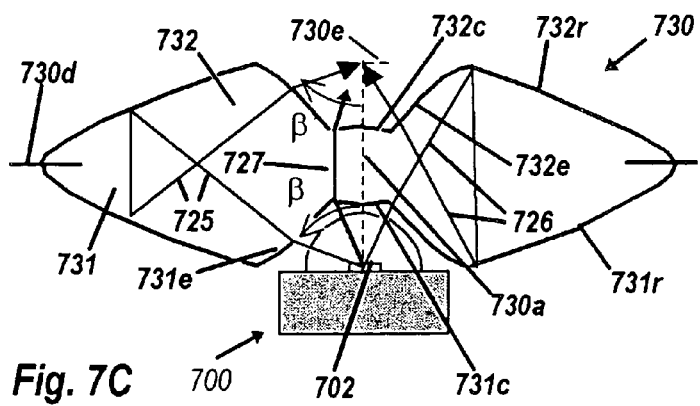

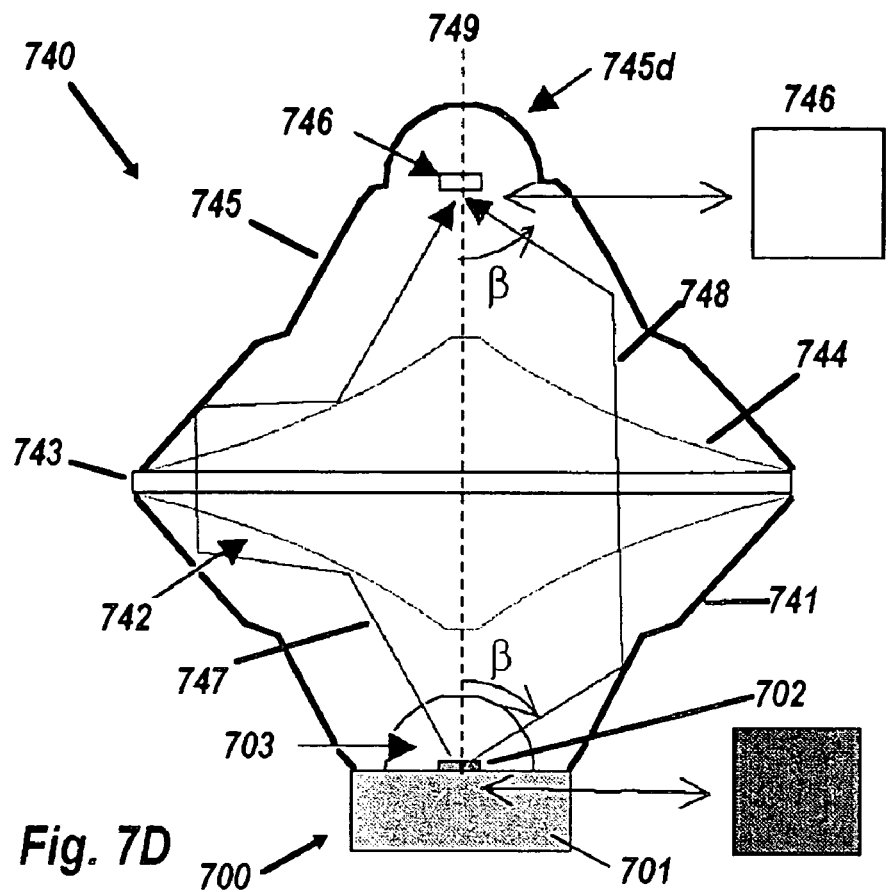
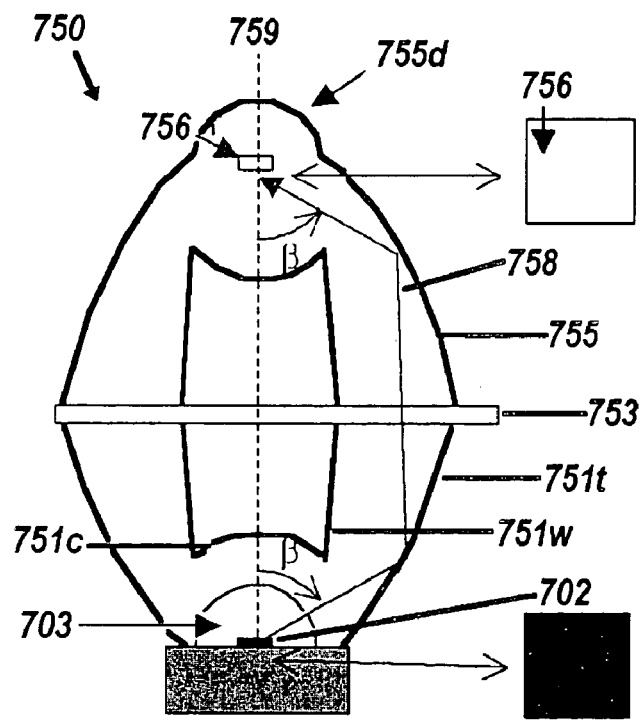
Fig. 7D
Fig. 7E

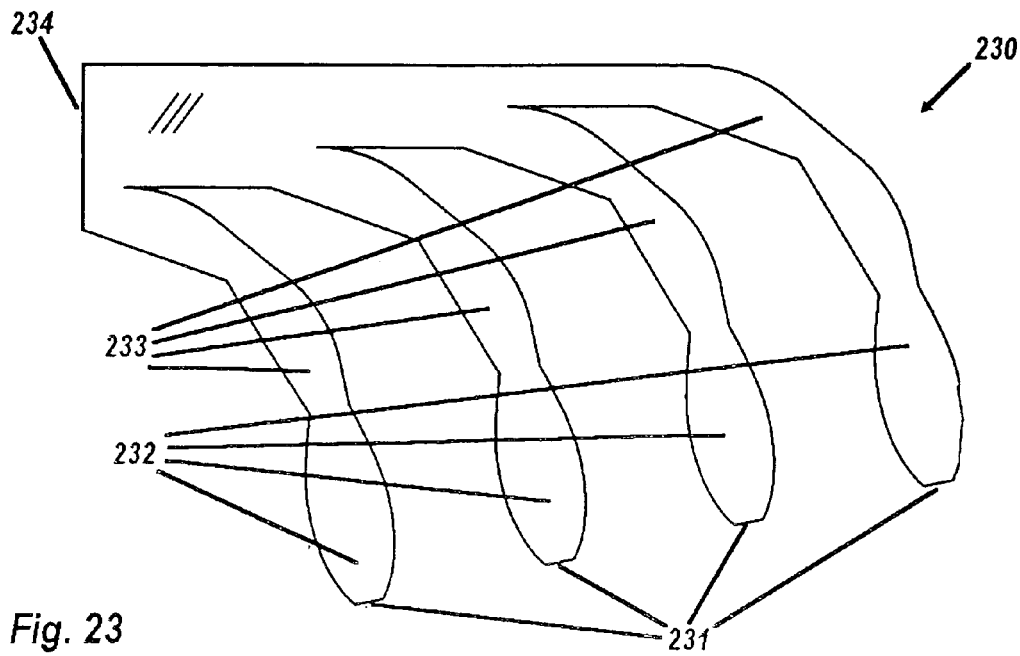
Fig. 23
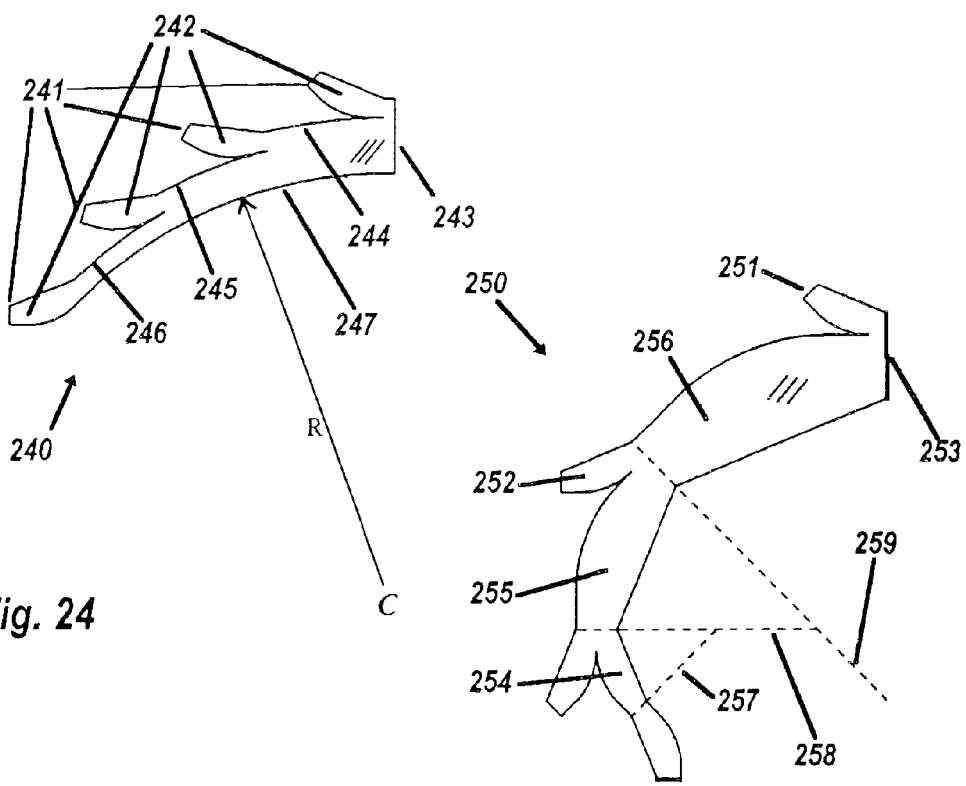
Fig. 24
Fig. 25

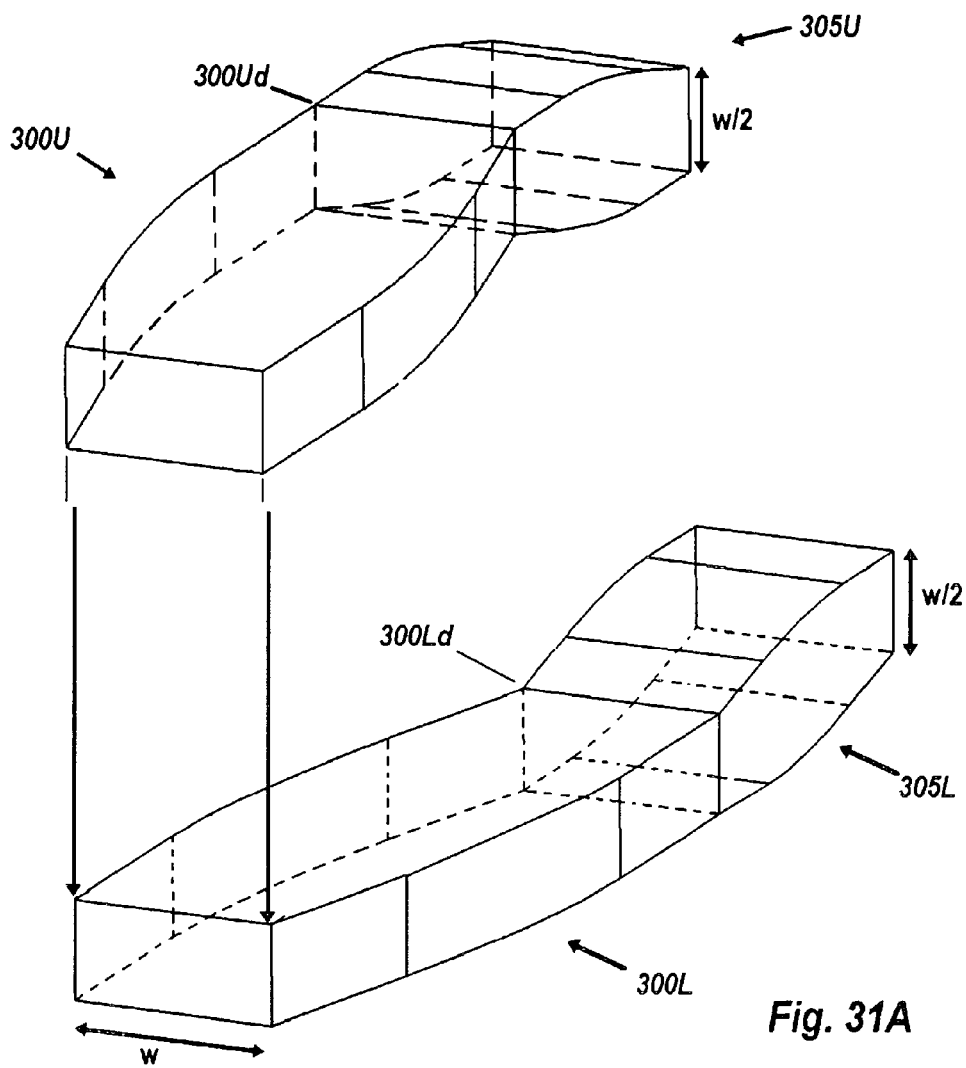
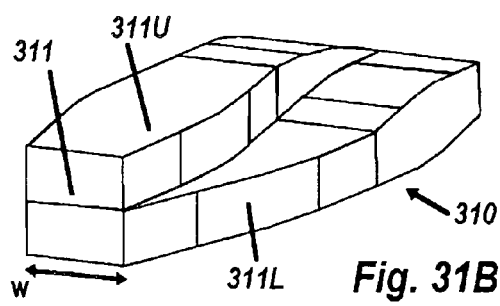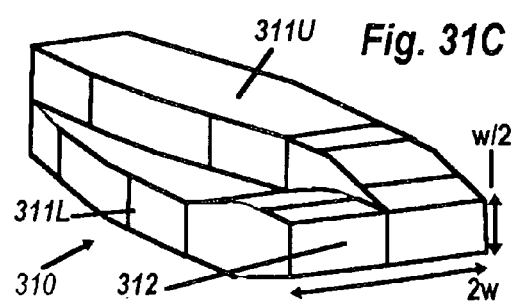

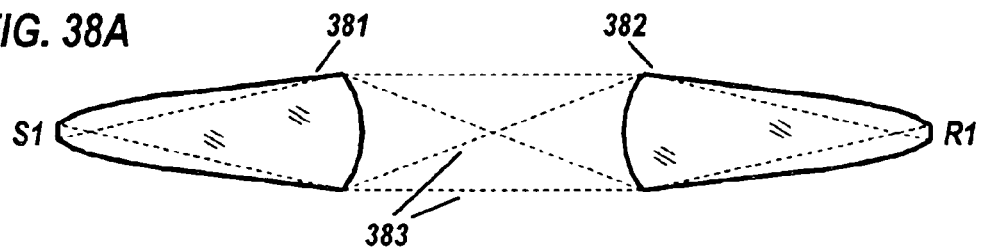
FIG. 38A
FIG. 38B
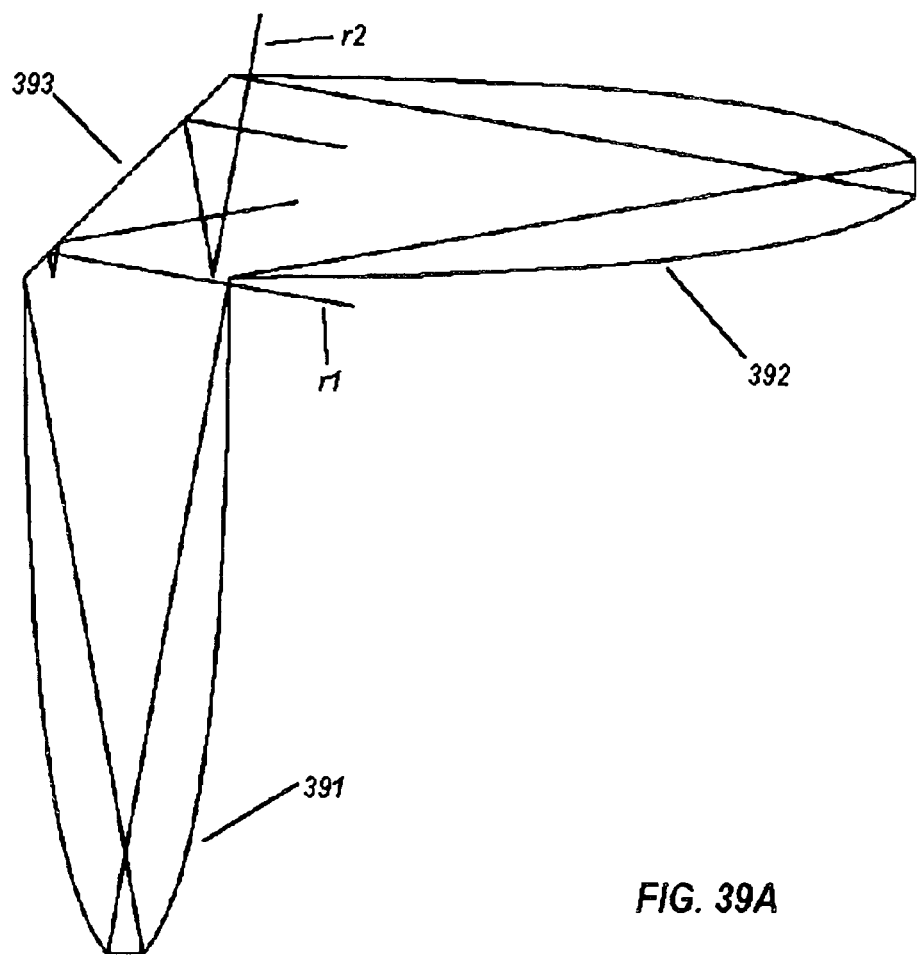
FIG. 39A

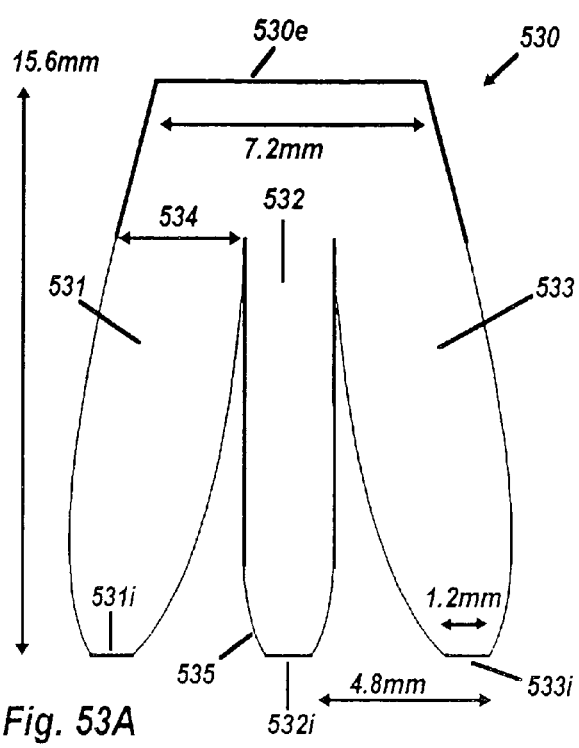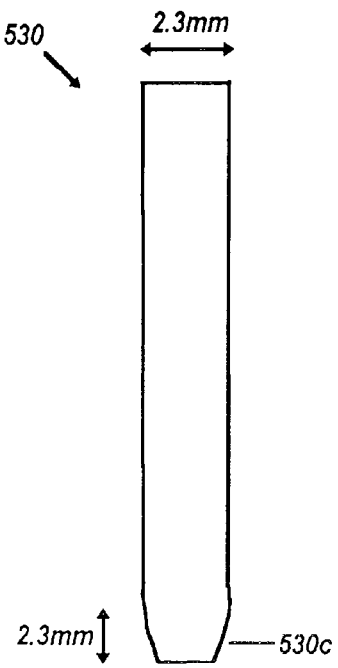
Fig. 53A
Fig. 53B
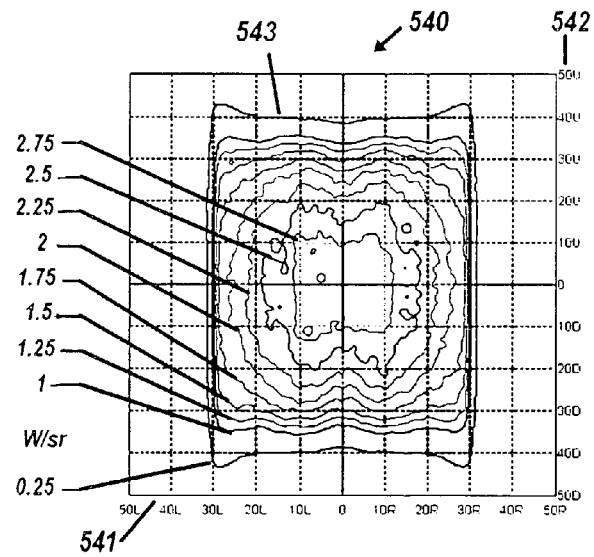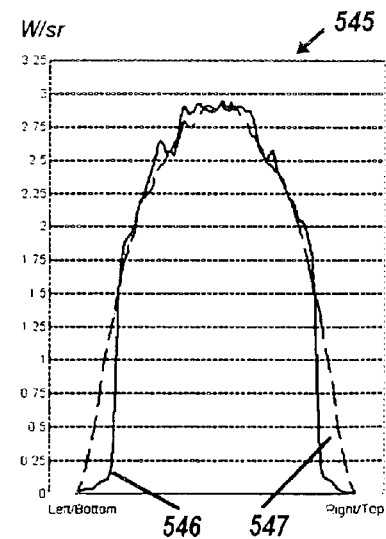
Fig. 54A
Fig. 54B

550

OPTICAL MANIFOLD FOR LIGHT-EMITTING DIODES

CROSS-REFERENCE TO RELATED APPLICATION

Priority is hereby claimed to U.S. Provisional Patent Application No. 60/658,713, filed Mar. 3, 2005, entitled OPTICAL MANIFOLDS FOR LIGHT-EMITTING DIODES, which is incorporated by reference herein in its entirety.

Priority is hereby claimed to U.S. Provisional Patent Application No. 60/614,565, filed Sep. 29, 2004, entitled OPTICAL MANIFOLDS FOR LIGHT-EMITTING DIODES, which is incorporated by reference herein in its entirety.

Priority is hereby claimed to U.S. Provisional Patent Application No. 60/612,558, filed Sep. 22, 2004, entitled OPTICAL MANIFOLDS FOR LIGHT-EMITTING DIODES, which is incorporated by reference herein in its entirety.

Priority is hereby claimed to U.S. Provisional Patent Application No. 60/564,847, filed Apr. 23, 2004, entitled OPTICAL MANIFOLDS FOR LIGHT-EMITTING DIODES, which is incorporated by reference herein in its entirety.

BACKGROUND OF THE INVENTION

1. Field of the Invention

The present invention relates generally to light-emitting diodes (LEDs), and more particularly to light collection/distribution systems that utilize one or more LEDs.

2. Description of Related Art

Light emitting diodes (LEDs) are a widely available, inexpensive, and efficient light source. For low light uses such as camping headlamps, one or two LEDs provide adequate light. However, to utilize LEDs for applications that require more light, such as automobile headlamps, it is necessary to combine the outputs of plurality of LEDs. The LED prior art is less than satisfactory regarding the combination of the luminous outputs of plurality of emitter-chips. Physical chip-adjacency can indeed produce a larger light source, but heat-removal limitations reduce the total luminance. Also, there is little continuity of illuminance between the adjacent emitters, leaving dark zones between the individual emitters. LEDs are available from a wide variety of suppliers, and in commercially available LEDs the emitters themselves have pronounced variations in luminance. For example, some suppliers (e.g., the OSRAM Corporation of San Jose, Calif. and the Cree Corporation of Santa Barbara, Calif.) manufacture high-power LEDs with wires and bonding pads that block light from the top of the emitting chip. In contrast, high-power LEDs from the Lumileds Corporation of San Jose, Calif. exemplify flip-chips, which have no wires or bonds that would otherwise block light emission in front. Even these, however, show great luminance variations across the emitter. The Luxeon I and Luxeon III LEDs by Lumileds, for example, can vary in luminance by a factor of ten from center to edge, with random patterns in between that differ from one chip to the next. Such undesirable patterning, whether on flip-chips or front-wired chips, can cause detrimental artifacts in the beams of collimating or condensing lenses. Although diffusers can be placed over such lenses, diffusers lose 15% of the light and give the beam a fuzzy edge. A more efficient method of source homogenizing, one that preserves sharp edges, would be a significant advance in illumination optics. Although thin-film LEDs have greatly improved uniformity over conventional on-substrate LEDs, there are fundamental reasons why they will always have nonuniform illuminance, because of inherently nonuniform current distribution downward through the active, light-generating layer. Using larger soldered electrodes causes more useless surface recombination at their juncture with the LED, so that electrodes must be kept small. In contrast, the optical transformer described herein places a premium on a corner location for the current-feed, amplifying the nonuniformity. Because the untreated sawed edges of the LED chip will cause surface recombination, current cannot be allowed to reach them, so that the LED cannot be illuminated all the way to its edge. It would be an advantage to provide an optical transformer that alleviates luminance inhomogeneities inherent to LEDs.

Beyond making a single source uniform, a better optical method is needed for combining the outputs of spatially separate LED chips, which are easier to cool than when closely packed. Such an optical source-combination means should optimally produce a uniform luminance with sharp edges. Besides easier thermal management, optical source-combination is needed that makes unnoticeable the individual variations or even failures of any of the LEDs.

The LED prior art is also less than satisfactory regarding the geometry of phosphor utilization in LEDs, such as for LEDs that generate white light. A phosphor coating of a quarter-millimeter (250 microns) or more directly onto a one-mm blue chip will necessarily increase source area, sometimes by a factor of four, and thus reduce luminance. The application of phosphor to such small chips necessarily results in color-temperature variations across each chip and between them as well. Also, much of the phosphor output backscatters; that is, it shines wastefully back into the chip, which is relatively absorptive. Finally, the phosphor must withstand the chip's high operating temperature, and differential thermal expansion poses adhesion problems, greatly reducing output if the phosphor should work loose. Although a thinner phosphor layer would have less problem with stress, as well as more luminance, only one manufacturer, Lumileds Corporation, for example, has the advanced phosphor deposition technology for the conformal 25-micron coating of their white LEDs, ten times thinner than the rest. (Laboratory samples from other companies have been exhibited but the processes have not been proven to be commercially viable at this time.) Even these devices vary in color-temperature, across their faces as well as from chip to chip.

It would be an advantage if the phosphor could be situated away from the LED; particularly, it would be an advantage if the phosphor layer in a LED device was positioned remotely enough to be unaffected by the temperature variations of the LED itself. Such a phosphor target could then be as small as the combined area of the separate LED chips, to maximize luminance. Conventional arrays of white LEDs suffer from variations in color temperature. In order to overcome this problem manufacturers employ expensive binning procedures. However, with the current state-of-the-art LEDs, there is still considerable variation in the color temperature, even using tight bins. Further, since an array of close-packed LEDs must have a spacing that is one or more chip widths, simple application of phosphor over the entire array would result in a diluted, highly uneven luminance.

Achieving higher white luminance from an LED, with uniformity and color-consistency, is critical for LED market penetration into general lighting uses, where the lower power consumption and longer life of LEDs can greatly contribute to energy conservation. Larger and more efficient phosphor coatings can be utilized if they can be separate from their blue-light sources. Such an advance could particularly benefit automotive headlamps, where current white LEDs are marginal at best in luminance. In fact, color temperature variations across a beam could lead to excess blue light, which is ophthalmologically hazardous.

In some applications it is advantageous to produce a number of smaller size sources from a single larger source. This is useful for example when an optical design is difficult to mold because the optical component would be too thick and/or too large. If such a large single source is separated into a number of smaller size sources of the same total area, the same lens design can be used for each such source, just scaled down to a moldable size. It would also be desirable that these smaller sources are more uniform than the larger parent source, or that they have a prescribed luminance output.

In other applications it would be useful to change the shape of a single source or multiple sources to another shape, such as from a square to a rectangle of a substantially equal area or visa versa. This is useful for such applications as LED headlamps where it is desirable to generate rectangular sources with aspect ratios (length to width) of between two to one to six to one. Such a method must, of course, preserve source luminance as much as possible.

Finally, it is desirable to have a highly efficient means of producing white LED light sources without the use of phosphors, by combining two or more LEDs of a different wavelength into a single homogeneous source. Traditionally, the approach has been to use three different colored LEDs to make white light, commonly a red, a green, and a blue LED. However, the traditional optical approaches do not produce a rectangular or square uniform light source using such RGB light sources. It would be beneficial to have means of producing a light source combining more than three LED wavelengths. Additionally, it would be useful to have a means of producing such light sources where the chromaticity of the light source is adjustable.

SUMMARY OF THE INVENTION

Optical manifolds are described herein that provide the ability to efficiently combine a plurality of LED outputs into a single output that is substantially homogeneous, in a small, cost-effective package that may be made of a dielectric material. Optical manifolds are described that can be used to combine multiple LEDs of the same color to provide a high flux and high intensity output beam, or can be used to generate a multi-wavelength beam. For example, a red, green, and blue LED can be combined to make a "white" output. Embodiments are also disclosed that use a single LED or multiple LEDs and a remote phosphor coating arranged so that backscatterd photoluminescence is recycled to the output. The optical manifolds use principles of non-imaging optics, and are designed to substantially alleviate luminance variations on the emitting surfaces of LEDs, and provide a substantially uniform light source. In addition, these optical manifolds can be used to produce a variety of non-square shaped light sources using square-shaped LEDs, including rectangular and asymmetric high flux light sources. These high-flux sources are useful for many applications such as for solid state lighting automobile headlamps. For example, for this application it is desirable to have a uniform rectangular LED-based light source with length to width ratio of 4 to 1. This is achievable with the optical manifold described herein. Solid-state lighting in general, and light-emitting diodes in particular, will find new applications through the benefits of the optical transformer described herein. To provide, for example a white LED, an optical system is disclosed for delivering the light of one or more blue chips to a spatially separate phosphor. Such a phosphor target could then be as small as the combined area of the separate chips, to maximize luminance. The phosphor layer is positioned remotely enough to be unaffected by the temperature variations of the LED itself.

The optical transformer described herein relates generally to utilizing the principles of non-imaging optics to fulfill the above-discussed illumination-engineering needs, via the origination of a new type of optical manifold. The edge-ray principle of non-imaging optics sets forth the surfaces of minimal increase of source etendue, a central quantity of non-imaging optics. Etendue is the product of source area $A_s$ and the projected solid angle of the source's output, multiplied by the square of the refractive index n of the optical medium surrounding the source:

$$E = n^2 A_s \sin^2\theta$$

where $\theta$ is the off-normal angle of the solid conical angle which is equivalent to the source's radiation pattern. A diffuse Lambertian emission into $2\pi$ steradians is represented by $\theta=90°$. This diffuse output is characteristic of the emission from an LED chip itself.

An ideal optical system conserves etendue, so that the enlarged output area of an ideal collimator leads to its usefully high intensity within a narrow beam angle, while the small size of the focal spot of a solar concentrator leads to the usefully multiplied flux from its wide beam angle.

The optical transformer described herein offers a new kind of optical manifold that provides etendue-limited illumination for collimated backlights, etendue-limited combination of plurality of light sources, and etendue-limited phosphor utilization. The useful fulfillment of these important tasks by the optical transformer described herein marks a new stage of LED evolution. For example, other photoluminescent materials besides phosphors can be used with the optical transformer described herein more easily than directly on LEDs, such as the photoluminescent semiconductor AlInGaP.

In particular, some embodiments disclosed herein will utilize total internal reflection only, and thus not need metallic reflector coatings to be applied to their surfaces. Further embodiments comprise injection-molded sub-sections that are assembled into a complete manifold for producing a large "virtual chip" from the emission of several LED chips of smaller size. The virtual chip has better uniformity of luminance and color than the actual chips, and can be configured with usefully restricted angular output. Also, controlled non-uniformity can be engineered along with such angular restrictions, enabling an intensity prescription to be met by placing the focal plane of a projection lens on the manifold output.

The reversibility of light paths dictates that the embodiments disclosed herein could equally well be used to disperse a large source by transforming it into several smaller ones, as with a single LED illuminating numerous instruments on an automotive dashboard. With the optical transformer described herein it would be easy to have a backup LED that also fed the optical manifold for the dashboard.

BRIEF DESCRIPTION OF THE DRAWINGS

For a more complete understanding of this invention, reference is now made to the following detailed description of the embodiments as illustrated in the accompanying drawing, wherein:

FIG. 5 is a cross-section of a reflective optical manifold reflector for two LEDs, each one having a CPC that feeds into a single, larger rectangular CPC, which provides the output;

FIG. 7A is a side view of an etendue-limited flux-transfer from a domed LED into an image in air;

FIG. 7B is a side view of an alternative etendue-limited flux-transfer from a domed LED into an image in air;

FIG. 7C is a side view of an alternative etendue-limited flux-transfer from a domed LED into an image in air;

FIG. 7D is a side view of a dual collimating lens with dichroic filter, also including a phosphor-coated surface;

FIG. 7E is a side view of another dual collimating lens with dichroic filter, also including a phosphor-coated surface;

FIG. 23 is a cross-section of an alternative embodiment of a 4:1 optical manifold, but with angular compressors for immersed inputs;

FIG. 24 is a cross-section of an optical manifold arranged in an approximately circular arc;

FIG. 25 is a cross-section of an optical manifold on an arc of decreasing radius;

FIG. 31A is an exploded, perspective view of another embodiment of an optical manifold that defines a monolithic etendue-squeezer;

FIG. 31B is a perspective view of the resulting monolithic etendue-squeezer shown in exploded view in FIG. 31A;

FIG. 31C is another perspective view of the monolithic etendue-squeezer shown in FIGS. 31A and 31B;

FIG. 38A is a cross-sectional view of a dielectric CPC illuminating another CPC;

FIG. 38B is a cross-sectional view of an alternate configuration of FIG. 38A;

FIG. 39A is a cross-sectional view of an alternative optical manifold that includes dielectric CPCs, illustrating the drawbacks of joining two CPCs at 90°;

FIG. 53A is a plan view of a triplex optical manifold;

FIG. 53B is a side view of the triplex optical manifold of FIG. 53A;

FIG. 54A is a contour graph of the far-field intensity emitted from the manifold of FIGS. 53A and 53B;

FIG. 54B shows the central horizontal and vertical profiles of the far-field intensity pattern emitted from the manifold of FIGS. 53A and 53B;

Corresponding reference characters indicate corresponding components throughout the several views of the drawings.

DETAILED DESCRIPTION

Figure 1A:
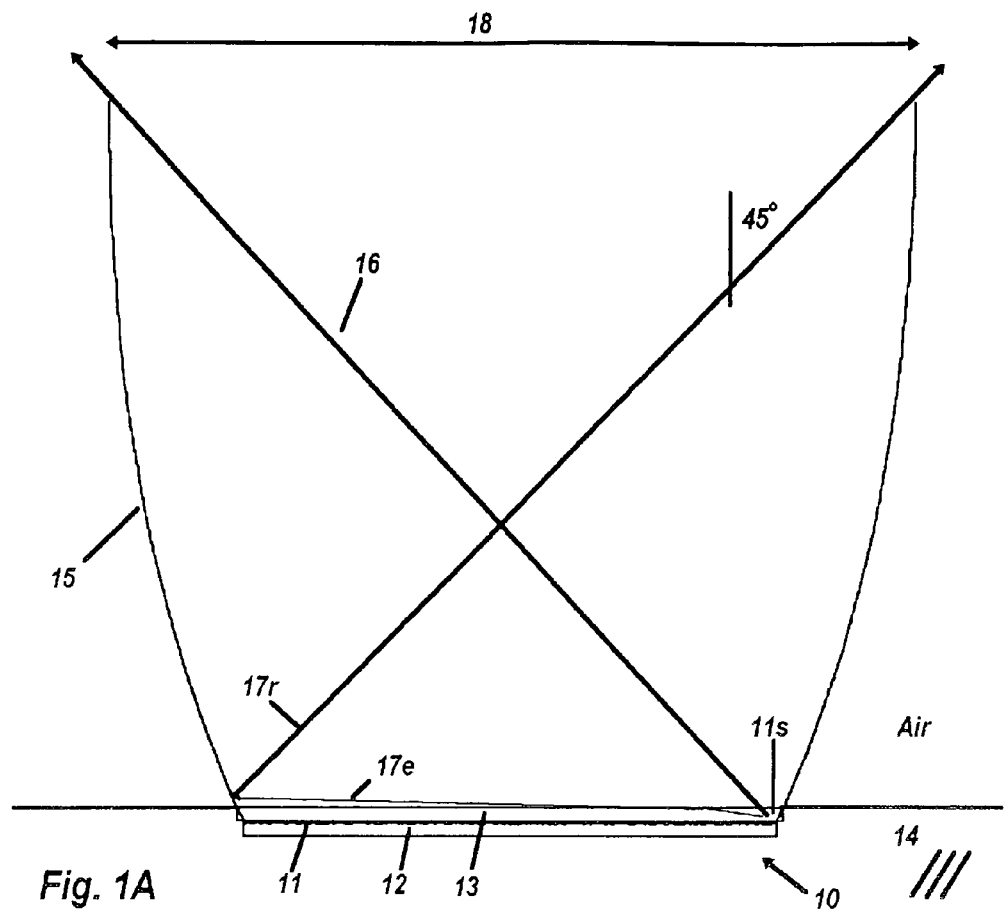
FIG. 1A is a cross-sectional view of a thin-film LED with an adjacent compound parabolic concentrator (CPC) reflector.

This invention is described in the following description with reference to the Figures, in which like numbers represent the same or similar elements.

Glossary of Terms and Acronyms

The following terms and acronyms are used throughout the detailed description:

| | |
|---|---|
| angle rotator | a device that delivers luminance from one plane to another lying at a tilt to the first |
| CEC | compound elliptical concentrator |
| CPC | compound parabolic concentrator |
| cross-CPC | a three-dimensional (3-D) configuration having a 2-D CPC profile in two orthogonal directions |
| dichroic filter | a filter that has two distinct transmission peaks |
| dome of LED | an approximately spherical LED cover made of transparent dielectric materials |
| edge-ray principle | the foundational principle of non-imaging optics, whereby a defining set of rays from the edge of an aperture are guaranteed to be delivered to the edge of another aperture, but the first aperture is not imaged onto the second |
| etendue | the optical manifestation of entropy, defined as the product of source area $A_s$ and the projected solid angle of the source's output, multiplied by the square of the refractive index n of the optical medium surrounding the source |
| ITO | indium tin oxide |
| LED | light emitting diode, a direct converter of low-voltage direct current to light in a narrow spectral band |
| luminaire | a twentieth-century neologism, replacing a 19$^{th}$-century usage of 'luminary', to describe a light source and functionally associated light-control apparatus, such as a reflector or a shade |
| luminance shifter | a device that delivers luminance to a different transverse coordinate |
| phosphor | a photoluminescent material that emits light in response to external excitation, often continuing after the excitation ceases |
| PMMA | polymethyl-methacrylate, the polymeric constituent of transparent acrylic plastic |
| RIIR lens | a lens system that has refractive (R) and internally-reflective (I) surfaces in the order specified |
| SMS | a method of optical design that generates a two-surface optical device that transforms two specified input wavefronts into two specified output wavefronts, such as disclosed in U.S. patent application Ser. Nos. 10/269/479 and 10/880,386, and in U.S. Pat. Nos. 6,639,733 and 6,867,929 |
| thin film LED | an LED that comprises very thin layers and emits nearly 100% of its radiation from its top face |
| TIR | total internal reflection |
| wavefront | a constant-phase surface in a propagating electromagnetic field |

Overview

For purposes of explanation, an "optical manifold" resembles the exhaust manifold of engines. In an optical manifold, channels are provided that either combine multiple light outputs into a single output, or distribute a single output over space. This term can designate a device for fiber optic fan-in and fan-out, such as in U.S. Pat. Nos. 6,850,684, 6,847,774, 6,832,032, 6,655,848, 6,556,754, and 6,549,710 by Simmons et al. This multi-input, multi-output function is an informational task that is distinct from the efficient distribution of illumination. In fiber-optics parlance, such distribution is sometimes called 'fan-in' and 'fan-out', denoting the joining of several optical paths into one.

The distinction between 'fan-in' and 'fan-out' is important when reversibility is considered. That is, some of such fiber-optic devices cannot be functionally interchanged, because some light on the reverse paths may spread out and be internally lost. However, it is an advantage to have a system that reversibly conveys light, so that its embodiments are operable in both directions. Thus the embodiments of the optical manifold described herein operate in both light-distribution, from a high-power source to many points of application, as well as light combining of many sources into one large synthetic source with the same luminance as its input sources.

The term "optical manifold" was used in U.S. Pat. No. 4,362,361 by Campbell, et al., but therein this term denotes a partially reflective coating that repeatedly allows a small part of a laser beam to escape reflection as it tunnels inside a slab, so that multiple beams are made from one. This usage differs from what has become the conventional usage, in that "optical manifold" now denotes branching many-to-one light paths.

U.S. Pat. No. 6,186,650 discloses an "optical manifold" of branching waveguides, with numerous embodiments illustrated. It is believed that an actual ray tracing of these structures, however, would show considerable leakage, as shown by FIG. 19A and FIG. 19B in that patent. Moreover, it is believed that this prior art does not conserve etendue, giving outputs that are much weaker than the input. This is because the squared-off endings of the ports will cause much of the guided light therein to be reflected backwards.

Etendue, like entropy, is a measure of optical disorder, basically being the product of spatial extent and angular extent. Increasing the etendue of light can be considered as the optical equivalent of turning work into waste-heat, where the optical work would be the luminance of light-emission, and the waste-heat would be the useless dispersion of this light. An "etendue-limited" optical device is one that delivers light with nearly the original luminance, once inevitable reflections and scatterings are accounted for. The optical transformer described herein is etendue-limited, in that the input area-angle product is preserved for light passing through it. Some embodiments of the optical transformer described herein receive light from plurality of sources to create a large, highly uniform synthetic source that will prove highly useful in the art of illumination. Other embodiments will form distributed lighting systems, as in vehicle dashboards, that preserve both luminosity and etendue, enabling fewer LED sources to be necessary to accomplish the illumination task.

One example of an etendue-limited optical element is the compound parabolic concentrator (CPC), disclosed by Winston in U.S. Pat. No. 4,002,499. Another is the compound elliptic concentrator (CEC), disclosed by Winston in U.S. Pat. No. 3,957,031. Both of these can be utilized as a building block of the optical transformer described herein. A recent case is the corner-turning element disclosed by Fein in U.S. Pat. No. 6,819,687, which is etendue-limited only for angles well under the critical angle (NA<1). Designed for use with the angular limitations of fiber-optic illumination, this device has significant limitations that are surpassed by a similar-looking but geometrically different angle-turning component of the optical transformer described herein. Fein's device is intended for the NA=0.5 range of fiber-optic illumination, so that light in the NA=1 range, which is that of the optical transformer described herein, would leak out of it. The optical transformer described herein has the NA=1 range because this enables it to convey four times the irradiance of NA=0.5 systems such as Fein's. A further limitation of Fein's device is the NA=1 that its design permits, because its primary application is right-angle turns in biomedical settings, for which two 45°-turners are utilized at NA=0.5. In contrast, the angle-rotating components of embodiments of the optical transformer described herein have very little leakage at any arbitrary turning angle of the NA=1 light it conveys, so that the 90° angle rotators illustrated herein could as easily be extended to comprise a 360° device suitable for a helical configuration, should such a novel requirement arise. This flexibility enables optical transformer embodiments described herein to address the entire span of applications of both light combining and light distribution, with maximal flux, something yet to be accomplished by the prior art. This flexibility is further exemplified by embodiments of the optical manifold disclosed herein comprised of two opposing angle-rotators acting as luminance shifters, another useful component of systems with arbitrary branching patterns of distributed illumination.

Another improvement provided herein regards manufacturability of optical transformers. In the prior art, such as exemplified in Fein, all the surfaces must be optically active on such optical angle-turning devices. This makes it difficult to have points of injection for a part without introducing lossy surface defects on the optically active surfaces. Optical transformers are described herein that overcome this problem by providing inactive surfaces along the length of the device that can be used for points of injection. The inactive surfaces can be used as a means of holding the devices, and they can be freely modified into a wide range of shapes, without affecting the shape of the active surfaces of the device. The inactive surfaces are deliberately created by the pattern of ray distribution within the angle-rotator, providing an envelope of non-interaction with the light field, within which non-lossy attachments may be made.

DESCRIPTION

A better understanding of the features and advantages of the optical transformer described herein will be obtained by reference to the following detailed description of the invention and accompanying drawings, which set forth illustrative embodiments in which the principles of the invention are utilized.

An optical manifold is described herein that receives light from plurality of solid-state sources and combines them into a single virtual-source output having little more etendue than the sum of the inputs. When the sources have different dominant wavelengths, the output light has the chromaticity of their calorimetric mixture. Due to the reversibility of light, the same shape of manifold could be used to disperse the light from a single large solid-state source among multiple virtual sources.

Two solid-state light sources in particular are contemplated for the optical transformer described herein: thin LEDs and dome-packaged high-power LEDs. Their packaging geometry dictates differing configurations of injection means for the optical transformer described herein. The prior art encompasses several types of injector means, including CPCs and immersion lenses, as well as conventional domed packaging.

FIG. 1A is a cross-sectional view of an optical manifold including a thin-film LED 10 comprising a light-emitting layer 11, reflective means 12, and a window 13. The LED 10 is embedded in a protective transparent epoxy 14. An external CPC reflector 15 is accurately situated on the surface of epoxy 14 so that it just straddles window 13 over LED 10, which is typically about a millimeter across. One advantage of the optical manifold described herein is that it allows more efficient cooling of larger (or multiple) LEDs. The difficulty of cooling larger or multiple chips is one of the motivations for the optical transformer described herein. (Electricity and heat-removal means are not shown.)

Thin-film LEDs, such as the LED 10 shown in FIG. 1A, emit nearly 100% of their output flux from the top surface of the device. Such devices have been produced in the laboratory and have been shown to the public by, for example OSRAM Semiconductors of Regensburg, Germany, which has begun producing them commercially in red and yellow with green and blue by the middle of the year 2005. A variety of thin emitter technologies are currently proposed by OSRAM Corporation of San Jose, Calif., including Indium Gallium Aluminum Phosphide (INGaAlP) and Indium Gallium Nitride (InGaN). All the emitting architectures shown by OSRAM Semiconductors to date use a wire bond on their top surface. The current thickness of the emitting layer in these devices is on the order of 0.1 microns and the overall chip depth is two to five microns. Therefore the side emissions from these devices are quite small, so they are ideally suitable for use in many of the embodiments of this invention.

FIG. 1A further shows source-point 11s emitting edge-ray 16, which just clears the upper edge of CPC 15. Also shown is edge ray 17e emitted horizontally, thereby intercepting the base of reflector 15, from which it is reflected into ray 17r, which in turn just clears the upper edge of CPC 15. The 45° design angle is shown. It applies to both direct ray 16 and reflected ray 17r. Double-arrow 18 denotes the width of the virtual source generated by CPC 15. Its width is 1/sin 45° times the width of emitting layer 11, thus preserving etendue.

Although FIG. 1A shows CPC 15 as a hollow metal reflector, it could as well be filled with a dielectric such as cast epoxy. If the 45° design angle would be slightly reduced to the critical angle (40°), the CPC would become slightly taller, and extreme rays 16 and 17r would be refracted to horizontal, for a planar air-interface across the top of CPC 15. Such a filled CPC would couple the LED into air with transverse magnification equal to the refractive index of the transparent filling material. (The area is increased by the factor of $n^2$.) For greater magnifications, a narrower design angle is needed. When that angle is reduced to 10°, reflector 15 can be dispensed with, since total internal reflection suffices, as shown in FIG. 2.

U.S. Pat. No. 3,739,217 by Berg and Saul teaches that the extraction of light from within a high-index-of-refraction body can be increased by roughening either a front emitting surface or a back surface of the high-index layer, where this roughened back surface interfaces with a reflective layer. However, the Berg et al. Patent does not specify the reflector-material nor does it indicate whether the reflector should be in direct contact with all surfaces of the high-index body. The Berg et al. Patent appears to indicate in its FIGS. 2 and 3 that there is an air gap between the illuminated body and the back reflector.

Figure 1B:
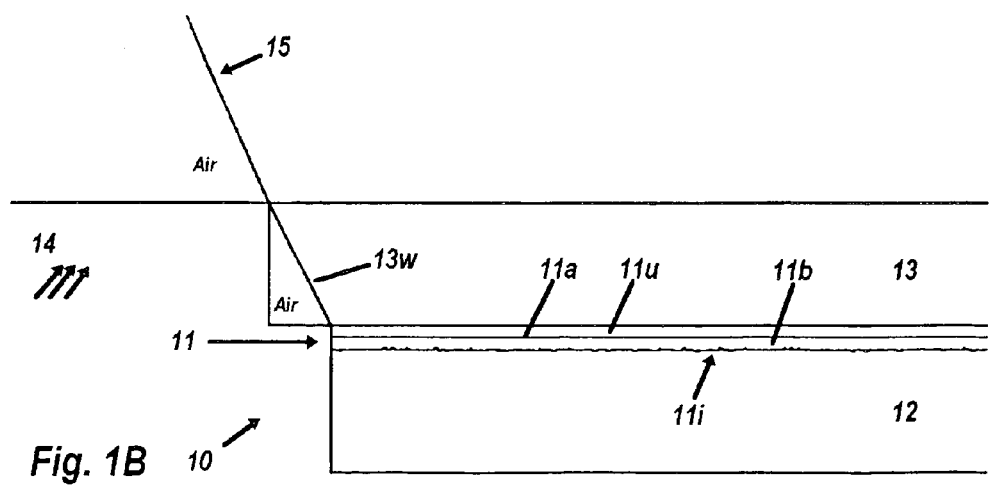
FIG. 1B is a magnified cross-sectional view of the top emitting LED in FIG. 1A with a diffuse reflector in contact with the active epitaxy layer.

FIG. 1B is a magnified view of the LED 10, showing emitting layer 11 comprising thin (approximately 0.1 microns) active layer 11a situated in the middle, InGaN layer 11u above it, and layer 11b below it. Window 13 can be seen to have slanted edge 13w to prevent light-escape. FIG. 1B further shows an approach to enhancing the luminous extraction efficiency of a top-emitting LED (or of a predominantly top-emitting LED) wherein electrically conductive reflective layer 12 also acts to power epitaxy layer 11, with which it is in direct contact. Roughened interface 11i is the contact surface. This roughening can be achieved on the epitaxy layer 11 by chemical etching or other well-known methods. Once the epitaxy layer is roughened, the reflective layer 12 can be deposited thereupon by vacuum, sputtering or other deposition methods.

The material properties of reflector layer 12 must be precisely specified to match with the properties of the epitaxy layer. For example, where an electrically conductive reflective layer is needed, a metallic material is best, and its index must have the proper complex value to achieve a high diffuse reflectance. For a blue LED using an epitaxy layer of GaInN or GaN for example, the visible-wavelength index of refraction of both GaInN and GaN is about 2.54. Calculating the reflectance of such a metal layer involves using the complex index of refraction in the Fresnel-reflection equations, so that both the real and imaginary components of the index of refraction of a candidate material are critical. The reflectance for rays striking at a zero incidence angle can provide a metric for choosing appropriate materials. A suitable equation for carrying out such an analysis is:

$$R=[(N_{epi}-N_s)^2+k_s^2]/[(N_{epi}+N_s)^2+k_s^2]$$

Where,

R is the reflectance at zero incidence at the interface of the epitaxy and the metal layer, $N_{epi}$ is the index of refraction of the epitaxy, $N_s$ is the real part of the index of refraction of the metal, and $k_s$ is the imaginary part of the index of refraction of the metal.

Assuming that the epitaxy layer has index 2.54, the metal needs the real component to be low and the imaginary component high. Silver has a low real component (0.12) and a very high imaginary component, over wavelengths ranging from 450 nm (k=2.47) to 700 nm (k=4.52). At 550 nm a thick layer of silver has an index of refraction (real) of approximately 0.12 and an imaginary value of 3.34. Plugging these values into the aforementioned equation yields a reflectance of 0.93. By way of comparison a layer of aluminum would have a much lower reflectance in contact with GaIN, as it has a real value of 0.76 and an imaginary value of 5.32 at 550 nm. In this case the reflectance at the interface of the two materials, for zero incidence angle rays, can be calculated by the same equation as 0.80. This is a very significant difference, especially with the extraction efficiency of the device having a non-linear relationship to the reflectance of this layer, because internal rays in the epitaxy undergo many boundary reflections before being either absorbed or extracted from the layer. Thus a small improvement in the reflectance of this bottom interface layer can produce a large improvement in the external quantum efficiency of the LED.

Such a reflective layer may also be made of dielectric materials using multi-layer approaches, particularly the Bragg reflector, common to the industry. However, electrical conductive paths known as vias must be introduced somewhere through this otherwise non-conductive layer, in order to power the semi-conductor. The use of a dielectric layer however may increase the internal resistance of the device and therefore increase the internal heat generated for a given applied voltage. Further, it is known that it is very difficult to design a Bragg reflector which has high reflectance for a wide range of wavelengths and incidence angle. This is especially a problem for LEDs which employ conformal phosphor coatings on the die. Thus silver may be deemed a superior solution over a dielectric reflector as it performs well over a wide range of incidence angles and wavelengths.

U.S. Pat. No. 6,784,462 teaches how to make an "omnidirectional" back reflector with very high reflectance for an LED by combining a quarter wavelength layer of Indium Tin Oxide (ITO) in front of a layer of silver. The thin film approach in the '462 patent, however, assumes that the silver and ITO layers are smooth, precluding any roughening of the bottom of the LED proper, known as the 'epitaxial layer' because it is made atop a substrate, by an atomic beam in a vacuum. Because of extensive light trapping within a cube of high-index material, a standard LED geometry, achieving maximum extraction efficiency makes it imperative to have a roughened surface at the interface where the reflector is in contact with the epitaxial layer. This is needed to achieve high diffuse reflectance, which causes trapped light to be randomly redirected for another chance at escape. Further, ITO has a much lower electrical conductance than silver, which may be a disadvantage for some designs.

Getting trapped light scattered out before it is absorbed makes it desirable to have either a bottom diffuse reflector or a top scattering layer incorporated with layer 11u of FIG. 1A. A combination where both approaches are employed can also be utilized. However, one can introduce too much scattering in the device when both a top and bottom scattering layer are used and thus reduce the device extraction efficiency. It can be shown that without top scattering introduced into layer 11u, that a perfect reflector such as described in U.S. Pat. No. 6,784,462 will not perform as well as the diffuse silver reflector described herein. Further, in many instances it is desirable to have a smooth interface at the top of layer 11u and one cannot introduce a scattering or diffusing layer on its interface or below its top emitting surface. In these instances the rear diffuse reflector proves most beneficial and has been stated herein, will outperform even a 100% perfect specular reflector.

Furthermore, silver will lose its reflectivity if not properly protected from contact with air or corrosive materials (it is highly reactive with sulfur), so it must be sealed by suitable protective layer. Typically, if the silver is sandwiched between the epitaxial layer and a suitable substrate such as Germanium, then no noticeable degradation of this material takes place as it is hermetically sealed. If edge protection is required there are many suitable materials known to those skilled in this field of semi-conductor design.

Regarding the matter of a roughened back-reflector made of silver, computer simulations thereof, using well-known Monte-Carlo ray-tracing techniques, show that the optical transformer described herein will greatly benefit from having this feature in the LEDs that illuminate its embodiments, particularly those disclosed below that recycle the emission of a phosphor.

This roughened-silver reflector can of course greatly benefit thin-film LEDs whether or not used in conjunction with the optical transformer described herein. Referring again to FIG. 1B, another such LED optical improvement is the reduction of the absorptance of lower epitaxy-layer 11b, where the majority of luminosity losses occur within epitaxy layer 11. As an epitaxy, this layer is typically deposited on a sapphire crystal. In the production of thin-film LEDs the epitaxy wafer is removed from the sapphire. (A summary of the processes needed to remove the InGaN wafer from the sapphire substrate was described by Dr. K. Streubel of OSRAM-Opto at the Intertech LEDs conference in San Diego, Calif., USA in October 2004.)

The absorption of the lower layer is not essential to its function, and seems to be confined to the superficial atomic crystal-planes, several tens of nanometers out of the layer's total thickness of 5,000 nm. According to the research of S. Schad and B. Neubert of the University of Ulm in Germany, the first thin layer of an InGaN-type LED grown on a sapphire substrate, approximately 65 nm, is responsible for most of the absorptance of the InGaN LED in the blue wavelength. They theorize that the remaining semi-conductor material grown on the substrate is highly transparent. These planes were so near the sapphire that their crystal structure and absorptance greatly increased. In some embodiments, neither layer 11a nor 11u has this thin absorptive layer. Precise removal of this strained sub-layer is possible with magnetorheological polishing, greatly reducing the absorptance and thereby enhancing the LED's external quantum efficiency.

A separate possibility for enhancing that efficiency is to cause the front layer 11u of FIG. 1B to have bulk-scattering characteristics, rather than the complete transparency typical of such a layer. A study using a ray-tracing model showed that the introduction of a scattering coefficient of 100/mm into layer 11u gives an approximately 40% increase in efficiency for a SMD-type LED, where layer 11u does not have any appreciable scattering and does not have a phosphor layer in contact with it. Similar improvements are seen for a dome type monochrome LED. If the scattering coefficient is increased to 200/mm, a very slight improvement is seen. Whereas beyond this level there is reached a point where the performance degrades from the maximum. The use of a means of scattering in the front layer typically does not have a beneficial effect on performance when it is used in conjunction with the roughened back-reflector approach already discussed. There is a very slight improvement to the extraction efficiency if a roughened-back reflector is used in combination with layer 11u having a 10/mm scattering coefficient. Beyond this level of front scattering the performance falls below either single approach.

The optical manifolds disclosed herein that recapture back-scattered light can be enhanced significantly when the extraction efficiency of the LED is high. Particularly, it is believed that the remote phosphor embodiments described herein will outperform the prior art in terms of external quantum efficiency, particularly conformal-phosphor LEDs. The performance of the novel optical systems disclosed herein can be improved dramatically when they are used in conjunction with top-emitting or substantially top-emitting LEDs, particularly those which employ a highly reflective back layer with modest scattering.

Figure 2A:
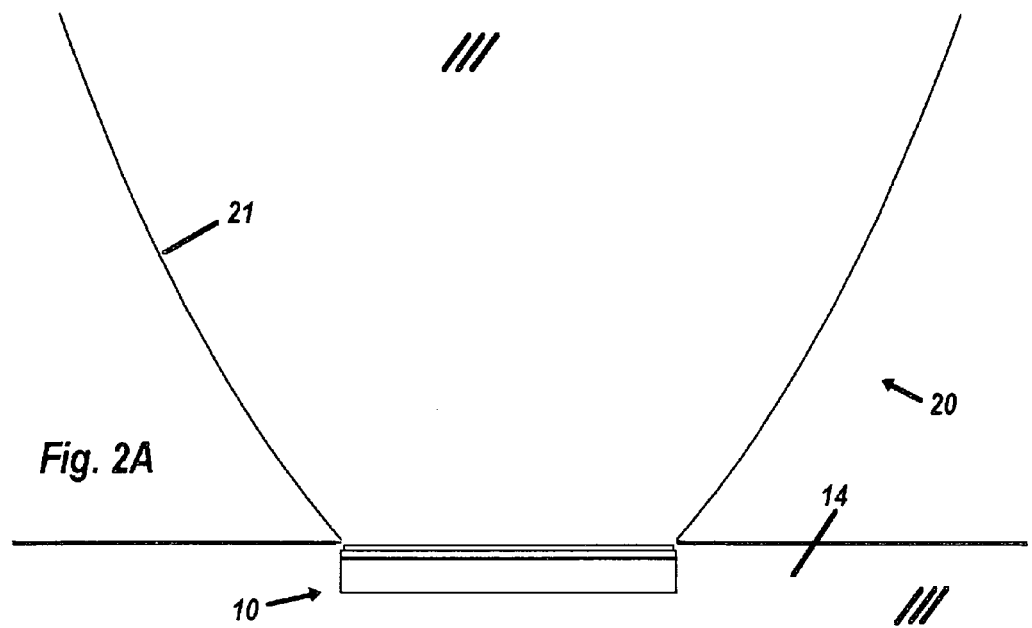
FIG. 2A is a cross-sectional view of a thin-film LED immersed in optical contact with a 10° dielectric-filled CPC.

FIG. 2A is a cross-section of the bottom of an dielectric-filled CPC. As in FIG. 1A, the thin-film LED 10 is immersed in transparent dielectric 14. Optically continuous with transparent dielectric 14 is dielectric-filled CPC 20, formed by a CPC surface 21, which operates solely by total internal reflection, and thus not needing a reflective coating. In actual practice, the CPC 20 would be separately manufactured and optically bonded to transparent dielectric 14, just above thin-film LED 10.

Figure 2B:
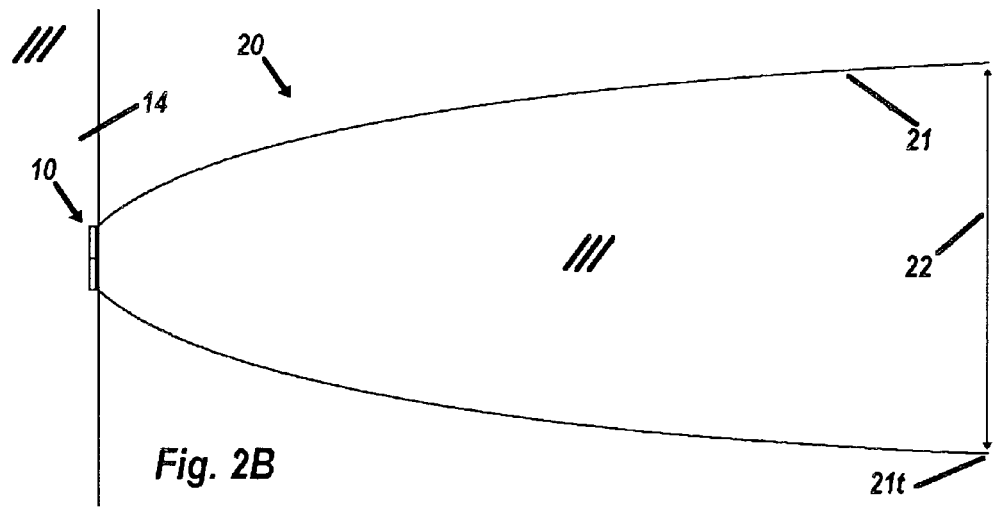
FIG. 2B is a cross-section of the bottom section of the dielectric-filled CPC of FIG. 2A, showing the entire 10° dielectric CPC.

FIG. 2B is a cross-section of the bottom of the dielectric-filled CPC of FIG. 2A, showing the entirety of the CPC 20, with parabolic profile 21 shaped for a 10° output angle, the widest possible for a CPC using only total internal reflection. Top edge 21t of profile 21 is the outer edge of virtual source 22. The dielectric medium within CPC 20 continues rightward into alternative embodiments (not shown in FIG. 2) as exemplified by CPC 54 connection with larger CPC 53 in FIG. 5.

Figure 2C:
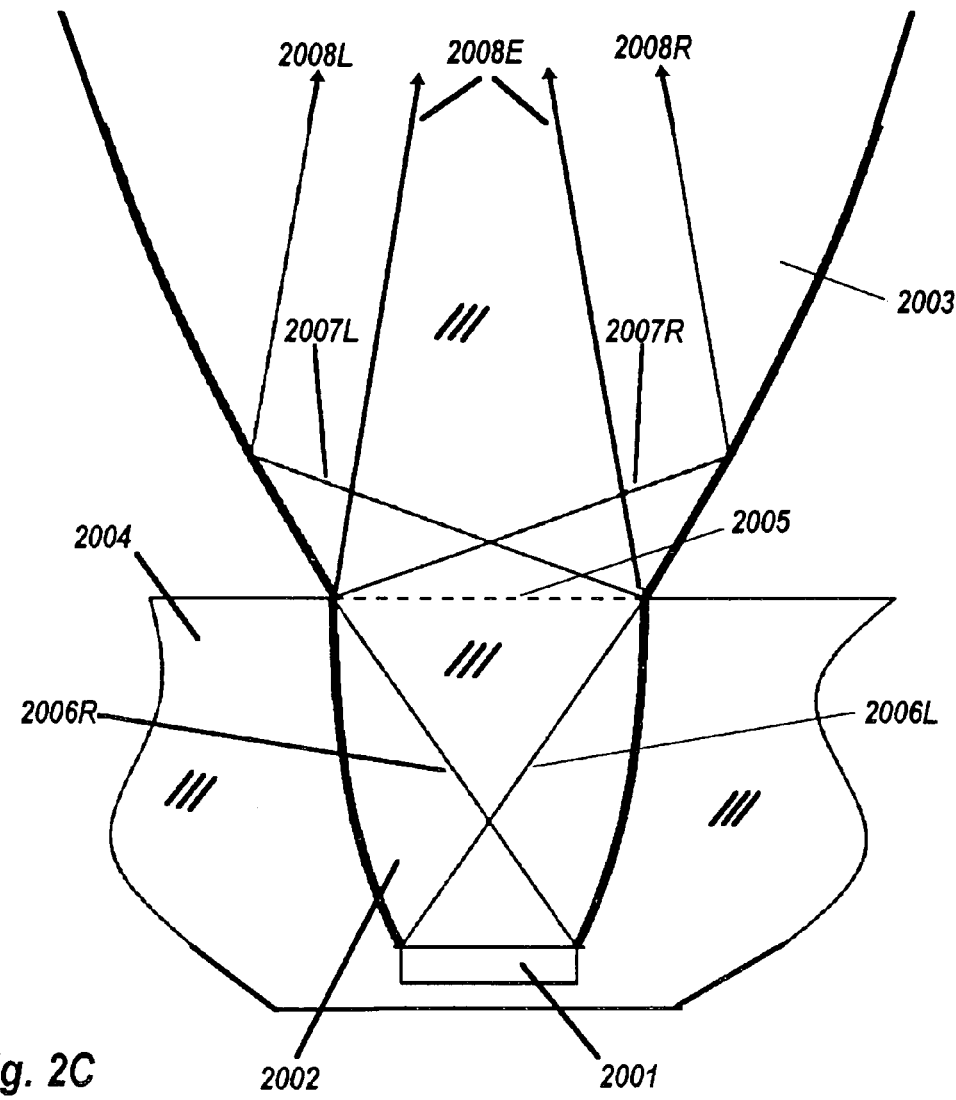
FIG. 2C is a cross-section of an optical manifold that incorporates the cross-section shown in FIGS. 2A and 2B, including a high-index CPC for high-efficiency light extraction and a low-index CPC for collimation.

In some embodiments, the CPC 20 could have a refractive index higher than that of the epoxy material comprising transparent dielectric 14 of FIG. 1B. Jewelry-grade cubic zirconia, for example, has a refractive index of 2.2, similar to diamond. Even if currently it may be more expensive than polymer plastic optics, such a high-index transparent material may in the future be economically available. It would be advantageous for forming a CPC that is optically bonded to a thin-film LED to form an embodiment of the optical transformer described herein. While the high index (~2.5) of titanium-dioxide films matches that of the LED material, the film's high absorptance makes it unsuitable in forming a CPC. Sol-gel materials from the Naval Research Laboratory, Infrared Materials Group, Washington D.C., are being developed for casting or in boule form, with refractive index available at unprecedented high values of 2.4-3, sufficient to index-match with the LED material. Further, these high index materials can be designed and manufactured to have an extremely low absorptance coefficient in the visible wavelengths, similar to a material such as the highest optical grade PMMA. This would eliminate the light trapping and high Fresnel reflectance that bedevil current LEDs. FIG. 2C is a cross-sectional view of an alternative optical manifold that utilizes a variation of this approach, replacing the CPC 20 with two CPCs. A first CPC 2002 is in contact with an LED 2001, and is made of a sol-gel material matched to the index of the semi-conductor and second, upper CPC 2003 is made of a lower refractive index material, such as PMMA. The first CPC 2002 is designed to partially collimate and fully flash the second CPC 2003, which performs further collimation. This arrangement shown in FIG. 2C greatly increases overall extraction of flux from the die. Because of this, the LED 2001 would have a specular reflecting layer on its bottom side, unlike the diffusely reflecting mirror in FIG. 1B. Surrounding silicone material 2004, with a low refractive index of 1.4, is the initial mold for the casting of CPC 2002, thereafter providing structural support for small CPC 2002, alleviating stress upon its bond with the top surface LED 2001. CPC 2001 is designed for this index ratio of 2.5:1.4, operating entirely by total internal reflection. Its exit face is planar interface 2005 with larger CPC 2003. Edge rays 2006R and 2006L are shown being reflected by the top edge of CPC 2001 and then refracted by interface 2005 into 70° edge rays 2007R and 2007L. They are internally reflected by CPC 2003 into final collimated rays 2008R and 2008L, respectively. Adjacent to them are edge rays 2008E, originating from rays 2006R and 2006L being directly refracted through interface 2005 and then totally internally reflecting off the wall of CPC 2003.

Figure 2D:
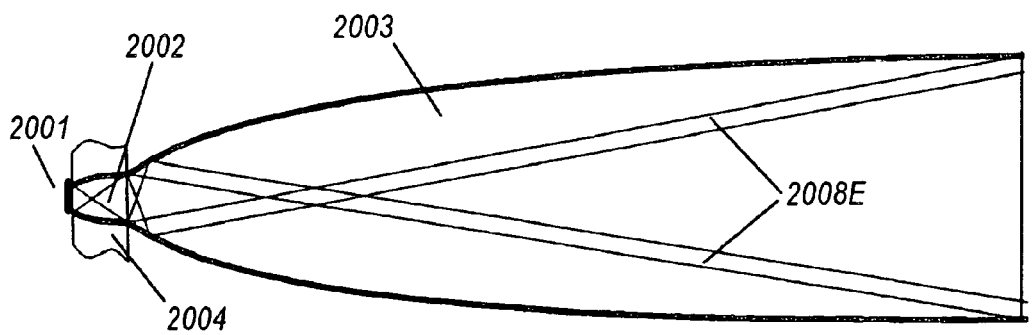
FIG. 2D is a cross-sectional view that shows the entire CPC 2003 shown partially in FIG. 2C.

FIG. 2D is a cross-sectional view that shows the entire CPC 2003 shown partially in FIG. 2C, including the ultimate position of edge rays 2008E.

An alternative embodiment of the device of FIGS. 2C and 2D is to include a thin high matching index layer at the interface between LED 2001 and CPC 2002. In this instance the matching index phosphor layer is deposited onto the LED via a method such as electrophilatic deposition. One method is one which provides high contact area between the phosphor and the top surface of the LED. The index of refraction of LED, 2001, the small CPC 2002, and the phosphor should be closely matched, preferably within minus 0.1. So for an InGaN LED, which has an index of refraction on the top inactive surface of 2.5, the phosphor and the material of the small CPC should have an index of refraction between 2.4 and 2.5. Embodiments based on this device do not use or need the short-pass filter to trap back-scattered light from the LED such as is the case for the short pass filter 105 shown in the embodiment of FIG. 10B.

Figure 3A:
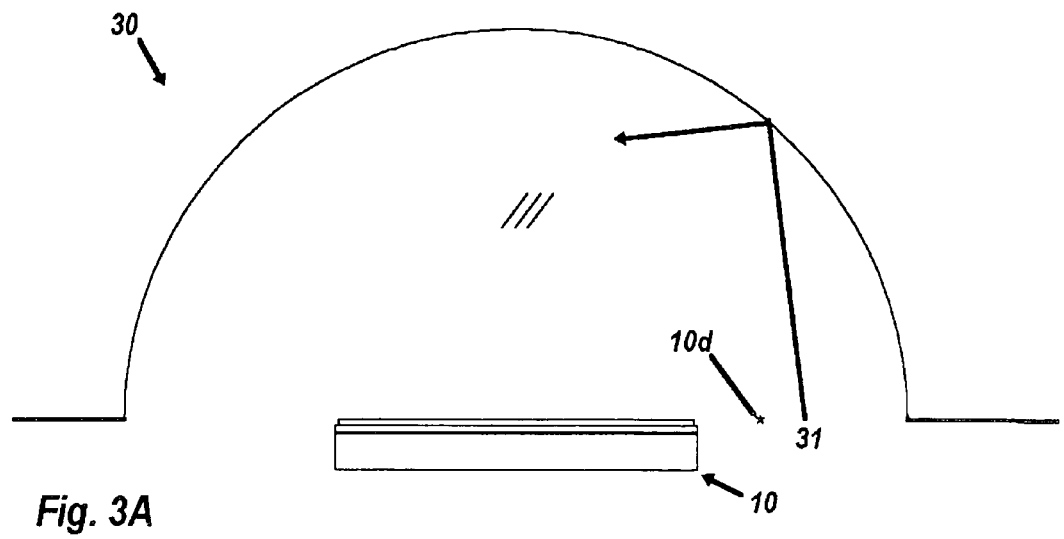
FIG. 3A is a cross-section of a thin-film LED immersed in a small hemisphere.

FIG. 3A is a cross-sectional view of a thin LED 10 embedded in dome 30, a typical configuration in commercial packages. Dome 30 is shown with the smallest possible size, for the refractive index of epoxy (n=1.54), consistent with all rays emitted from LED 10 escaping total internal reflection. Point 10d marks the radius of the corner of LED 10. Beyond it some rays will not exit the dome. A hypothetical exemplary ray 31 is internally reflected because its origin is too close to the surface of hemisphere 30.

Figure 3B:
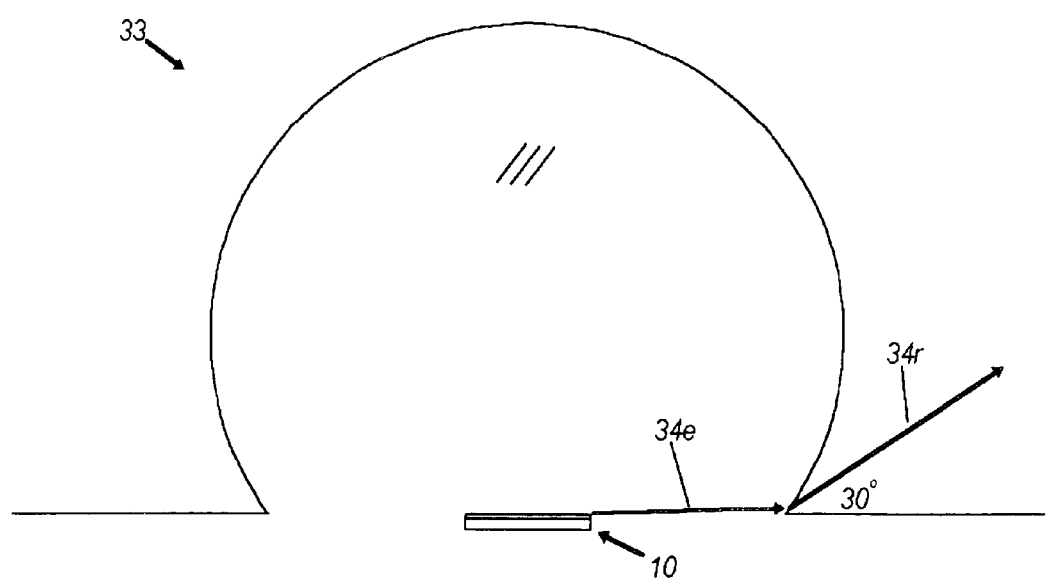
FIG. 3B is a cross-section of a thin-film LED immersed in the smallest possible ball lens.

FIG. 3B is a cross-sectional view of an LED 10 immersed in a ball lens 33. Near-horizontal edge ray 34e is refracted to external ray 34r, representing a 30° deflection. This angular reduction is useful for fast optical systems to gather into a beam. In practice, ball 33 would be glued to transparent substrate 14. Due to its aberrations, such a lens will increase etendue somewhat. It is larger than the hemisphere of FIG. 3A, but its size is similarly determined, as that which just allows all rays emitted by the corner of LED 10 to escape unreflected.

Figure 3C:
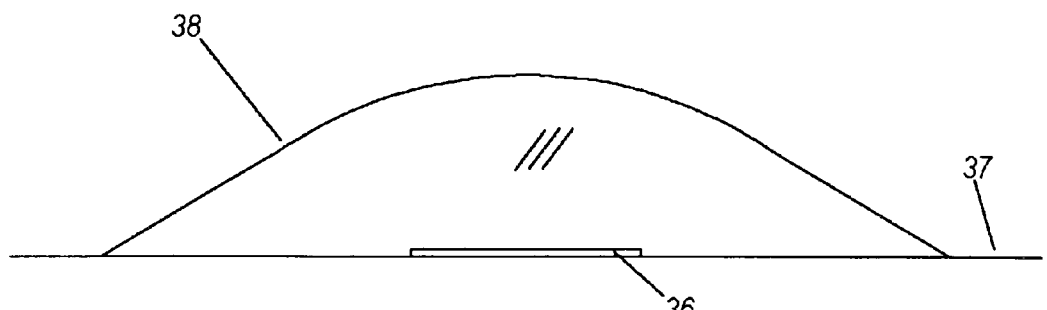
FIG. 3C is a cross-section of a thin-film LED immersed in a glob configuration typical of chip-on-board LEDs.

FIG. 3C is a cross-sectional view of a thin LED 36 on the circuit board 37, immersed in an epoxy glob 38, its untailored shape solely a result of the characteristics of epoxies highly convenient for mass production. It disadvantageously traps some light. This shape, however, is highly consistent in mass production, so that other elements of the optical transformer described herein could be shaped to bond with it.

Figure 4A:
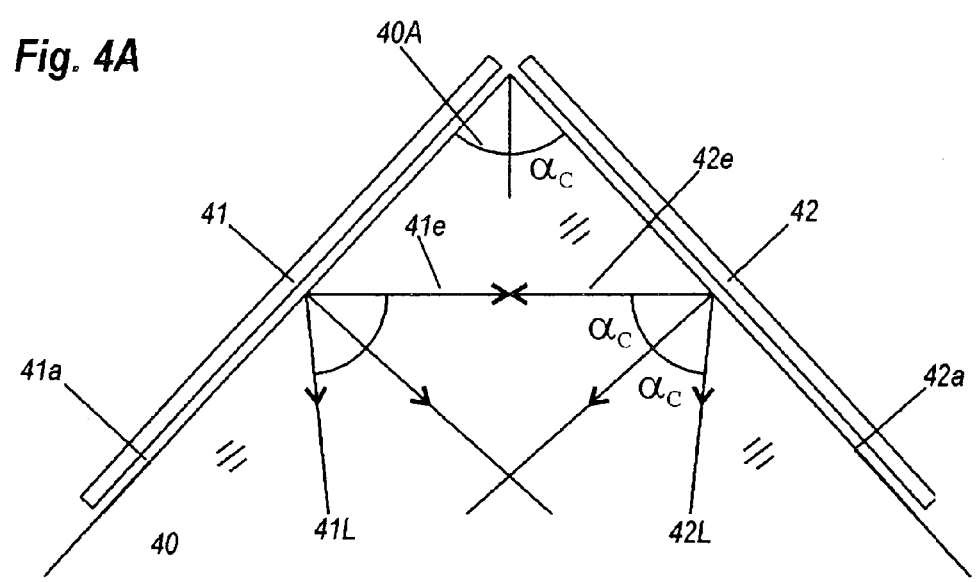
FIG. 4A is a cross-sectional view of two thin-film LEDs and a prism coupler.

FIG. 4A is a cross-sectional view of a a prism coupler 40 that has an interior angle adapted to the critical angle $\alpha_C$ of the prism material. Thin LED 41 sends Lambertian emission across airgap 41a, wherein it is confined between upper edge ray 41e and lower edge ray 41L. Thin LED 42 emits across airgap 42a and enters prism 40, wherein its Lambertian emission becomes confined to half-angle $\alpha_C$, between upper edge ray 42e and lower edge ray 42L. The purpose of interior angle 40A being $2\alpha_C$ becomes apparent when ray 41e is seen to internally reflect off air gap 42, to join ray 42L. Thus the internally reflected light fills the angle space outside the edge rays of the incoming light.

Figure 4B:
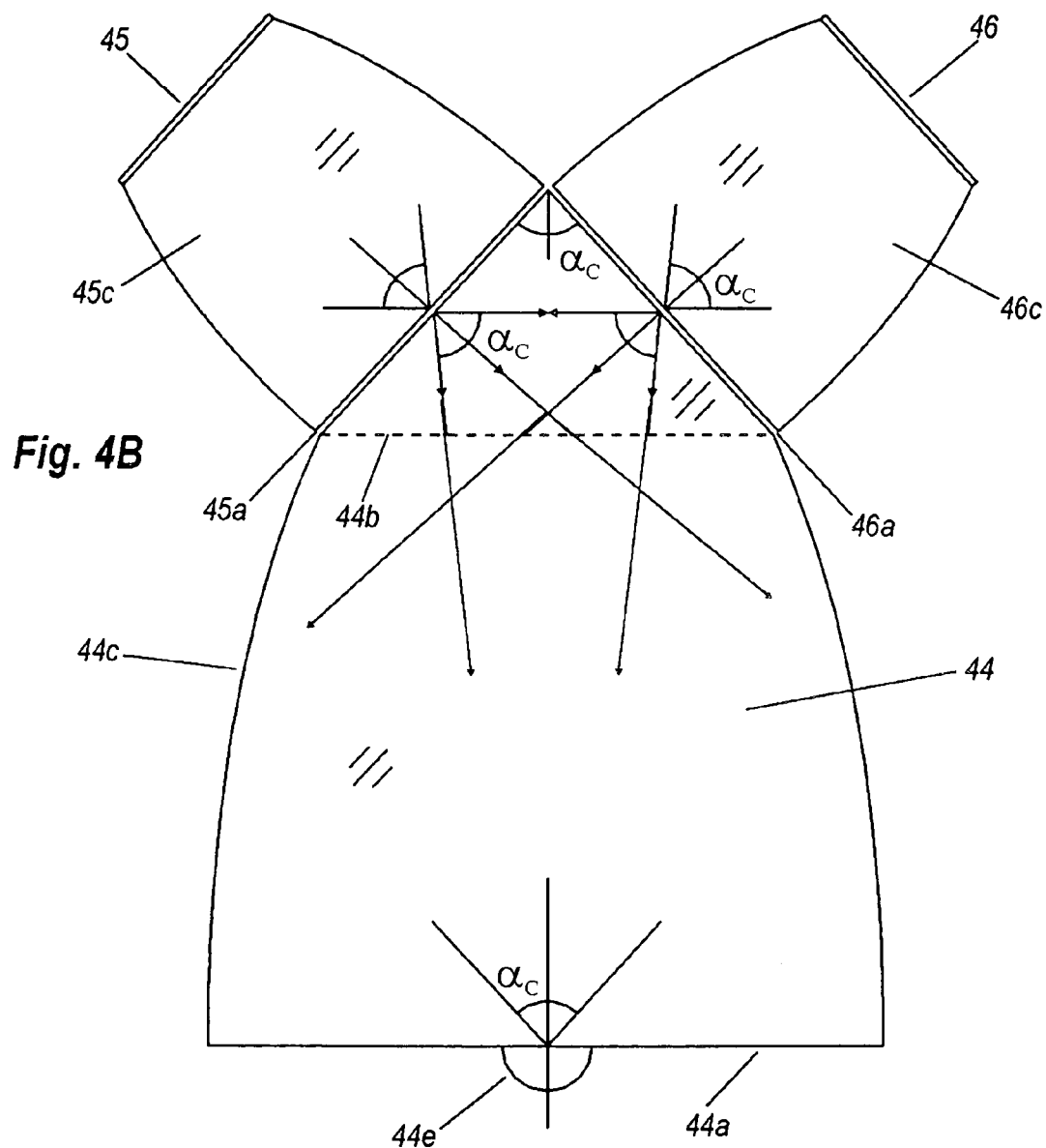
FIG. 4B is a cross-sectional view of an optical manifold 44 that utilizes the prism coupler shown in FIG. 4A, including two thin-film LEDs immersed in smaller CPCs, each with a prism coupler, and a large CPC.

FIG. 4B is a cross-sectional view of an optical manifold 44 that utilizes the prism coupler shown in FIG. 4A. The optical manifold 44 comprises a dielectric CPC 44c and a conjoined prism block 44b. The thin LED 45 is immersed in a dielectric CPC 45c, which is wider at airgap 45a, across which it shines Lambertian light into manifold 44, wherein refraction confines it to critical angle $\alpha_C$. A similar approach is used with LED 46, CPC 46c, and airgap 46a. The prism coupler then receives two inputs of radiation spanning an angle $2\alpha_C$, through 45a and 46a, and transforms them into a fully Lambertian pattern at 44b (about ±90° full angle). A CPC 44c expands from its width at block 44b to its exit face 44a. This enables all the light to exit as Lambertian emission 44e, forming a "virtual chip". An exit surface at 44b would trap light beyond critical angle $\alpha_C$, hence the use of CPC 44c.

FIG. 5 is a cross-section of a reflective optical manifold for two LEDs, 51 and 52, as inputs, respectively having small CPCs 54 and 55 that feed into a single, larger rectangular CPC, 53, for the output. This is a simple way of combining the output of two light-emitting diodes. Reflective optical manifold 50 receives the light output of first LED chip 51 and second LED chip 52. The manifold 50 comprises an upper compound parabolic concentrator (upper CPC) 53 and lower compound parabolic concentrators (lower CPC) 54 and 55, which receive the light of chips 51 and 52, respectively. Dividing line 50d delineates the input plane of CPC 53 as well as the output planes of CPCs 54 and 55. Output opening 56 emits the combined output of the two LEDs into about ±90°.

The operation of CPC 54 is shown by edge ray 57, which is the reflection by surface normal 58 of nearly horizontal rays from chip 51. After reflection at line 50d, the edge ray 57 proceeds to the edge of output opening 58, represented by a dotted exit-line, whereupon it is reflected back to horizontal, unfortunately somewhat obscuring said dotted line.

Further embodiments of the optical transformer described herein are possible by using the clustering principle of FIG. 5, which is built on the reflector of FIG. 1A. A series of drawings in FIGS. 6A to 6I depict further embodiments of clustering.

Figure 6A:
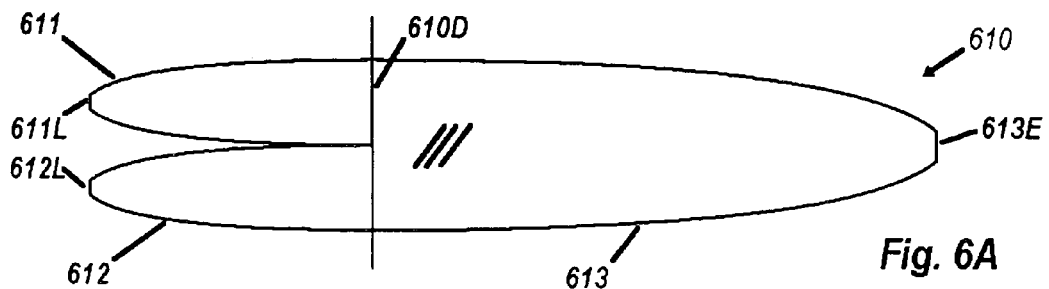
FIG. 6A is a cross-section of a 2:1 dielectric optical coupler.

FIG. 6A is a cross-section of optical manifold 610, based on dielectric CPCs such as that in FIG. 2. Manifold 610 comprises input CPCs 611 and 612 and output CPC 613. LEDs are mounted at entry ports 611L and 612L, and their combined output is formed at exit port 613E. Dividing line 610D is the boundary between input and output CPCs. The reversibility of light shows that there could be a large LED shining into port 613E, causing light to be emitted at ports 611L and 612L.

Figure 6B:
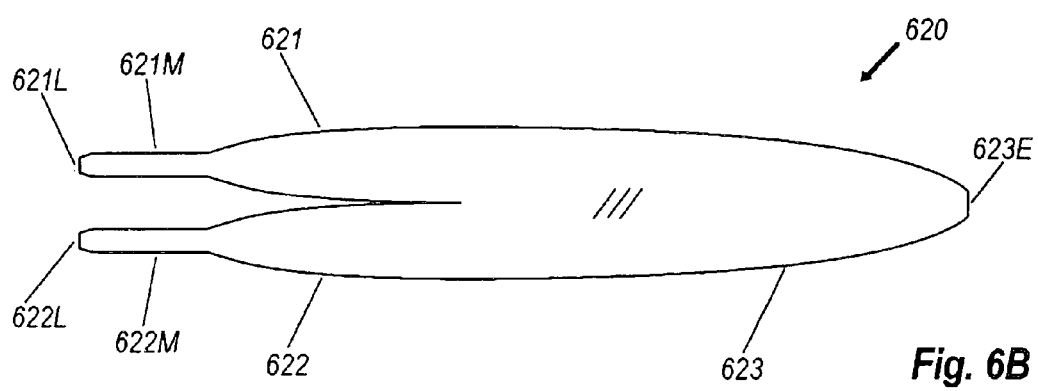
FIG. 6B is a cross-section of a dielectric coupler similar to FIG. 6A, also including mixing rods.

FIG. 6B is a cross-section of optical manifold 620, comprising input dielectric CPCs 621 and 622 and larger output CPC 623. Input CPC 621 also comprises mixing rod 621M, just inward from source 621L, having the minimum width possible for guided light. This helps erase non-uniformities in source 621L, to ensure uniform luminance for exit port 623E.

Figure 6C:
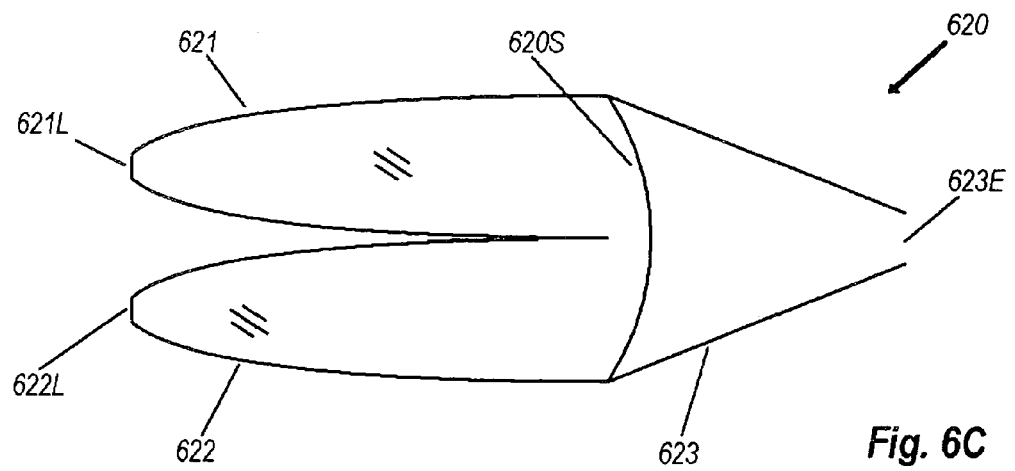
FIG. 6C is a cross-section of a hybrid optical manifold with CPC inputs and a cone with angularly restricted output in air.

FIG. 6C is a cross-section of one embodiment of the optical manifold 620, comprising dielectric-CPC input manifolds 621 and 622, and tailored mirror 623, acting in conjunction with a lens surface 620S to produce etendue-limited output in air at exit 623E.

Figure 6D:
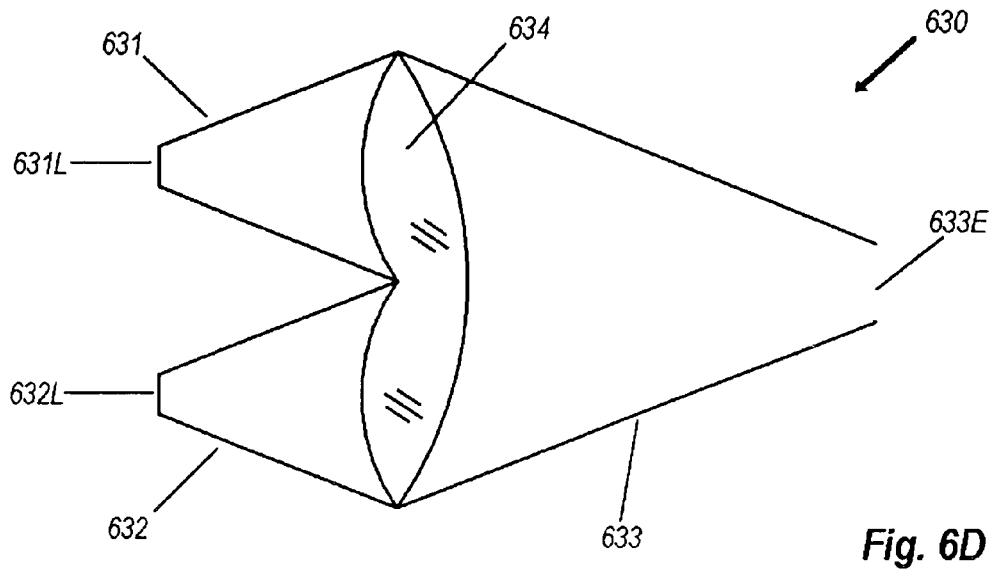
FIG. 6D is a cross-section of an optical manifold comprising cones or tailored mirrors and a multiplex lens.

FIG. 6D is a cross-section of another embodiment of the optical manifold 630, comprising reflective input cones 631 and 632, an output cone 633, and a lens 634. The light from LEDs 631L and 632L are combined at output port 633E.

Figure 6E:
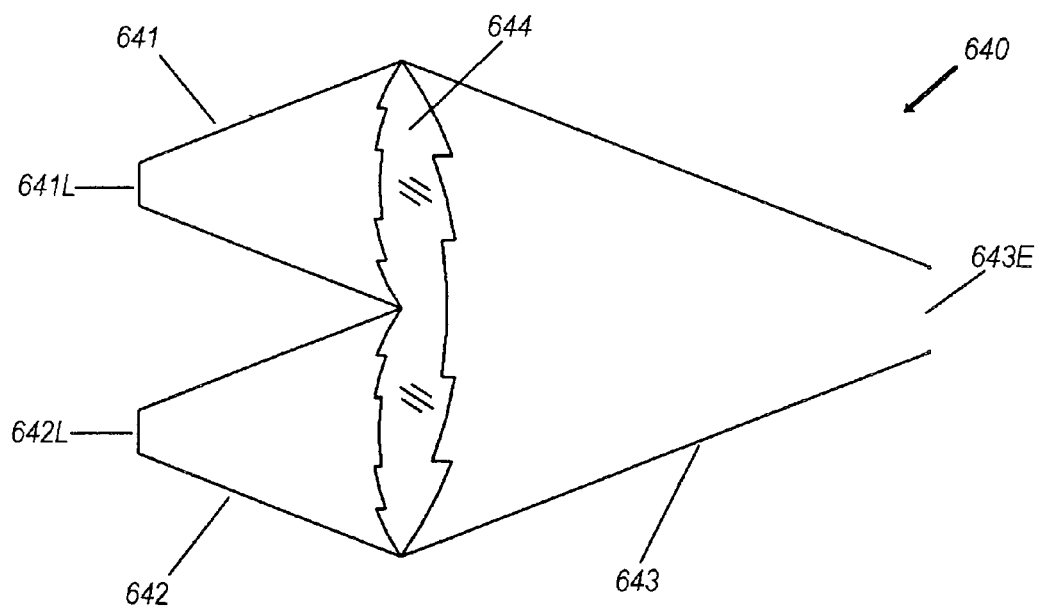
FIG. 6E is a cross-section of a configuration similar to FIG. 6E, but utilizing a multiplex Fresnel lens.

FIG. 6E is a cross-section of still another embodiment of the optical manifold 640, comprising reflective input mirrors 641 and 642, an output mirror 643, and a Fresnel lens 644. The light from LEDs 641L and 642L are combined at an output port 643E. The thickness of the Fresnel lens 644 is exaggerated for clarity and in actual practice could be even thinner.

Figure 6F:
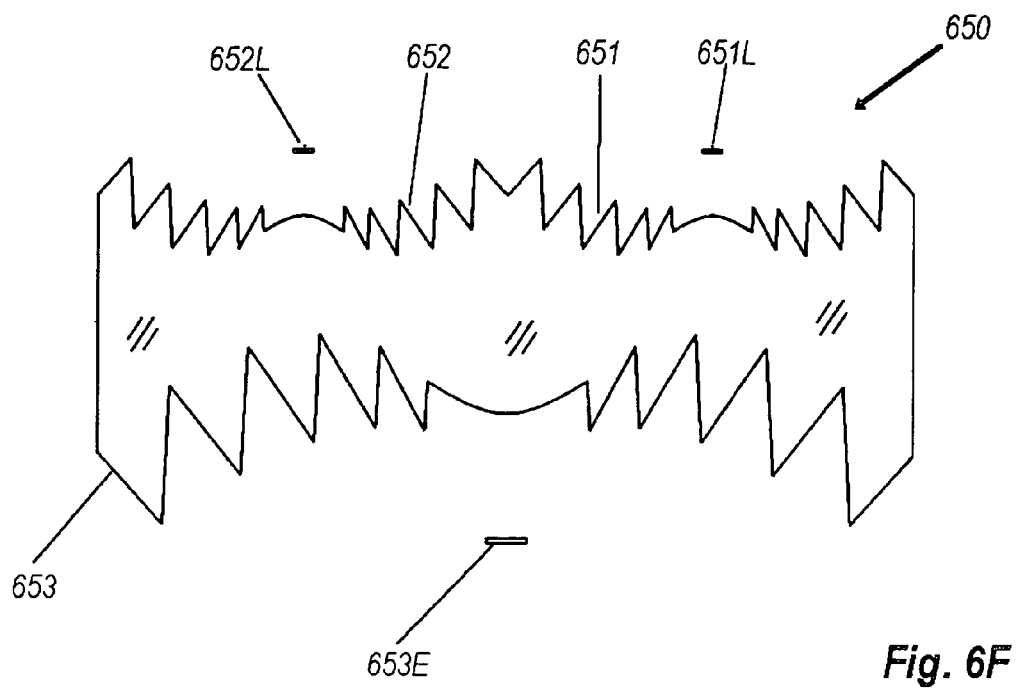
FIG. 6F is a cross-section of an optical coupler comprising a multiplex TIR lens.

FIG. 6F is a cross-section of still another embodiment of the optical manifold 650 comprising input TIR lenses 651 and 652 and an output TIR lens 653. Input LEDs 651L and 652L have their outputs combined at focal zone 653E. The cross-sections of FIG. 6A-6E can be realized in either rectangular or circular symmetry. TIR lenses, however, are inherently circularly symmetric, requiring some trimming for them to tessellate into arrays.

Figure 6G:
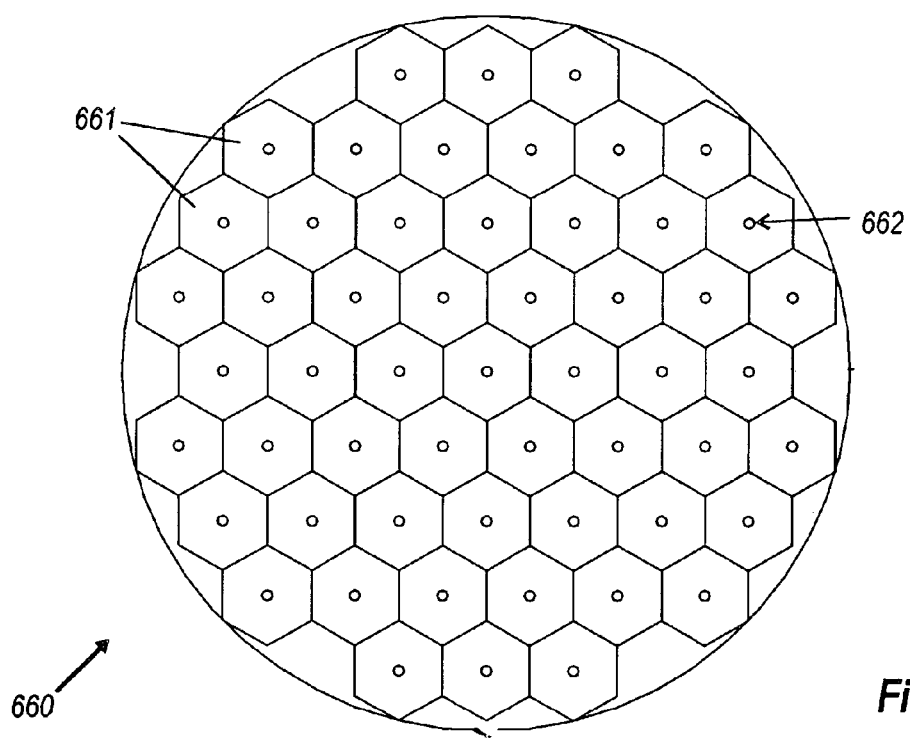
FIG. 6G is a face-on view of a hexagonally tiled optical manifold utilizing a plurality (e.g., 55) of circularly symmetric lenses, which can be implemented with any of the lenses shown in FIGS. 6A-6F, for example.

FIG. 6G is a plan view of a multiplex lens 660, comprising 55 hexagonally trimmed circularly symmetric input means, as exemplified by FIGS. 6A-6F. Each lens 661 focuses on an LED 662.

Figure 6H:
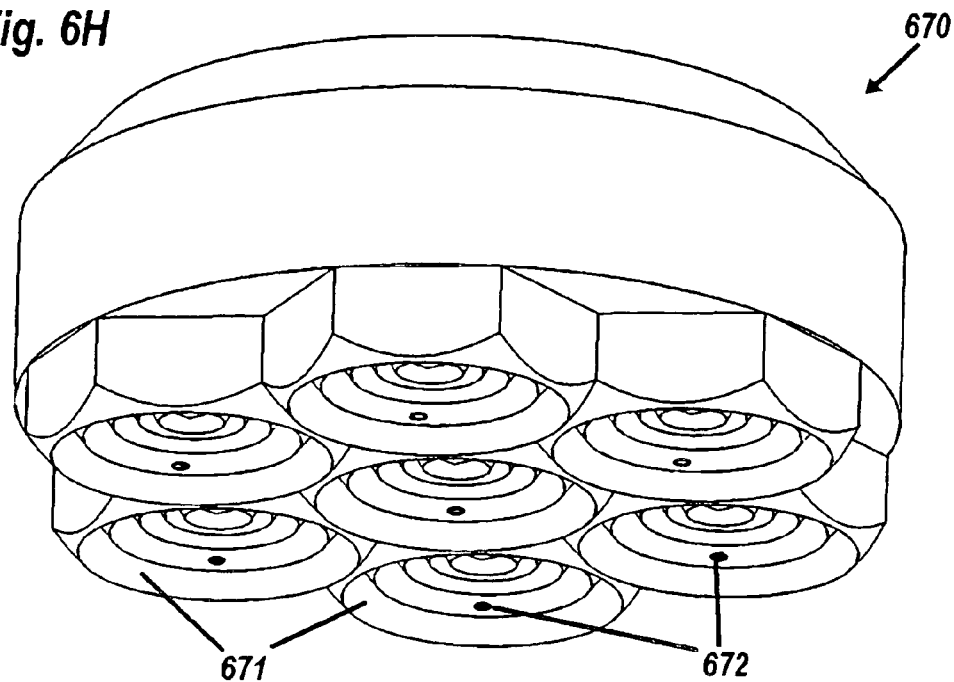
FIG. 6H is a perspective view of the input side of a multiplex TIR lens.

FIG. 6H is a perspective view from the input side of optical manifold 670, comprising 7 circular TIR lenses 671, each centered on LED 672 and receiving its light.

Figure 6I:
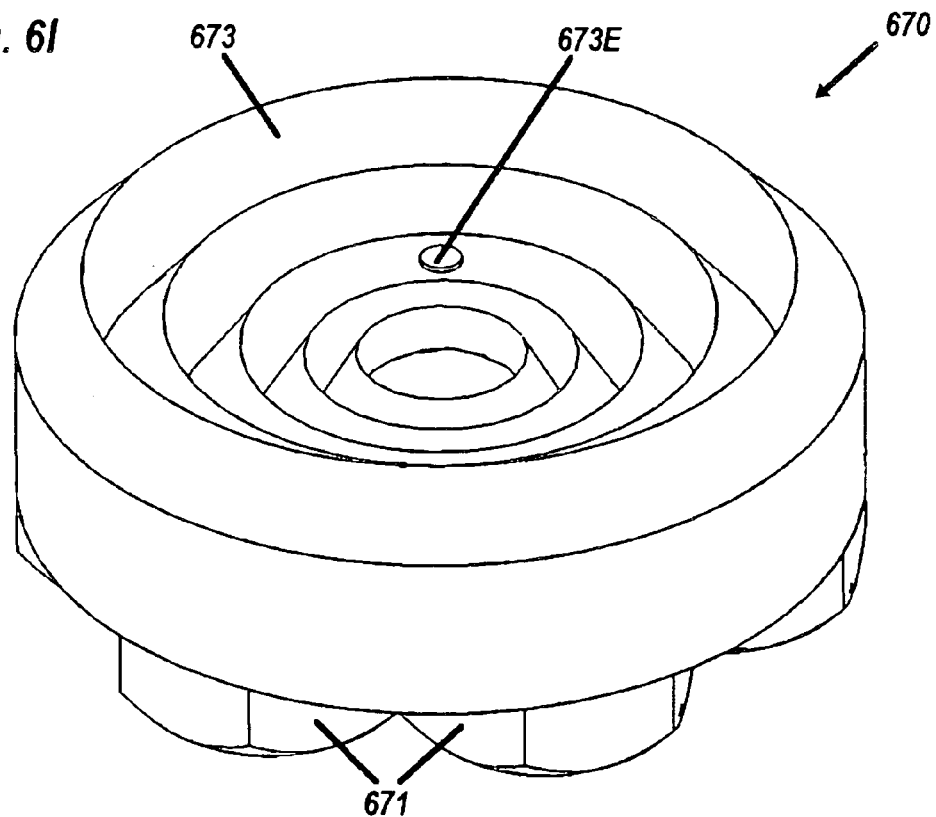
FIG. 6I is a perspective view of the output side of the multiplex TIR lens of FIG. 6H.

FIG. 6I is a perspective view of the optical manifold 670 of FIG. 6H from the other side, showing output TIR lens 673 and exit zone 673E.

Many other combinations of the aforementioned components can be formulated once the principles of this invention are understood. For example, the large output dielectric CPC 610 in FIG. 6A can be replaced by the large trimmed TIR lens 653 of FIG. 6F. In this instance the output image is formed in air. This later configuration has an advantage in that the overall optical system is shorter in length and in some instances the TIR Lens may be easier and less expensive to mold than a long CPC or cross-CPC.

In all the above configurations the parts can either be molded as separate pieces and bonded together or be molded as one piece.

So far the embodiments shown have utilized thin LEDs as input sources, and many depend upon getting close to the emitting chip. In embodiments such as depicted in FIG. 3A, the dome could only be used as input by the TIR lens of FIG. 6H. It is necessary to extract the luminance from the dome and image it in air, where of course it will appear to be n times bigger in dimension, in the case of chip immersion in refractive index n.

FIG. 7A is a side view of an etendue-limited flux-transfer from a domed LED into an image in air. FIG. 7A shows a high-power LED package 700, comprising a base 701, an emitting chip 702, and a transparent dome 703. A solid-dielectric dual lens 710 comprises a lower lens 711 and an identical upper lens 712, oppositely oriented and joined along line 710D, both lenses being circularly symmetric about axis 710A. The lower lens 711 comprises a central hyperbolic lens 711h and a surrounding generalized-Cartesian-oval reflector 711t, which collimates light coming through central cylinder 711c. Hyperbolic lens 711h acts as an inlet, being focused on the center of LED chip 702. Upper lens 712 comprises central hyperbolic lens 712h and surrounding totally internally reflecting surface 712t. Light converges with ±90° on chip image 710E, from which another optical manifold could receive input light. Exemplary chief ray 715 has polar angle β from chip 702 and equal polar angle β' at image 710E. When such a lens is precisely made and positioned, the etendue of image 710E does not increase much over that of the source, and source-luminance inhomogeneities are washed out, in that points on the image receive light from many points on the source. This non-imaging action is done by the mirror-inversion action of profiles 711t and 712t, which act like Dove prisms to rotationally smear the light that they totally internally reflect.

FIG. 7B is a side view of an alternative etendue-limited flux-transfer from a domed LED into an image in air. FIG. 7B shows a cross-section of a 2-facet dual TIR lens 720, mounted on an LED package 700. A lower TIR lens 721 surrounds the dome 703 and collimates the light of chip 702, sending it across dividing plane 720d into the upper TIR lens 722, which in turn focuses it onto exit image 720E. The lens 720 is circularly symmetric about axis 720A of the LED package 700. An exemplary chief ray 725 subtends equal angles β and β' with axis 720A. The optical accuracy of the manufacturing of this preferred embodiment must be high for image 720E to have little more etendue than chip 702. There will be an increase in area of image 720E from that of chip 202, which is proportional to the square of the index of refraction of the material of dome 703 in which LED 702 is embedded.

FIG. 7C is a side view of SMS-designed RIIR lens 730, rotationally symmetric about a central axis 730a, with an equatorial plane 730d dividing it into a lower lens 731 and an upper lens 732. The central lens 731c collects upward going light from LED chip 702 and collimates it into the central lens 732c, which in turn focuses it onto exit image 730e. Surrounding the central lens 731c is a bell-shaped surface 731e, shaped to distribute light from the chip 702 over the totally internally reflecting surface 732r, which collimates it onto the lower totally internally reflecting surface 731r, thereupon converging upon bell-shaped surface 732e, which focuses it upon exit image 730e. Exemplary chief ray 725 exits the center of chip 702 at polar angle β to be refracted [R] at the entry surface 731e, internally reflected [I] at upper surface 732r, internally reflected [I] at lower surface 731r, and finally refracted [R] through the exit surface 732e, hence lens 730 is an RIIR lens. The continuity of the surfaces of lens 730 means that square LED chip 702 will have a square image at 730E, with very little etendue increase. This is because all RIIR light paths, such as 725 and 726, have equivalent optical path lengths, assuring accurate definition of the boundary of image 730e, even though it is in air and thus n times bigger dimensionally than chip 702 (using the refractive index surrounding the chip.) Because lens 730 is non-imaging, luminance inhomogeneities of chip 702 are smeared out. This lens is also more compact than those of FIGS. 7A and 7B, and thus the embodiment shown in FIG. 7C may be more preferable for some purposes than those of FIGS. 7A and 7B.

Additional embodiments are shown in FIGS. 7D and 7E, but with a feature to be discussed below with reference to FIG. 11, namely a blue-pass dichroic filter for recycling phosphor emission, located congruent with equatorial planes 710D, 720d, and 730d, respectively in FIGS. 7A, 7B, and 7C. FIG. 7D is a cross-sectional view through dual-lens system 740. The LED package 700 comprises the base 701, the blue-emitting chip 702 (also shown in plan view at right), and the gel-filled dome 703. Optically coupled to dome 703 is a lens 741 of refractive index about 1.5. Optically coupled to it in turn is a silicone lens 742, of a refractive index 1.34. In the equatorial plane of lens-system 740 is a blue-pass dichroic filter 743, the recycling purpose of which is discussed below in FIG. 11. Atop it is a silicone lens 744, with form substantially identical to that of lower silicone lens 742. An uppermost lens 745 is identical in form to lower lens 741, except for the addition of dome 745d, within which is immersed a remote phosphor 746 (also shown in plane view at right). Silicone lenses 742 and 744 can be seen acting in concert to direct ray 747 by total internal reflection within lenses 741 and 745, respectively. Ray 748 is emitted at angle β from centerline 749, and strikes phosphor 746 at equal angle β'.

FIG. 7E is a side view through a dual-lens system 750, similar in function to that of FIG. 7D, with a similar LED. The gel-filled dome 703 is optically bonded to lower lens 751, comprising internally reflecting an outer profile 751t, an inner collimating lens 751c, and an optically inactive cylindrical wall 751w. Blue-pass dichroic filter 753 is in the equatorial plane of system 750. An inverted upper lens 755 is identical in form to lower lens 751, but with the addition of dome 755d, in which phosphor 756 is immersed. Phosphor 756 is also shown to the right in plan view, as is the blue-emitting chip 702. The ray 758 is emitted at angle β with respect to a central symmetry axis 759, and strikes phosphor 756 with equal incidence angle β'.

Figure 7F:
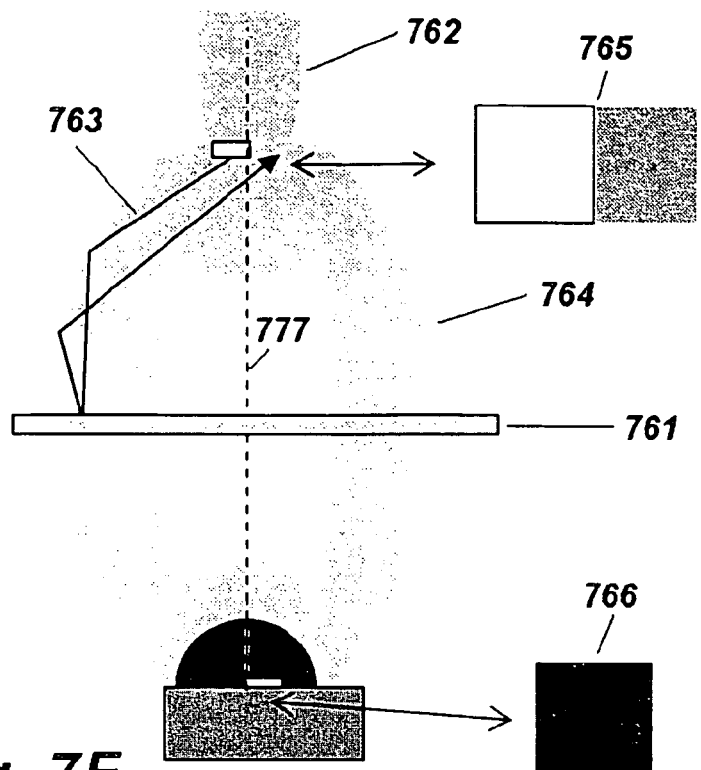
FIG. 7F is a side view of another dual collimating lens with dichroic filter, including an off-axis LED and an off-axis phosphor system.

FIG. 7F is a side view through a dual-lens system 760, which is similar to the dual lens shown in FIG. 7E. In this embodiment an LED 766 is displaced off to the side of a device axis 777 so that one edge of the LED 766 is on axis 777. The phosphor layer 765 is located at the imaged focal position of lens 760 but on the opposite side of device axis 777 from that of LED 766. The dual lens 764 sharply images LED 766 onto the phosphor layer 765, whereupon some rays are directed into solid dielectric optic 762, and others are backscattered to filter 761. The filter 761 redirects and images all backscattered rays onto imaged focal position at the same height as phosphor layer 765, but on the opposite side of the axis of the device. These rays are directed into solid dielectric optic 762, whereupon they are directed from the device in a pattern. Ray 763 illustrates the key principle associated with this embodiment. The dual lens 764 is designed through application of the SMS design methods. This device theoretically has a lower potential luminance than the embodiment in FIG. 7E as the virtual area of the source is larger. However, it has an advantage over the approach employed in FIG. 7E in that there is only a single re-cycling of the back-scattered rays before it can exit the device.

Figure 7G:
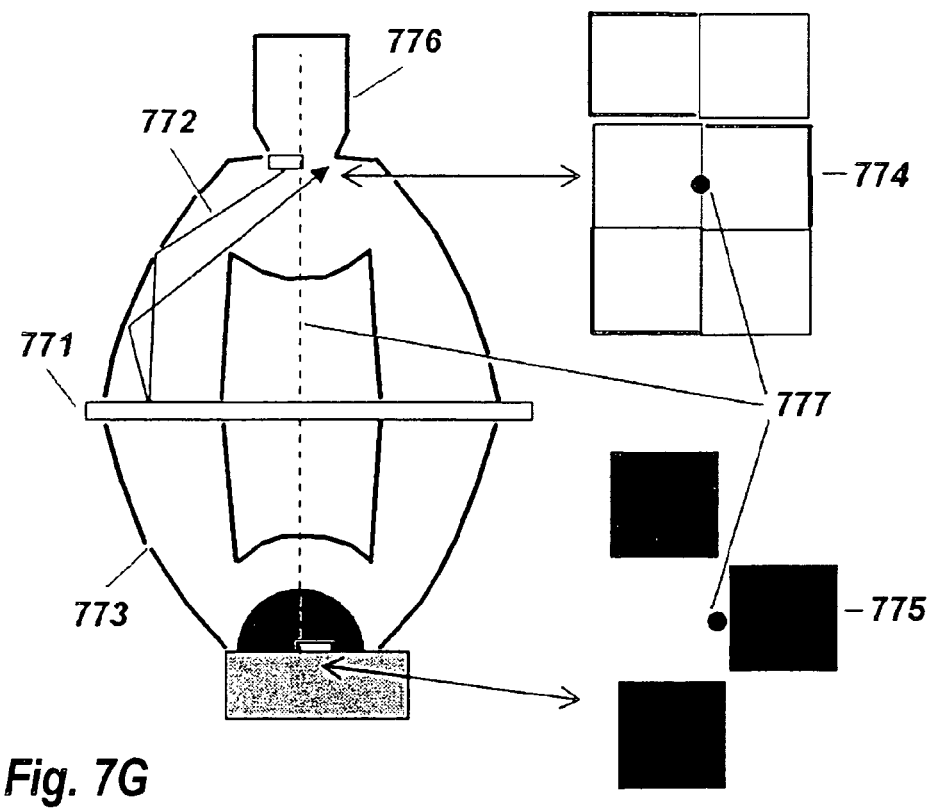
FIG. 7G is a side view of another dual collimating lens with dichroic filter, including an off-axis LED triad array and an off-axis phosphor triad array system.

FIG. 7G is a similar optical system to the one described in FIG. 7F. In this embodiment the single LED and single phosphor target is replaced with a triad of LEDs 775 and a triad phosphor target 774. The principle and operation of the device is similar to the device shown in FIG. 7F.

Figure 7H:
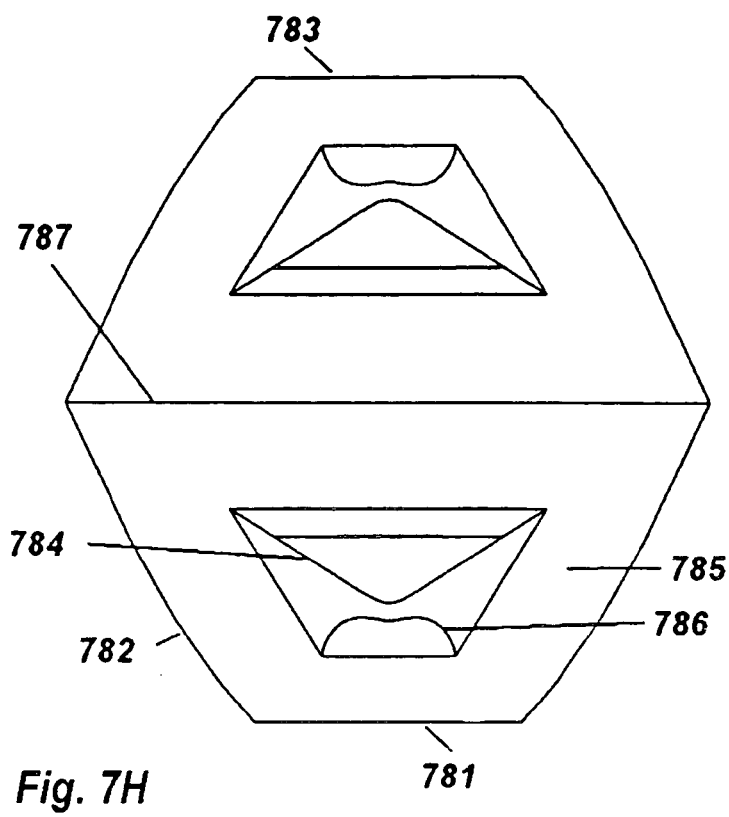
FIG. 7H is a side view of another dual collimating lens for use with an off-axis LED and phosphor system.

FIG. 7H shows an embodiment that uses the same principle of single recirculation as the embodiments shown in FIGS. 7F and 7G but with a slightly different optical architecture. In this approach, a filter 787 is embedded on its entire face by the bottom and top halves of an optic 782. Each half of the optic 782 has an outer solid dielectric TIR element 785, and an inner pair of refractive lenses 786 and 784 with an air gap between them. These optical features together provide controlled offset imaging of the LED die onto the phosphor for either a single LED/phosphor pair or an array of die and phosphor. Interface 783 can have a secondary dielectric optic attached to it such as 762 of FIG. 7F, to extract the direct and recycled rays.

Figure 7I:
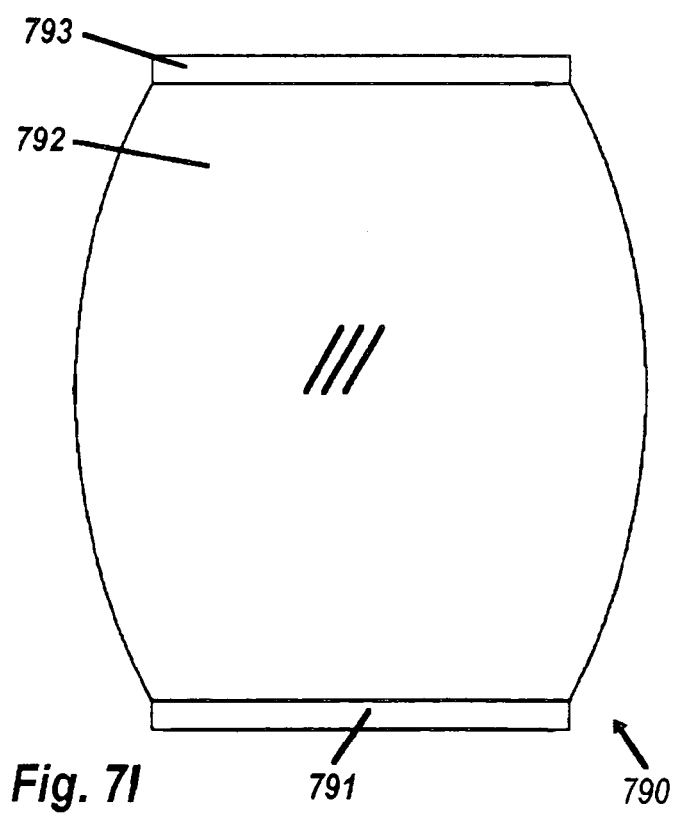
FIG. 7I is a cross-sectional view of a cross-CEC with a remote phosphor.

FIG. 7I is a cross-section of a remote phosphor system 790, comprising LED chip 791, a high-index compound elliptical concentrator (CEC) 792, and a high-index phosphor layer 793. For a square or rectangular LED, one embodiment is a cross-CEC. The latest high-index (2.4-2.8) phosphor is zinc-selenide-sulfide, available from the Phosphor-Tech Corporation as an electrophoretic deposition capable of high packing density, with index controlled by the selenium-sulfur ratio. A further high-index CPC could function atop layer 793 similarly to CPC 2002 of FIG. 2C. This embodiment includes a specular reflector at the rear of LED 791, preferably of silver or the hybrid silver/ito omnidirectional reflector described in U.S. Pat. No. 6,784,462. This will reflect the phosphor's rearward emission with good efficiency, helping to nearly double its front-side luminance.

FIGS. 1A, through 2D concern the gathering of light for the optical transformer described herein. They show two-dimensional profiles acting on rays running in the plane of the Figures. In practice a 3-dimensional system is formed by extruding such a profile orthogonally to its plane. The thickness of this extrusion distance is typically equal or slightly larger than the width of the square chip. This will result in losses in the extrusion direction of rays not in the plane of the profile being extruded. Instead, a two-way cross-CPC can be used, with the same profile used in orthogonal directions. This is shown in FIGS. 8A, 8B, 9A, 10A and 10B. Critical to high system efficiency is the use of a transparent material with suitably low absorptance, because of the multi-pass nature of the passage of light within these embodiments. For example, polycarbonate, a routinely employed injection-molded plastic, has so much absorption that these embodiments will have serious losses, whereas acrylic does not.

Figures 8A, 8B, 9A:
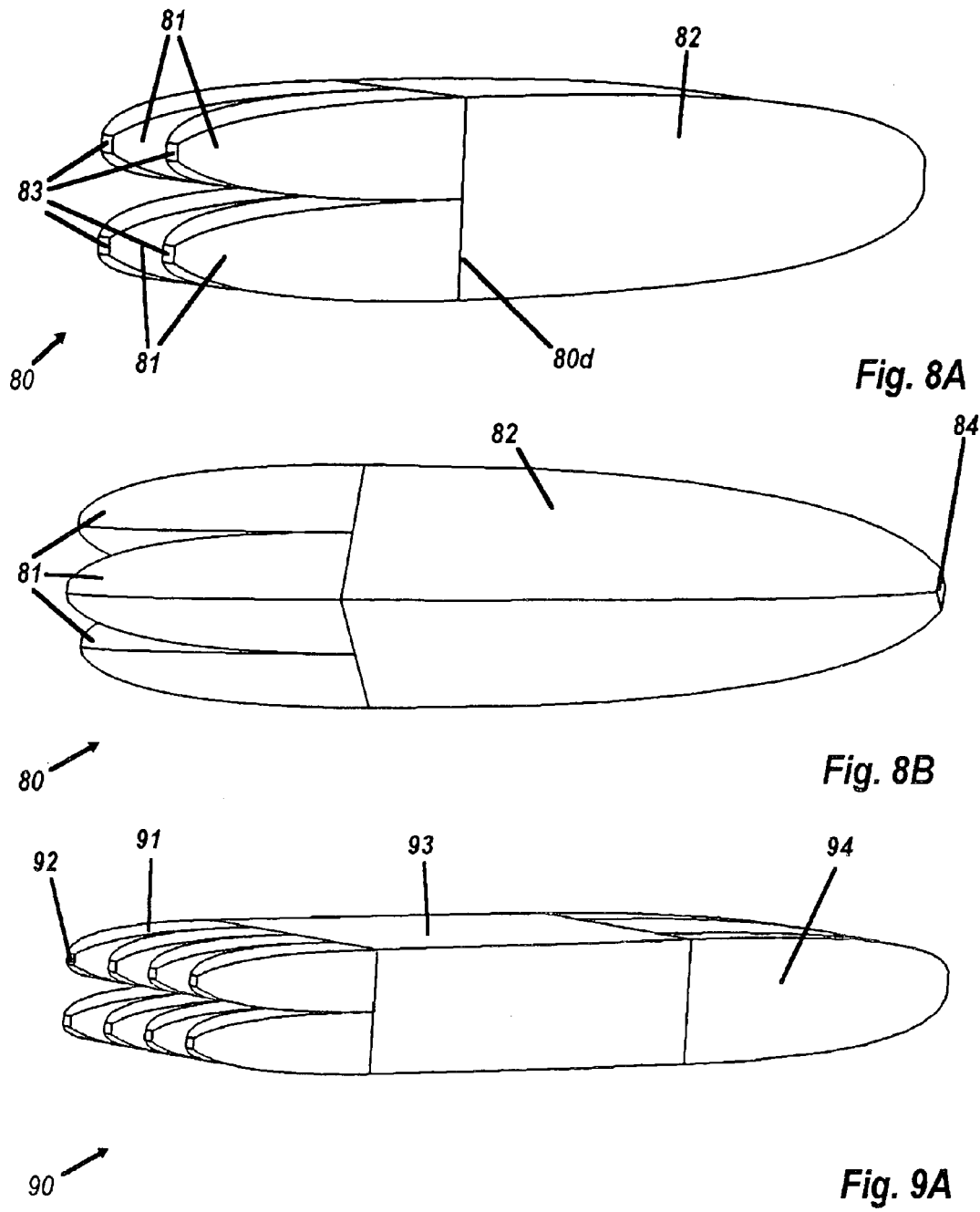
FIG. 8A is a side view of an optical manifold comprising a plurality of square CPCs arranged in a 2×2:1 configuration.
FIG. 8B is an end view of an optical manifold comprising square CPCs in a 2×2:1 configuration.
FIG. 9A is a side view of a 2×4:1 optical manifold for eight LEDs and a 2:1 rectangular output, also comprising a mixing rod.

FIG. 8A is a perspective view of optical manifold 80, a dielectric-filled 2×2:1 multi-CPC embodiment. It comprises four input cross-CPCs 81 and output cross-CPC 82, all square in cross-section, as seen with dividing line 80d. The cross-section of each of these four cross-CPCs is similar to that of FIG. 2B, so that immersed LEDs 83 will have all their light sent across plane 80d into cross-CPC 82.

FIG. 8B is another perspective view of optical manifold 80, also showing exit surface 84, which must connect to another device of similar refractive index, else some of the concentrated light will be returned by internal reflection. It is possible to join manifold 80 with some of the embodiments to be shown below.

FIG. 9A is perspective view of a 2×4:1 optical manifold 90, comprising a plurality of input cross-CPCs 91 that receive light from a corresponding plurality of immersed LEDs 92, a rectangular mixing section 93 that receives the light from the plurality of cross-CPCs 91, and a rectangular output cross-CPC 94 that receives light from the rectangular mixing section.

Figure 9B:
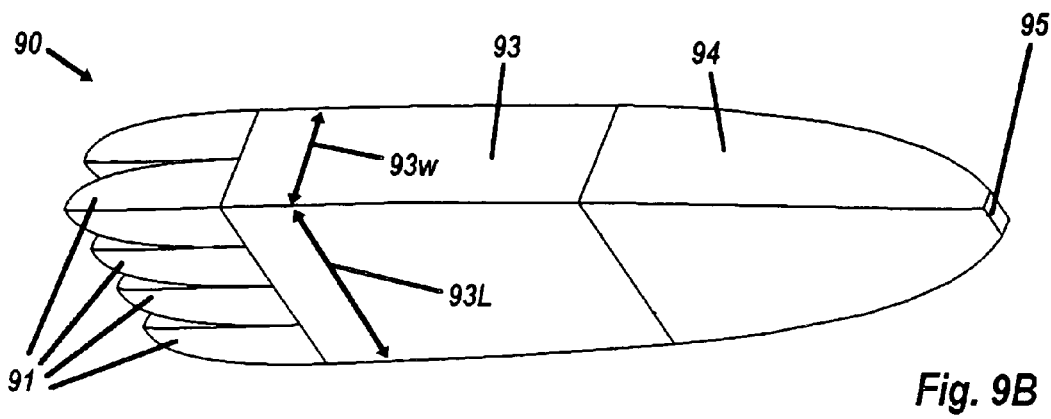
FIG. 9B is another side view of a 2×4:1 optical manifold for eight LEDs and a 2:1 rectangular output, also comprising a mixing rod.

FIG. 9B is another perspective view of the manifold 90 shown in FIG. 9A, also including an approximately rectangular output surface 95 from the output cross-CPC 94. The mixing section 93 has a rectangular cross-section with an approximately constant short dimension 93w but slightly expanding long dimension 93L.

Regarding these and other multi-port embodiments of the optical transformer described herein, the high-index CPC arrangement of FIG. 2C could be implemented with a silicone layer 2004 expanded to comprise multiple indentations to form multiple molds for high-index CPCs to go over plurality of LEDs. The sol-gel process of high-index casting can thus accommodate many different embodiments of the optical transformer described herein.

Figure 10A:
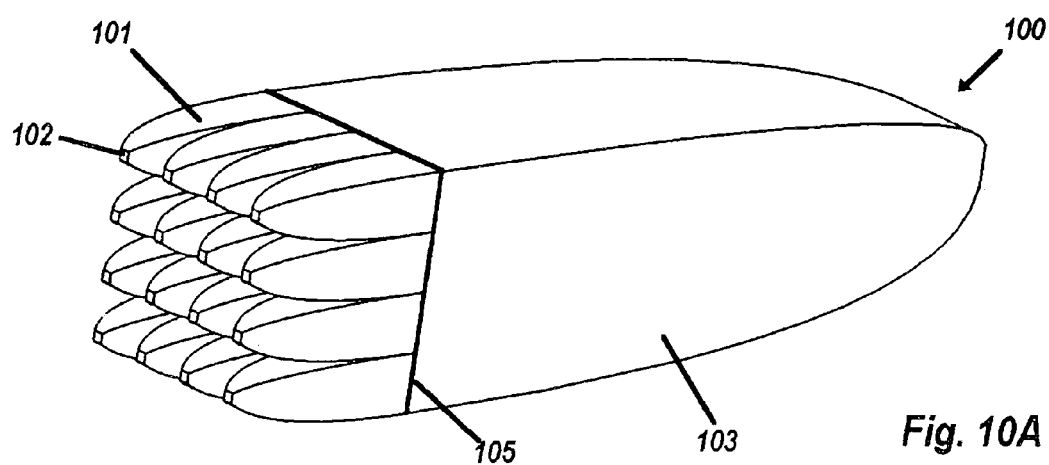
FIG. 10A is a perspective view from the input side of a 4×4 optical manifold that feeds the output of sixteen blue LEDs through a blue-pass filter.

FIG. 10A is a perspective view of a 4×4:1 optical manifold 100, comprising a plurality of (in this embodiment sixteen) square dielectric input cross-CPCs 101, a corresponding plurality of immersed LEDs 102 connected respectively to the cross-CPCs, and an approximately square output dielectric cross-CPC 103 coupled to collectively receive the light output from each of the cross-CPCs. Also shown is an immersed square filter 105, installed for the case of blue LEDs 102. In some embodiments, square filter 105 would be a blue-pass reflector applied across the input face of output CPC 103, then optically joined to the array of input cross-CPCs 101. Such a blue-pass reflector can be constructed in several ways well known to those skilled in this art, such as deposition of thin film multi-layer dielectric or other materials onto a suitable substrate, and through single or multi-layer reflection or transmission holographic coatings. In a 1981 publication (Miles, Webb, and Griffith, "Hemispheric-field-of-view, nonimaging narrow-band spectral filter", *Optics Letters*, Vol. 6 #12 pp. 616-618 (December 1981) two hollow reflective CPCs are used face-to-face to collimate light into a narrow-band spectral filter and then condense the filtered light. Embodiments of the optical transformer described herein, in contrast, utilize a dielectric CPC instead of a hollow CPC. Another difference is using a band-pass filter rather than a narrow-band one. The embodiment of FIG. 10A has a plurality of input CPCs rather than a single CPC. As shown in FIG. 10C, the condenser CPC, 103, has a phosphor target, 106. Condenser CPC 103 combines and homogenizes the input from sixteen LEDs onto a single exit surface on which phosphor target 106 resides. A novelty of the embodiment of FIG. 10A, also not disclosed in Miles et al., is the function of filter 105, to reflect the back emission of phosphor 105, as shown in FIG. 10D. This is the recycling principle of the optical transformer described herein, which is believed to be a novelty.

Figure 10B:
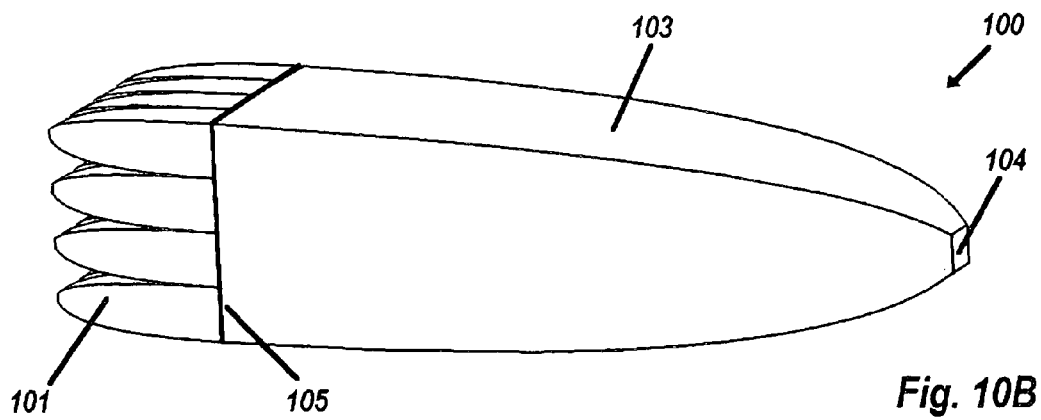
FIG. 10B is a perspective view of the manifold of FIG. 10A from the output side, where the blue-passed light is condensed onto a patch of highly uniform phosphor.
Figure 10C:
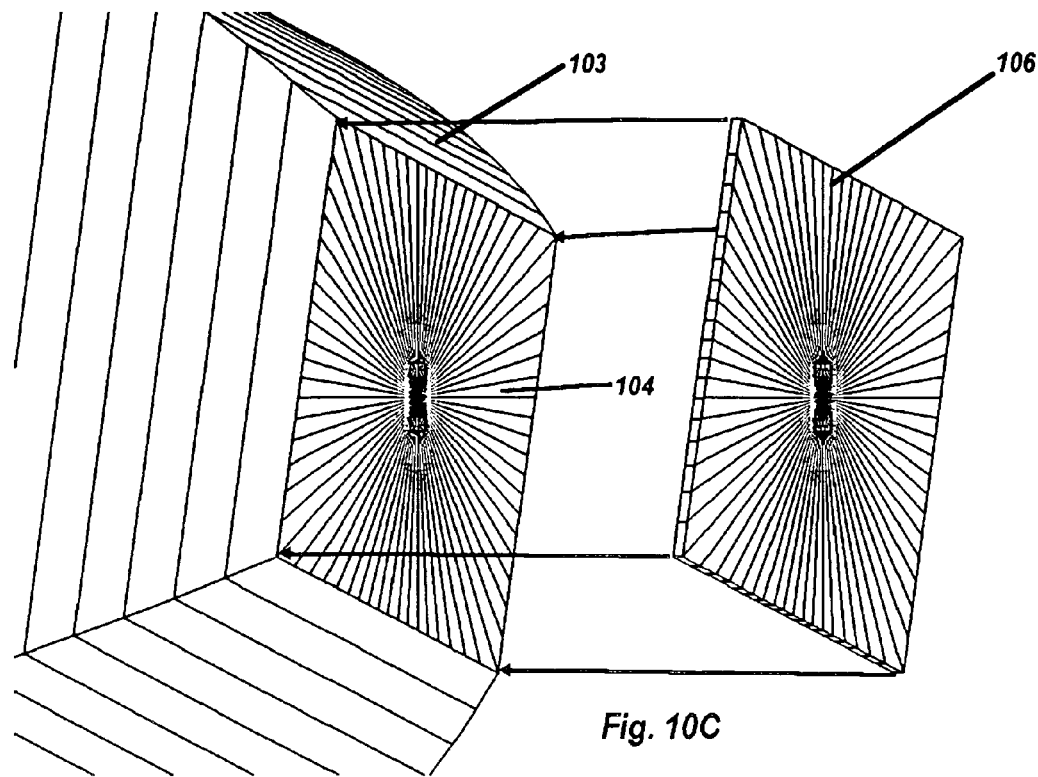
FIG. 10C is a close-up exploded perspective view of the phosphor, a monolithic ceramic, optically bonded to the CPC.
Figure 10D:
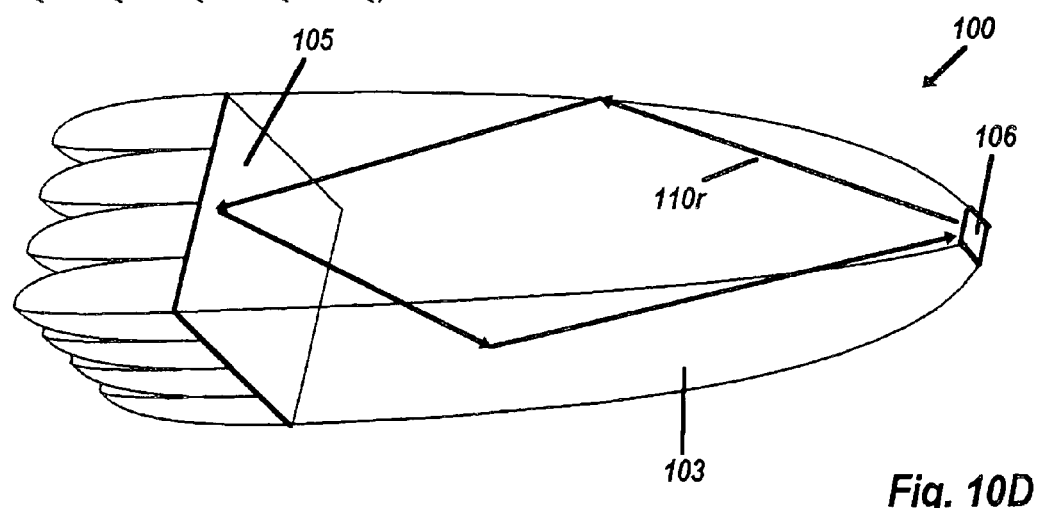
FIG. 10D is a ray trace in a perspective view of the optical manifold of FIG. 10A, showing how the phosphor's light output is returned by the filter, greatly increasing phosphor efficiency and luminance.

FIG. 10B is another perspective view of the optical manifold 100 shown in FIG. 10A, and in addition comprising an approximately rectangular exit face 104.

FIG. 10C is a close-up view of exit CPC 103 at exit face 104, showing thin phosphor layer 106 exploded away from its actual position installed on 104. The phosphor layer receives the entirety of the immersed Lambertian optical output of cross-CPC 103. The advantageously uniform summation of light from blue LEDs 102 suffers no uniformity lost due to fluctuations or malfunction of any one LED. Advantageously, no wavelength binning of individual LEDs is required, so that quality control suffices that keeps constant the average center wavelength of any of the plurality of LEDs.

The optical manifold shown in FIGS. 10A, 10B and 10C has further advantages that flow from a phosphor configuration, which is not possible with phosphor layers conventionally applied to individual blue chips. In a conventional white LED, the blue chip receives a drop of a slurry of powdered phosphor in a semi-fluid binder. The drop dries (or is UV-cured) after being deposited on the blue chip during manufacturing. The disadvantages of the conventional approach are numerous. First, the deposition of a thin, controlled-thickness conformal layer of phosphor is extremely difficult to achieve onto the surface of a 1-mm high-powered LED emitter, which is believed to be a consequence of the materials used in the manufacture of the LED, the small size of its deposition surface and the fact that many of the techniques available for depositing a constant thickness layer on the emitting surface could possibly damage the LED. Secondly, the phosphor layer is subject to high heat conditions because it is proximate to the LED, which can lead to accelerated thermal degradation of the coating or to physical damage to the phosphor/LED interface by forces arising from mismatched thermal expansion. The phosphor spectral emission curve, discussed in connection with FIGS. 11A, 11B and 11C below, shifts to longer wavelengths as temperature increases, resulting in an undesirable temperature dependence of LED color. There are other problems with this technology that are known to those who are skilled in the art, including the above-discussed difficulties in control of color temperature.

Instead, FIG. 10C shows how the optical transformer described herein directly utilizes the phosphor after it is baked into a ceramic, as a large thin sheet of uniform thickness, such as 25-60 microns. A conveniently large piece could then be laser-scored or otherwise cleaved into pieces the size of layer 106, in the range of 4-6 millimeter on a side. Larger pieces of phosphor of the same thickness could of course be used in larger optical manifolds for greater white-light luminosity. This method offers high uniformity in both luminance and color temperature, due to the much greater control of phosphor thickness and the lack of thermal cycling.

FIG. 10D is ray tracing within the optical manifold 100 of FIGS. 10A, 10B, and 10C, illustrating the function of blue-pass filter layer 105, which is installed across the input face of output cross-CPC 103. Phosphor layer emits an exemplary Lambertian-distributed ray 107. The reversibility of optics means that cross-CPC 103 will compress the full angular range of the Lambertian yellowish emission, with representative ray 107, of the interior side of phosphor layer 106. When this emission reflects off of blue-pass filter 105, its narrow angle causes it to be returned to phosphor 106. That is, large CPC 103 reduces the off-axis angles of all rays to under 10°. These returned rays will be scattered within phosphor layer 106 but not absorbed, and will instead have another 50% chance of escaping the exterior side of phosphor layer 106. It is believed that this feature should nearly double the white luminance over that found with phosphors directly coated on blue LEDs. The large CPC 103 will produce superior uniformity due to its non-imaging nature. A further novelty of the some embodiments of the optical manifold described herein is the precise control of color temperature by the exact and uniform application of phosphor thickness. This combination of uniform blue illumination and a large photoluminescent layer is a novelty.

Figure 10E:
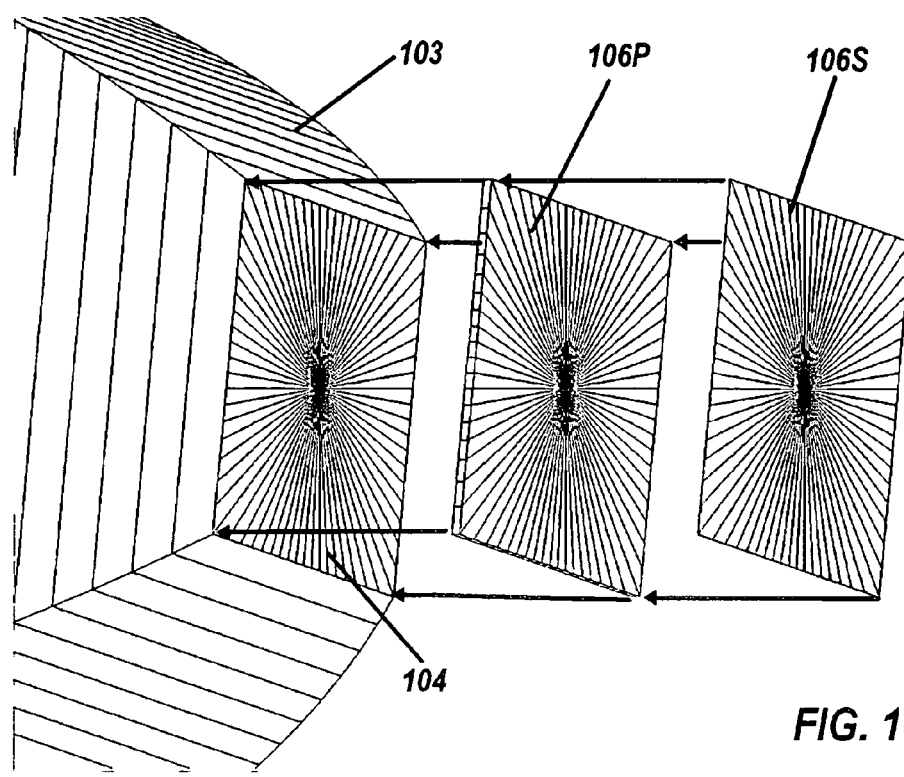
FIG. 10E is an exploded perspective view of a red semiconductor installed atop a green phosphor in the optical manifold of FIG. 10A.

It is believed possible to utilize a photoluminescent semiconductor, such as a slice from a wafer of AlInGaP, to generate red light when illuminated by blue light. Since this material is transparent, it can be overlaid over a green phosphor and used instead of a yellow phosphor. Using a green phosphor can be advantageous when the quantum efficiency of the semiconductor is more than that of the yellow phosphor. FIG. 10E shows an example of such a configuration, showing the large CPC 103 with the exit face 104. A green phosphor 106P bonds thereupon and thinner red semiconductor layer 106S is installed atop it.

Figure 10F:
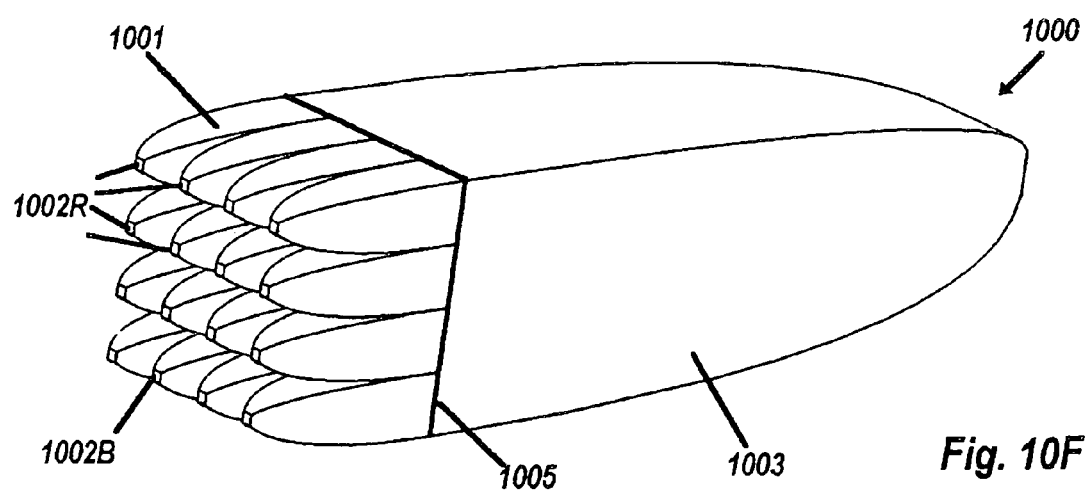
FIG. 10F shows a manifold fed by both red and blue LEDs, also including a phosphor-coated surface.
Figure 10G:
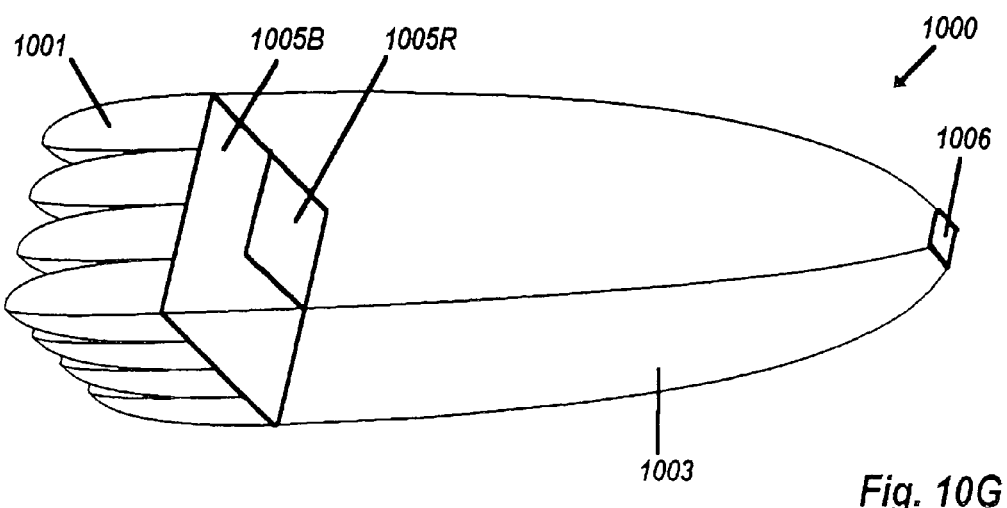
FIG. 10G is another view of the phosphor end of a manifold fed by both red and blue LEDs.

Another way to use a green phosphor is with red LED light sources. FIG. 10F is a perspective view of a manifold 1000 comprising sixteen small CPCs 1001 feeding large a CPC 1003 through a planar filter 1005. In this example, four of the LEDs 1002R are red and the remaining twelve LEDs, 1002B, are blue. FIG. 10G is another view of manifold 1000, showing green phosphor 1006 at the exit plane of large CPC 1003. A filter 1005 is shown comprised of a smaller red-pass filter 1005R and an L-shaped blue-pass filter 1005B. The filter 1005R lies over the four red LEDs 1002R, while filter 1005B lies over the twelve blue LEDs 1002B. This composite filter has recycling action just as shown by ray 110r in FIG. 10D.

Another issue arises from the refractive index of the phosphor material, thought to be about 1.8. This would cause light to be trapped in the phosphor due to total internal reflection. FIG. 10G is an exploded view similar to FIG. 10C, but adding an optical system that increases light extraction from the phosphor. FIG. 10G shows dielectric cross-CPC 103, monolithic ceramic phosphor 106, and dielectric hemisphere 107, which fits over the phosphor.

Figure 10H:
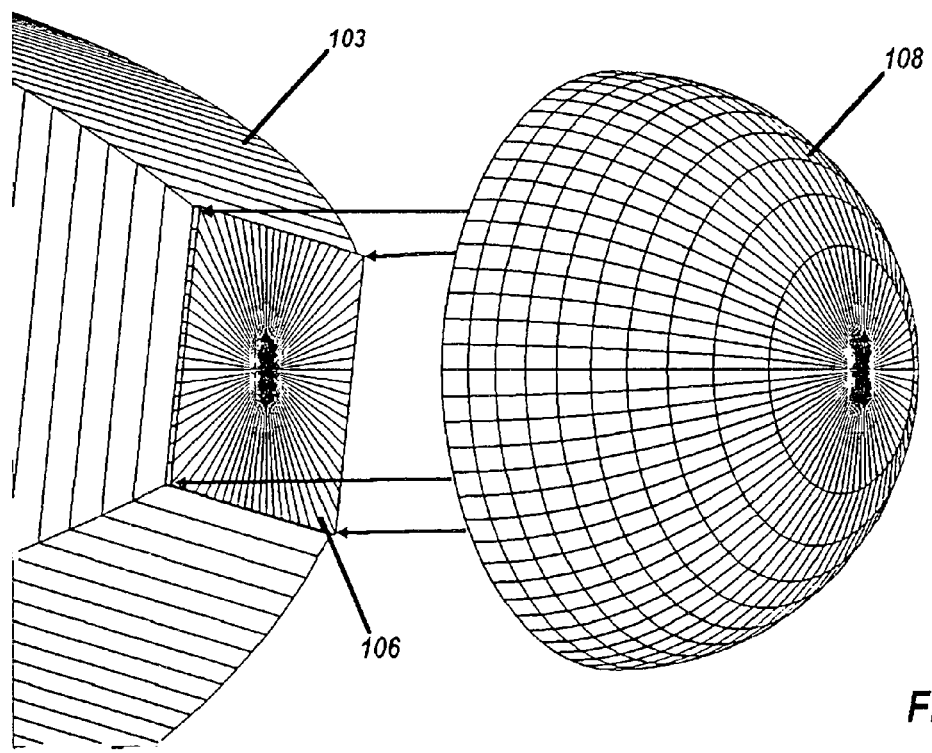
FIG. 10H is a close-up exploded view of a dielectric dome in which the monolithic ceramic is immersed, also including a phosphor-coated surface.
Figure 10I:
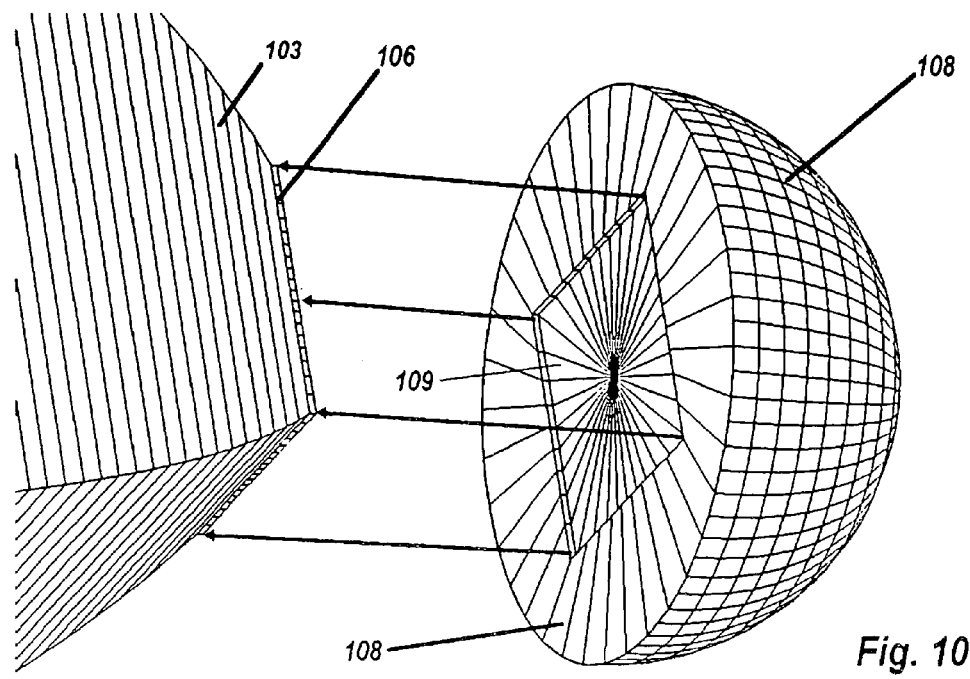
FIG. 10I is a close-up exploded view from another viewing angle showing the dome's indentation to receive the phosphor.

FIG. 10H is another view of this fit, also showing the equatorial surface 108 of the hemisphere 107, including a square indentation 109 that receives phosphor 106 and is optically bonded thereto. This arrangement increases light extraction by generating a magnified image of the phosphor. It is believed that such a dome will be less useful, however, when phosphor scattering is high. In that case, light trapped by the flat phosphor layer will be re-scattered and recycled via interaction with the short pass filter until it is either extracted or absorbed. If the short pass filter is properly designed it should have a reflectance of 0.99 and have negligible absorptance. Assuming that the material chosen for the recycling section of optic also has a low absorptance (such as PMMA), then the amount of flux lost in the multiple bounces is small and the light extracted in such a system will be high. This will cause luminance to be substantially higher than in the dome case, albeit at a slight decrease (5-10%) in overall luminosity. A flat protective cover of a suitable material is typically needed to protect the phosphor layer. Suitable materials include epoxy, PMMA, polycarbonate, for example, and other materials with a lower index of refraction than the phosphor.

Figure 11A:
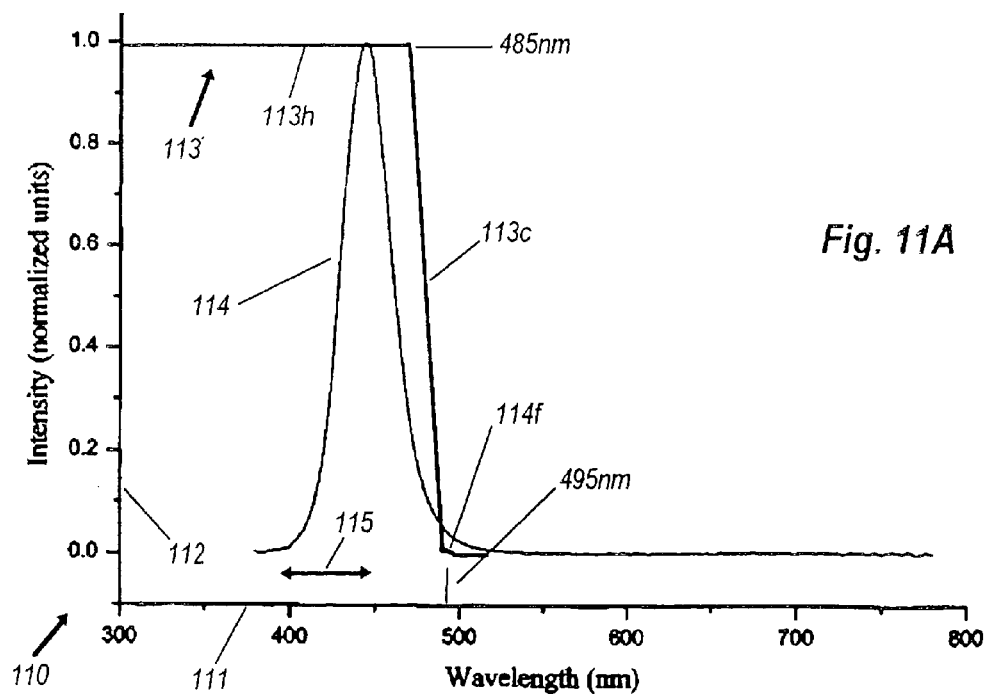
FIG. 11A is a graph of the spectrum of light output from a blue LED, and also including the transmission curve.

FIG. 11A is a graph of the output of the filter 105 in a spectrophotometric plot 110, comprising a horizontal wavelength scale 111 spanning the extremes of the visible spectrum, from 400 to 800 nanometers. A vertical scale 112 plots the relative intensity or transmittance. A plot line 113 shows the spectral transmittance of filter 105 of FIG. 10A. A upper line 113h is at nearly 100%, since filter 105 typically has a refractive index only a slightly lower than that of an injection moldable plastic such as polycarbonate. For example one suitable material for such a filter is a PYREX wafer.

FIG. 11A also graphs a transmittance plot 113 that shows an abrupt cliff 113c, between 485 nm on the left and 495 nm on the right. Short-pass filters having abrupt changes in transmittance and reflectance plots are commercially available, over a wide range of center wavelengths, such as from JDS Uniphase Corporation of Santa Rosa, Calif. Suitable short-pass filters have a high transmittance (typically above 90% even in air including Fresnel losses) below a prescribed wavelength, and a high reflectance (above 99%) for wavelengths starting only 5 nm above the transmission cutoff wavelength. In addition, these filters can maintain the high reflectance bandwidth for of up to 150 nm. Finally, these short-pass filters can meet these specifications when sandwiched between dielectric optics or in air, for ray incidence angle 10° or less. The center wavelength itself is certified at normal incidence and is described as varying in accordance with the cosine of the incidence angle within the filter, as theory dictates. Plot line 114 depicts a typical spectrophotometric plot for a blue LED. Only a tiny fraction, 114f, is outside the transmittance curve 113. Such spectral filtering, however, is angle-sensitive, with wavelength shift 115 showing the effect of 27° off-normal incidence. This shows that plot 114 would be shifted enough to cause all the blue light to be reflected. The input CPCs of FIG. 10A have a 10° exit angle, which causes a shift of only about 495(1−cos 10°)=7 nm, half the width of cliff 113c. This effect only increases reflective losses from about 1% to 2%.

Figure 11B:
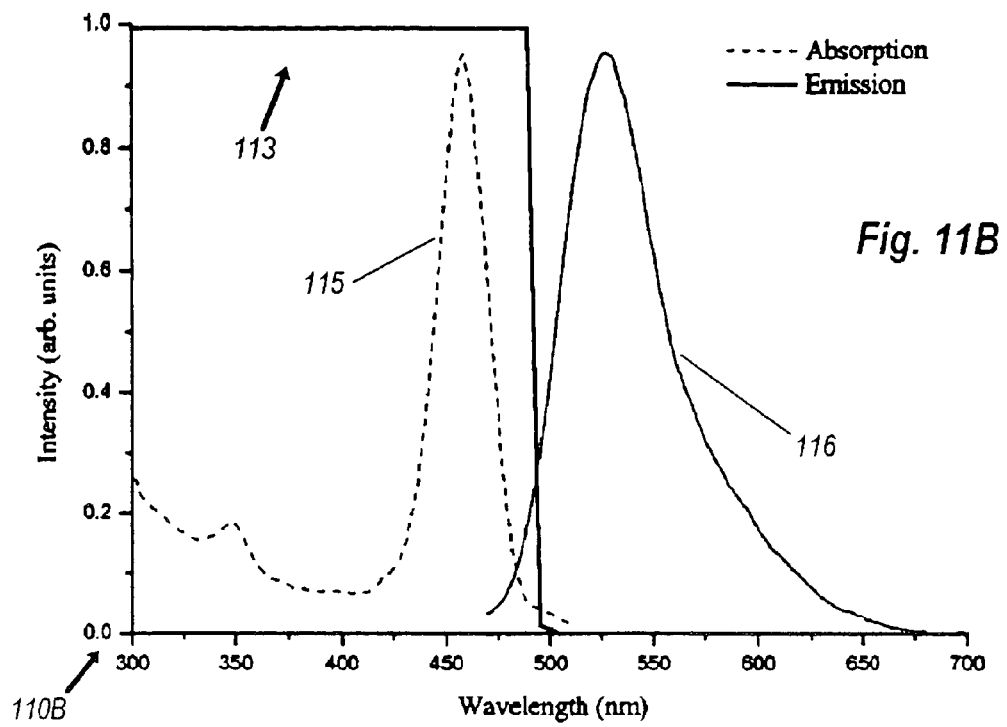
FIG. 11B is a graph of the absorption and emission spectra of a yellow phosphor, and also including a transmission curve of a blue-pass filter.

FIG. 11B is a graph similar to FIG. 11A, but with a different spectral plot 110B, illustrating the significance of filter transmittance plot 113, now juxtaposed with dotted phosphor absorption curve 115 and phosphor emission curve 116. Absorption curve 115 is nearly coincident with blue-LED emission curve 114 of FIG. 11A, and is all on the transmission side of plot 113. Emission curve 116 is nearly all on the reflection side of plot 113, which is what causes the return of white ray 107 of FIG. 10D, ensuring the recycling of inwardly emitted white light from phosphor 106.

Figure 11C:
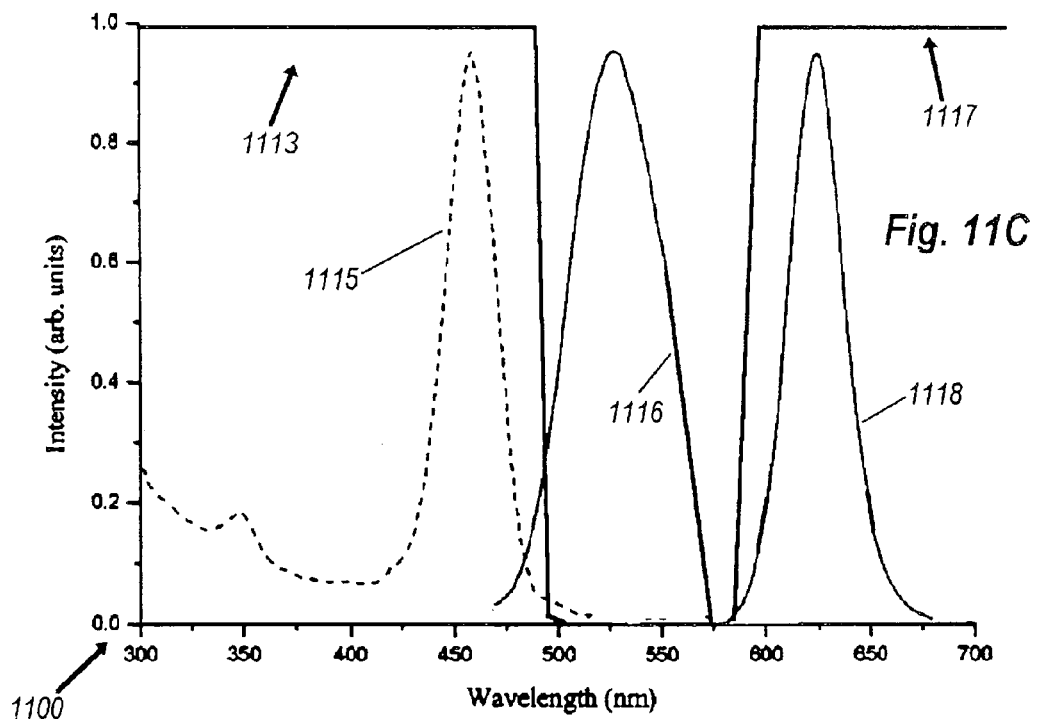
FIG. 11C is a graph of the absorption and emission spectra of a green phosphor, and also including the transmission curve of a red-pass filter.

FIG. 11C shows a similar graph to FIGS. 11A and 11B, but with a different spectral plot 1110, illustrating the spectral action of composite filter 1005 in FIG. 10G. A blue-pass filter 1005B of FIG. 10G has a transmission curve 1113 in FIG. 11C. Dotted curve 1115 is the excitation function of the green phosphor, and solid curve 1116 is its emission function. A red-pass filter 1005R of FIG. 10G has transmission curve 1117 in FIG. 11C. A red LED 1002R of FIG. 10G has spectral distribution 1118 of FIG. 11C. Both filters reflect the green phosphor emission wavelengths of curve 1116, enabling the recycling within the large CPC of the phosphor back-emission.

A filter for this application can be produced using a PYREX wafer as a substrate and depositing on one side of this substrate many thin layers of materials using the well-known vapor deposition process. A suitable PYREX wafer is readily available from Corning, Corning N.Y., with a thickness of approximately 0.3 mm with a dimensional tolerance of ±0.05 mm. This material has an average index of refraction in the visible range of 1.47. The deposition processes, design procedures and the materials needed to make such a device are well established from prior art. For example, using forty-five alternating thin layers of silicon dioxide and tantalum pentoxide on the aforementioned PYREX wafer, a filter can be designed to achieve a minimum transmittance of above 85% for wavelengths 400 to 495 nm, while having a reflectance above 98% for wavelengths in the range of about 515 nm to 700 nm. Such a device can be made into large wafer and then the required shapes can be cut into smaller pieces to match the size of filter 105. This approach can appreciably lower the cost of the filter. Other even more efficient designs are readily available from industry sources such as the devices available from JDS Uniphase of Santa Rosa, Calif., using a variety of well-established processes, materials and design procedures. In addition, it may be possible to utilize holographic technologies to achieve the same result. This may have several advantages over traditional approaches, as holograms can be a very low cost component if produced in large quantities. However, such a technology has not yet been reported as available at this time and will require specialized research and development.

Figure 12:
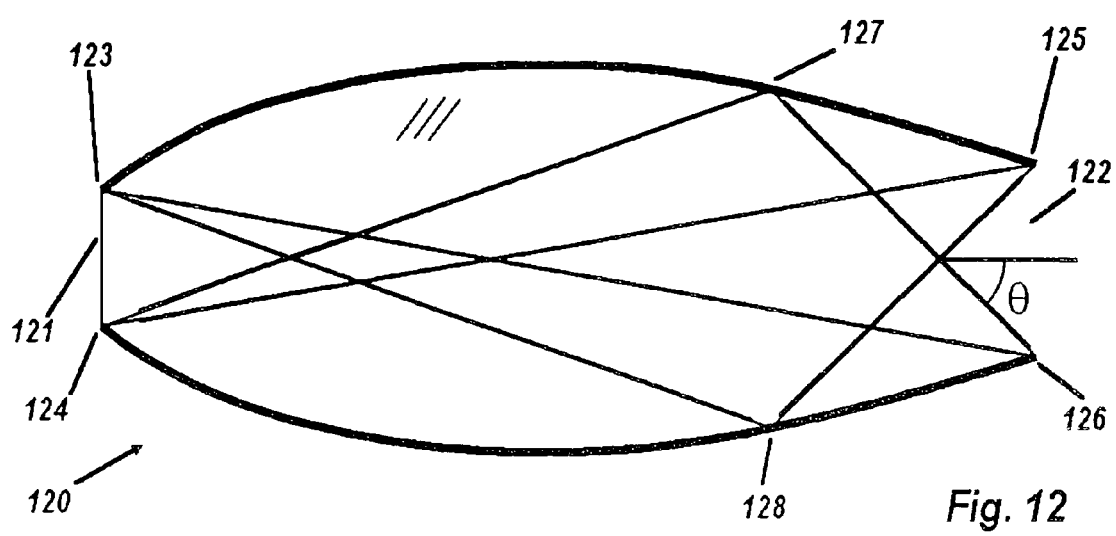
FIG. 12 is a cross-section of an angular compressor.

It is desirable that the Lambertian distribution of an immersed LED be compressed to the critical angle, but expanding area in an etendue-conserving fashion. FIG. 12 shows distribution-transforming element 120, with a wide-angle (±90°) port 121 marked by end-points 123 and 124, and spatially wider narrower-angle port 122, marked by end-points 125 and 126. Point 127 is defined by critical angle θ of the transparent medium composing element 120. From point 123 to point 127, the profile of element 120 is an ellipse with foci at opposite points 124 and 126. Between points 125 and 127 is a parabola with focus at point 124 and axis parallel to the ray running from point 125 to point 128. To the left of points 127 and 128 is a CEC (compound elliptical concentrator), while to their right is a CPC. The narrower-angle output of distribution-transforming element 120 serves as suitable input for further embodiments.

Equally important for building blocks of the optical manifolds of the optical transformer described herein are etendue-conserving ways to transport luminance at a high NA, which is typically around 1, while mixing it to achieve high uniformity and a constant color. The NA can be calculated using either of the following equations:

$$NA = n \sin(\pi/2 - \theta_C) = n\sqrt{(1 - 1/n^2)},$$

where $\theta_C$ is the critical angle of the material and n is the index of refraction of the material. This equation is useful for determining the NA of a system where the input ray bundle is already inside a dielectric media. In this instance the value n in the equation is greater than 1.0.

Prior art relating to transport of illumination is shown in U.S. Pat. No. 6,189,687 by Fein, particularly his FIG. 1F. This corner-turning configuration is only possible with conventional reflectors, since TIR will fail for arbitrary rays coming in. For all-TIR operation Fein has a device in his FIG. 3B for a 45° turn. An optic with a similar geometry is redrawn here, in FIG. 13A, to promote discernment of the distinction from it, and advantages over it, of the angle-rotator disclosed herein.

Figure 13A:
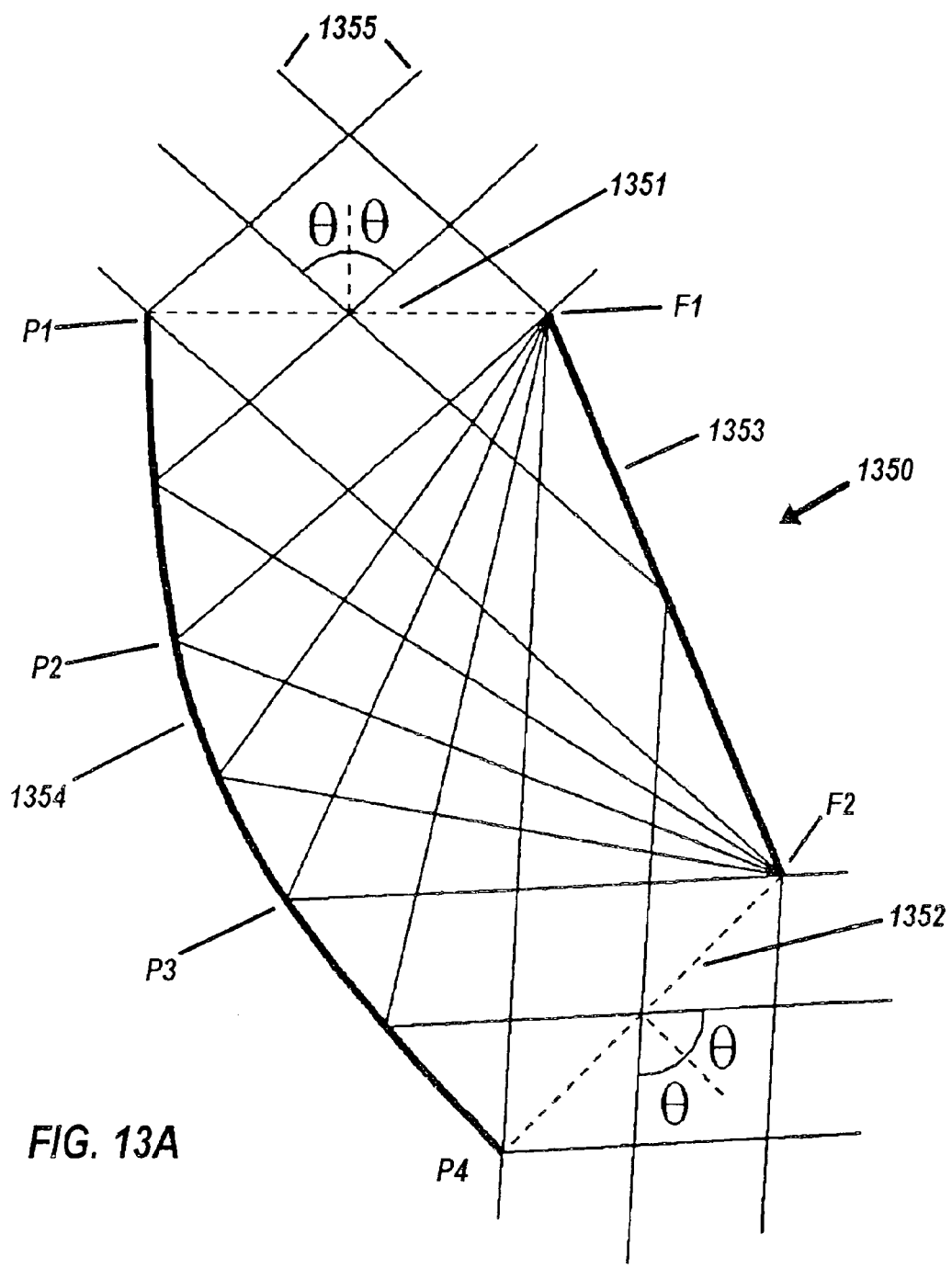
FIG. 13A is view of prior art, including a corner turner.

FIG. 13A shows the construction of Fein's corner-turner 1350, with ports 1351 and 1352 lying at a 45° mutual orientation. It uses a construction angle θ, which is the complement of the critical angle $\theta_C = \sin^{-1}(1/n)$, which for n=1.495 is θ=49°. This corresponds to the maximum angle of guided light, or approximately NA=1. Inside wall 1353 is a flat mirror for which TIR is operable, running from point F1 to point F2. Outside wall 1354 comprises a parabolic arc running from point P1 to point P2, with focus at point F2 and axis making an angle θ, in the clockwise direction, to the vertical, an elliptical arc running from point P2 to point P3, with foci F1 and F2, and a parabolic arc running from point P3 to point P4 with focus at point F1 and whose axis makes an angle θ to the normal to the exit aperture 1352. Construction lines 1355 are reflected against outer wall 1354 in the same way as the limiting rays of light at approximately NA=1.

Figure 13B:
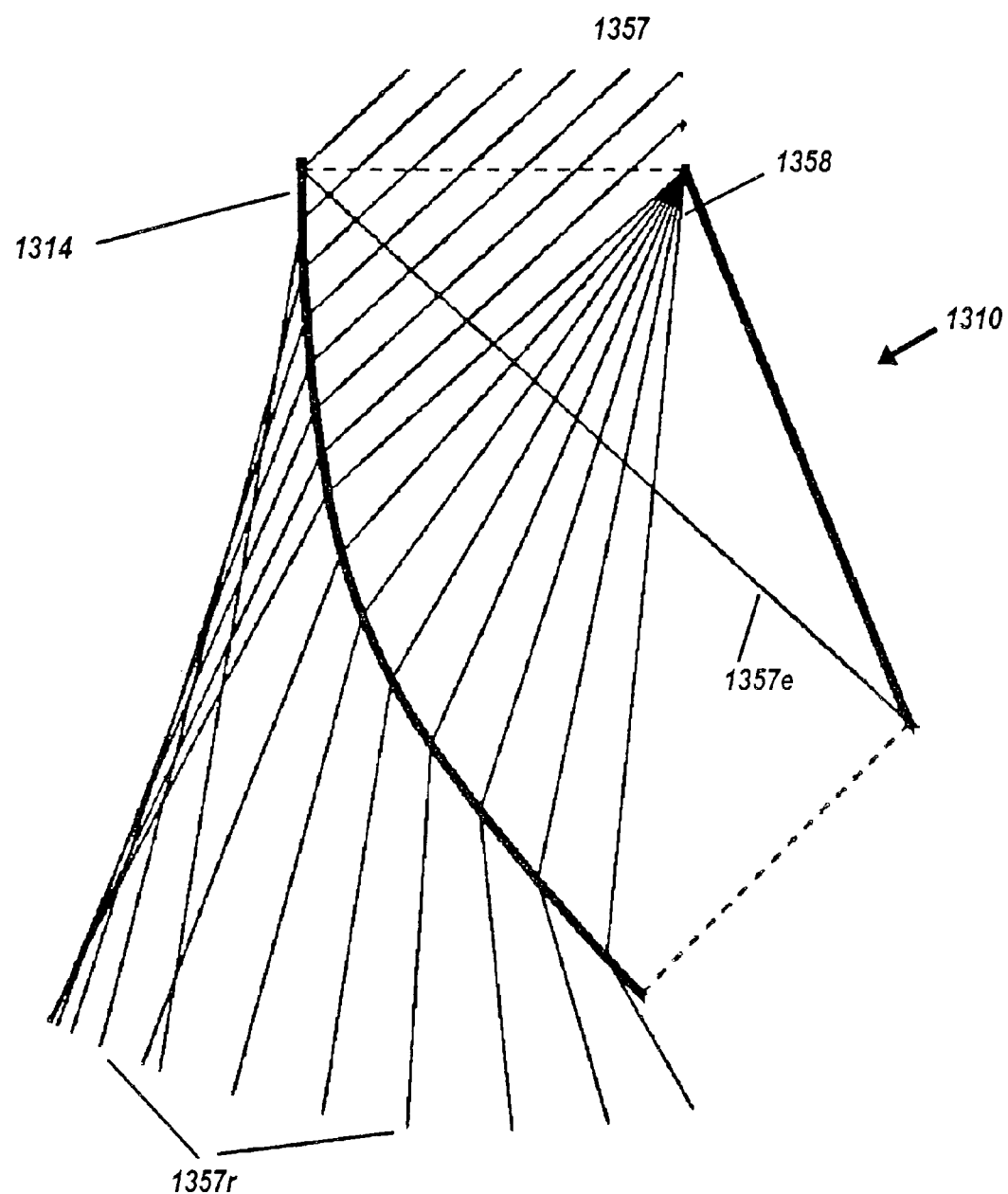
FIG. 13B is a ray trace of the prior art shown in FIG. 13A.

Although these construction lines are for NA approximately equal to one, the device of FIG. 3B of Fein cannot actually transport such radiation via only total internal reflection. This is shown in FIG. 13B, which depicts a ray trace of corner turner 1310. Edge rays 1357 make an angle to the normal to entrance aperture, which is the complement of critical angle for the material of this device. Only one of them, ray 1357e, is reflected. All the rest, refractively transmitted rays 1357r, constitute leakage and a partial device-failure. More complete ray traces show that 100% delivery is only obtained when the ray incidence angles are less than or equal to the angle between the line connecting points F1 and P4, and the normal to entrance aperture in FIG. 13A. In the example of FIG. 13A this angle is approximately 3 degrees. Some rays with incidence angles greater than 3 degrees for this device will leak out the side of the optic. If all the light is to be redirected by means of total internal reflection, it should be clear that the devices described in Fein, as illustrated by his FIG. 3B, are only suitable for rotating highly collimated light sources.

Figure 13C:
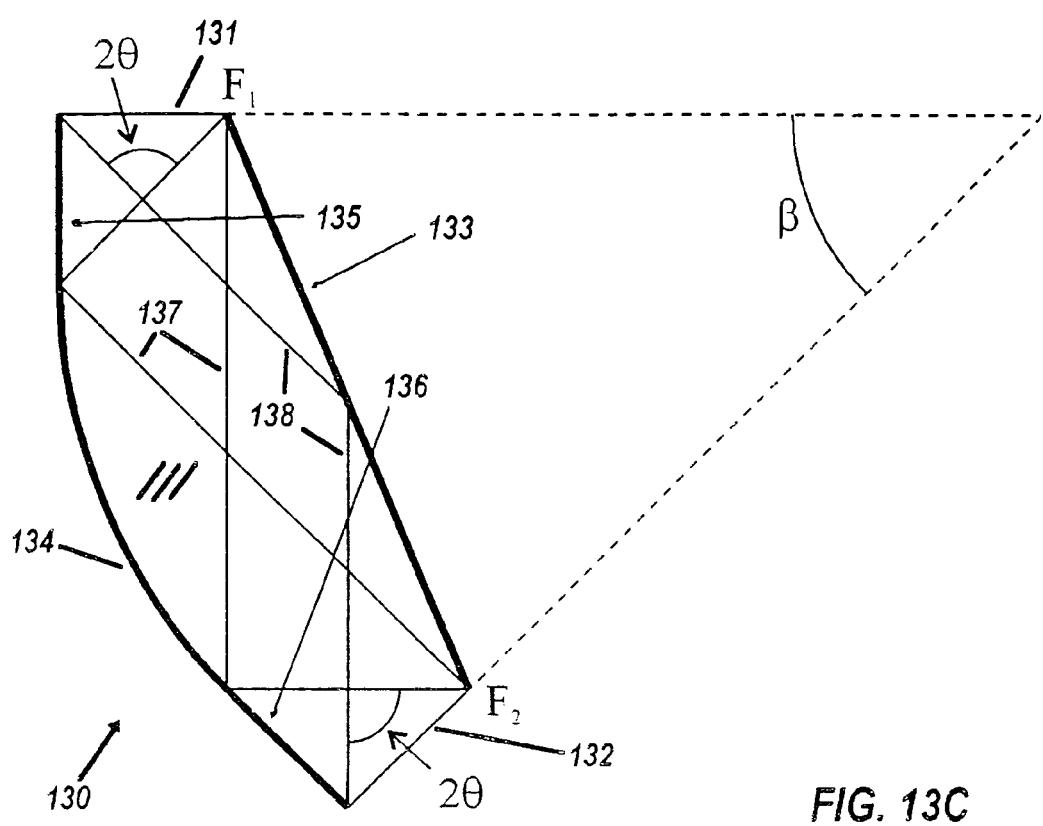
FIG. 13C is a cross-section of an angle-rotator of the optical manifold.

The angle-rotators used in the optical manifold satisfy total internal reflection for all rays up to the highest possible NA. FIG. 13C is a cross-sectional view of an angle-rotator 130, with a first port 131 and a second port 132, which are in complete exchange for light of angular width 2θ. This angle is twice the complement of the critical angle for the transparent material of rotator 130. The second port 132 is at angle β from the plane of port 131, generally at the convenient value of approximately 45°, enabling two angle rotators to transport luminance around a right-angle bend with substantially no losses, a situation that would cause inescapable losses for the simple round or square cross-sections of the prior art.

In FIG. 13C, a flat sidewall 133 extends between foci $F_1$ and $F_2$ of elliptical segment 134, which is in turn flanked by flat sidewalls 135 and 136. Sidewall 135 is oriented perpendicular to entrance aperture 131, while sidewall 136 is oriented perpendicular to exit aperture 132. Rays 137 run from focus $F_1$ to focus $F_2$ via a single total internal reflection, while ray 138 runs via a single total internal reflection from the opposite side of port 131 from point $F_1$ to the opposite side of port 132 from point $F_2$. This shows how angle rotator 130 transfers all rays within ±θ from first port 131 to second port 132, with none escaping. This nonimaging optical configuration tends to smear out any luminance non-uniformities it receives. This smearing is because each point on the second port 132 receives light from the entirety of port 131 as well as from reflections from the walls of angle rotator 130. Since an image is just another type of luminance-nonuniformity, this is why this and other embodiments herein are termed 'non-imaging'.

Figure 13D:
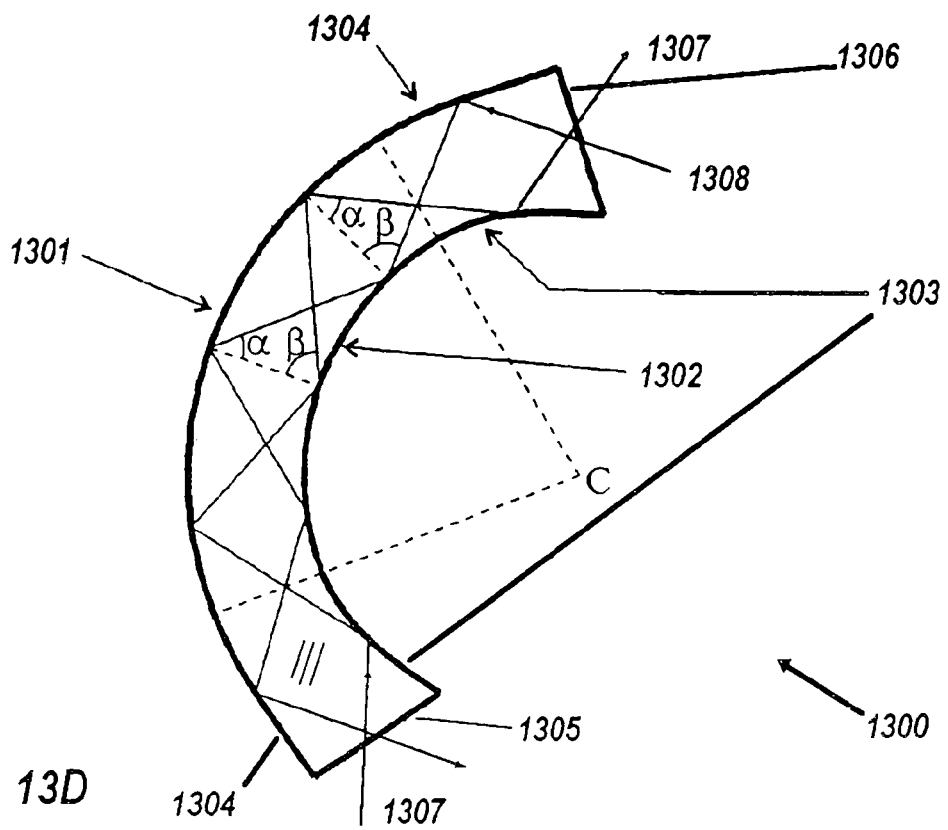
FIG. 13D is an alternative embodiment of an angle-rotator similar to that in FIG. 13C.

FIG. 13D is a cross-sectional view of an angle-rotator 1300 similar to that in FIG. 13C, comprising outer arc 1301 with center of curvature at point C and inner arc 1302 also centered on point C. Tailored curves 1303 terminate both ends of arc 1302, as do tailored curves 1304 for arc 1301. Curves 1303 and 1304 jointly define end ports 1305 and 1306. Their two-way nature is shown by oppositely directed rays 1307 and 1308, totally internally reflecting at outer incidence angle α and inner angle β, respectively against arcs 1301 and 1302. The end-ports are not shown refracting the rays since they are expected to be joined to other optical manifolds such as disclosed herein.

Figure 13E:
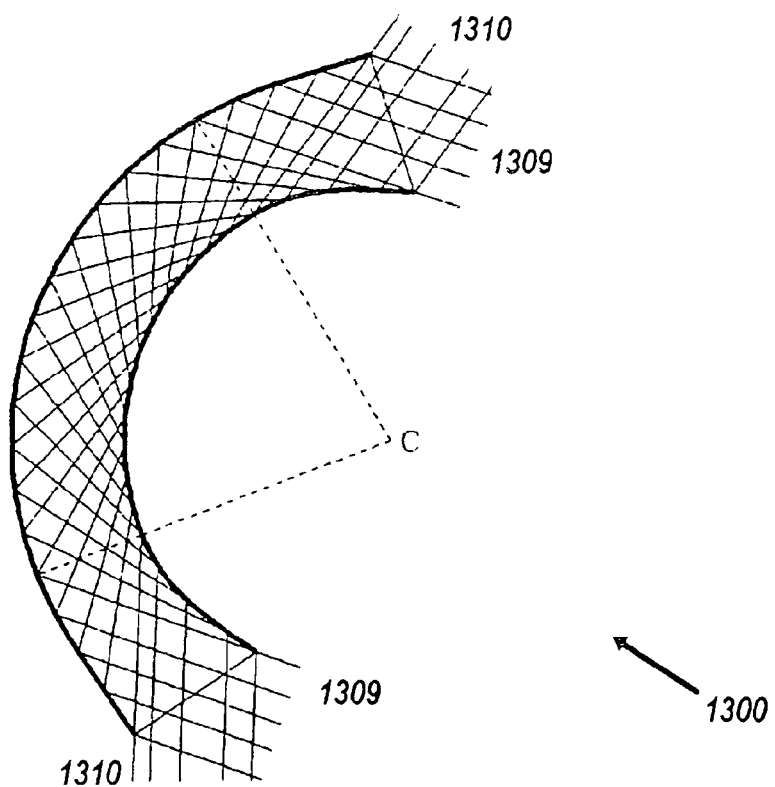
FIG. 13E is a ray tracing of an angle-rotator such as shown in FIG. 13D.

FIG. 13E also shows an angle-rotator 1300, but with complete sets 1309 and 1310 of parallel paths of edge-rays, which define the angular limits within which rotator 1300 will convey all luminosity through large arcs via total internal reflection.

Figure 14:
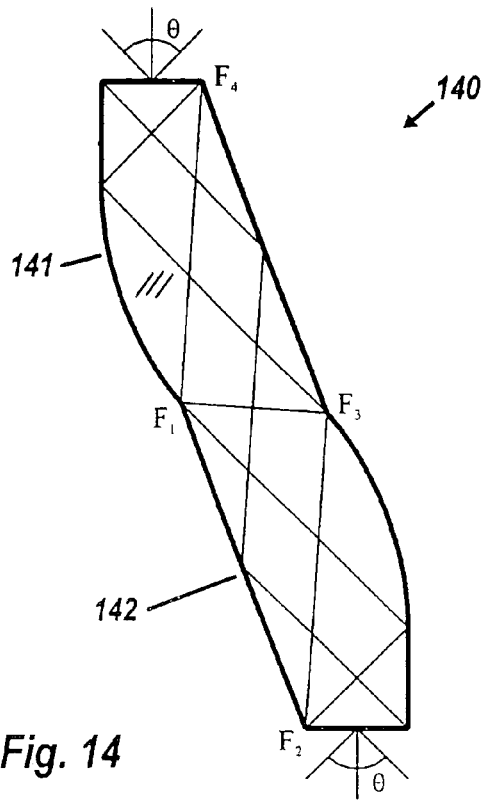
FIG. 14 is a cross-section of a source-shifter comprising two modified angle rotators.

FIG. 14 is a cross-section of an optical shifter 140, comprising first angle rotator 141 and oppositely oriented second angle rotator 142. To fit together, both rotators have been modified by removal of segments analogous to flat segment 135 of FIG. 13C. Thus segment $F_1$-$F_3$ is wider than the input light. The net effect of shifter 140 is a lateral shift of 1.5 widths of an input luminance distribution, which of course is confined to the critical angle of the transparent material composing it. The multiple internal reflections within shifter 140 tend to smooth out any luminance non-uniformities entering it.

Figure 15A:
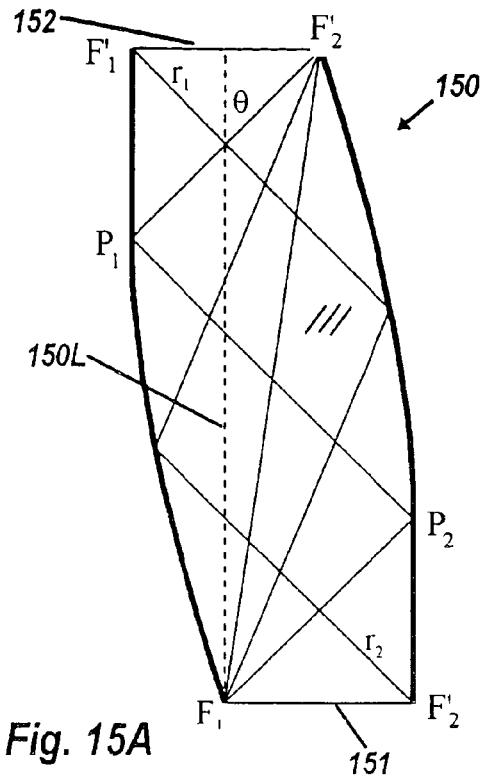
FIG. 15A is a cross-section of a half-width source shifter.

FIG. 15A is a cross-section of optical shifter 150, also for lateral luminance shifting with no angle rotation. First port 151 spans points $F_{11}$ and $F_{12}$. Second port 152 spans points $F_{21}$ and $F_{22}$ and is shifted a half width from port 151, as shown by dotted line 150L. When either port is a boundary with air, light entering it must be within the critical angle $\theta$ of the transparent material of 150. Straight-line segment $F_1'P_1$ is perpendicular to port 152, and straight-line segment $F_2'P_2$ is perpendicular to port 151. Parabola $F_{11}P_1$ has focus at $F_{22}$ and axis parallel to ray $r_1$. Parabola $F_{22}P_2$ has focus at $F_{11}$ and axis parallel to ray $r_2$. As a non-imaging optical device, element 150 tends to smear out, as previously discussed regarding FIG. 13C, non-uniformities of the luminance distributions entering it.

Figure 15B:
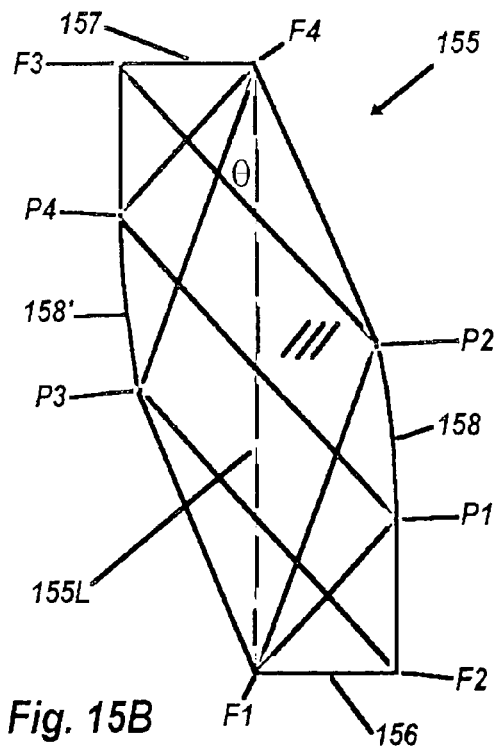
FIG. 15B is a cross-section of a full-width source shifter.

FIG. 15B is a cross-section of optical shifter 155, for lateral luminance shifting by its full width, as shown by line 155L. A first port 156 spans from point F1 to point F2. A second port 157 spans from point F3 to point F4. As previously, light is confined to the critical angle $\theta$ of the transparent material composing shifter 155. This is shown in the FIG. 15B as the acute angle formed between the line defined by the ray from points F3 to P2 and the axis 155L. Most of the perimeter of shifter 155 is straight lines, from point F4 to Point P2, from point F2 to point P1, from point F1 to point P3, and from point F3 to point P4. Parabolic segment 158 runs from point P1 to point P2, and has its focus at point F1 and its axis parallel to ray F2-P3. Parabolic segment 158' runs from point P3 to point P4, and has its focus at point F4 and its axis parallel to ray F3-P2.

FIGS. 15A and 15B show two variations along a continuum of possible values of lateral shift of luminance. Greater shifts merely require a longer shifter than 155 of FIG. 15B.

Figure 16:
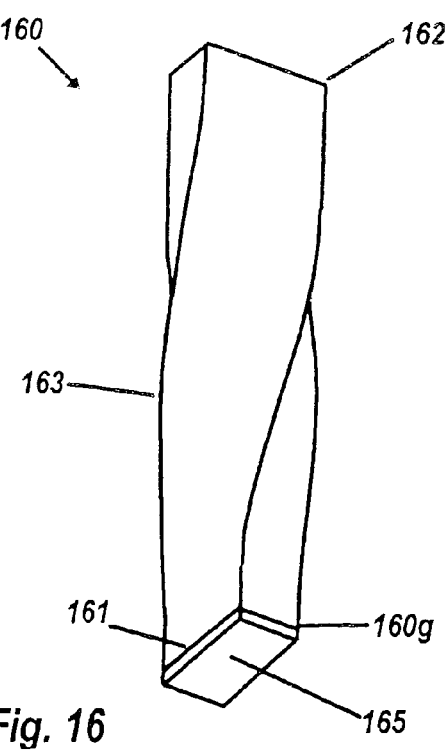
FIG. 16 is a cross-section of a source twister.

FIG. 16 is a perspective view of an optical twister 160 that has a first rectangular port 161 and a second port 162 oriented perpendicularly to it. A spiral curve 163 is one of four forming the corners of 160. Also shown is Lambertian LED 165 positioned across air gap 160g, so that light inside device 160 is confined to the critical angle of its material, with little loss being conveyed from face 161 to 162.

Figure 17:
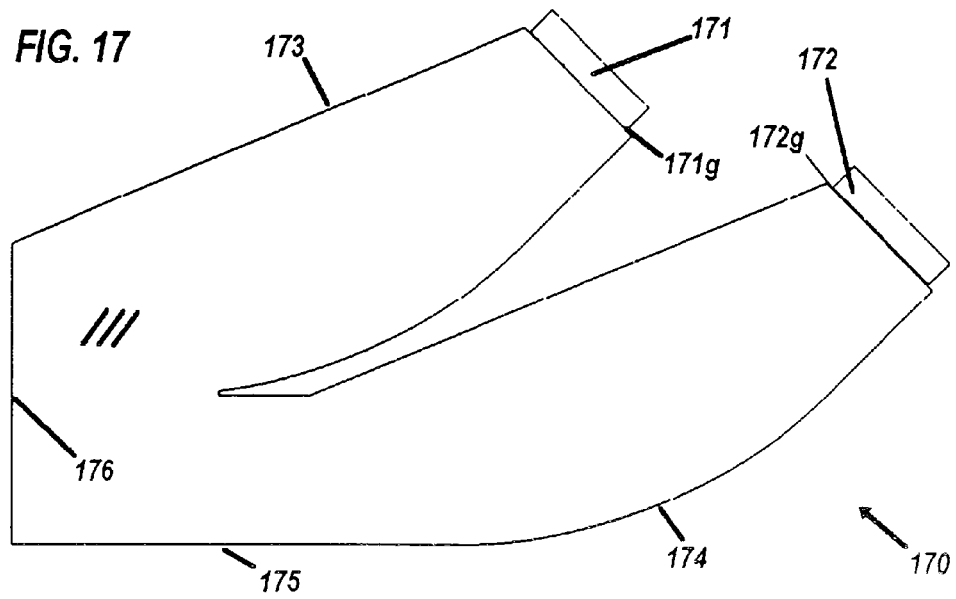
FIG. 17 is a cross-section of a 2:1 optical manifold.

FIG. 17 is a cross-sectional view of an optical manifold 170 that incorporates angle rotators. Particularly, FIG. 17 show how angle rotators can be combined to make an optical manifold 170. LEDs 171 and 172 shine their light across respective air gaps 171g and 172g, into respective angle rotators 173 and 174, the latter positioned in accordance with the length of straight section 175. The entire width of exit port 176 receives light from both LEDs.

Figure 18:
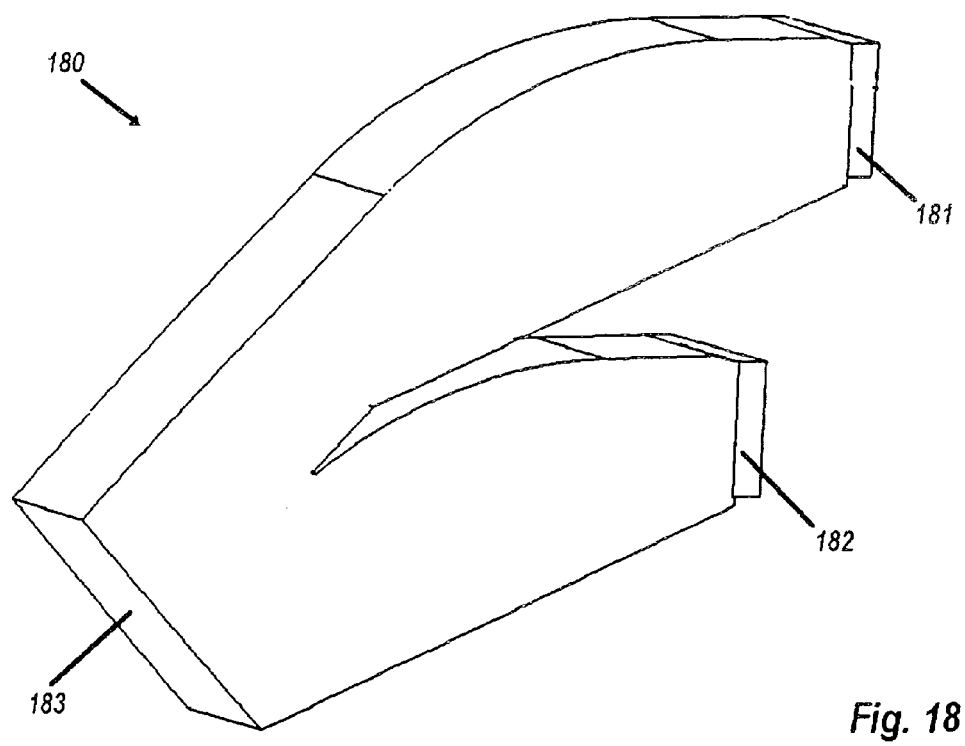
FIG. 18 is a perspective view of a rectangular 2:1 optical manifold with the profile similar to FIG. 17.

FIG. 18 is a perspective view of an embodiment of the optical manifold 170 incorporated into a three-dimensional design. Lambertian LEDs 181 and 182 shine into manifold 180 and their combined light issues from an exit port 183. The light from each LED is spread over substantially the entire width of 183. In FIG. 18 a two-dimensional profile is extruded into a three-dimensional solid using an orthogonal path direction. Alternatively, the extrusion can be tapered slightly with a one or two degree draft angle to facilitate removal of parts from an injection mold. In this approach the starting or ending profile will be smaller than the other, which is believed to result in only a small reduction in performance of the device.

Figure 19:
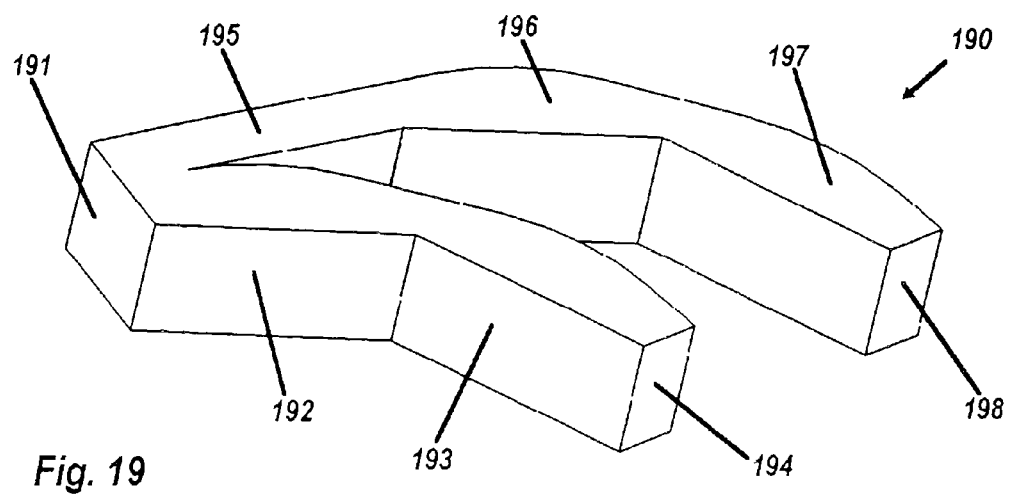
FIG. 19 is a perspective view of a square 1:2 optical manifold with the profile similar to FIG. 17.

FIG. 19 is a perspective view of an optical manifold 190 that has a square input port 191. Sequential angle rotators 192 and 193 feed rectangular output port 194. Straight rectangular section 195 feeds sequential angle rotators 196 and 197, thence rectangular output port 198. The length of section 195 is adapted to put ports 198 in the same plane as port 194.

Figures 20A, 20B:
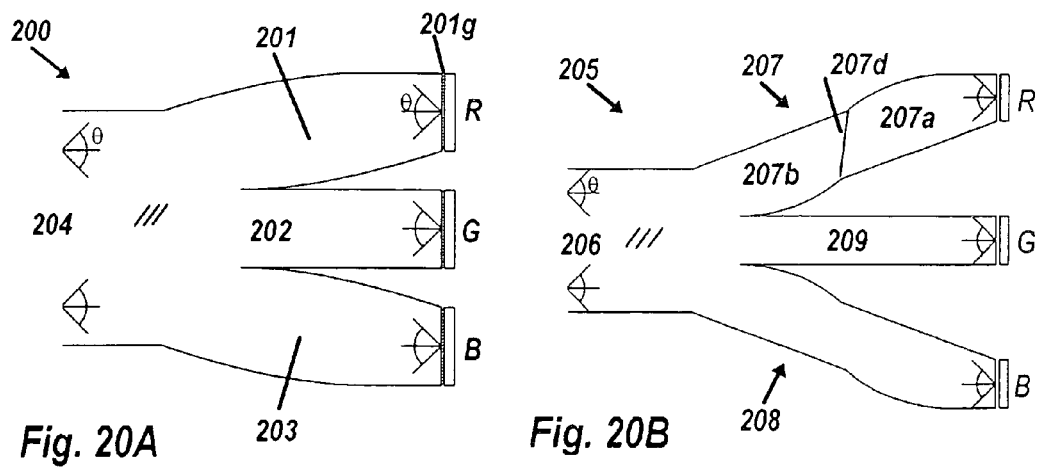
FIG. 20A is a cross-section of a 3:1 optical manifold with different input colors.
FIG. 20B is another embodiment of the 3:1 optical manifold of FIG. 20A, with more spacing between the LEDs.

FIG. 20A is a schematic view of an optical manifold 200, comprising a lateral shifter 201 receiving light from a red LED R, a mixing rod 202 receiving light from a green LED G, and a lateral shifter 203 receiving light from a blue LED B. A duct 204 receives their mixed light. Within manifold 200 all light is confined within a critical angle $\theta$, because as previously the LEDs shine across a small air gap, such as 201g shown.

FIG. 20B is a schematic view of an optical manifold 205, similar to manifold 200 (FIG. 20A) in having an input duct, 206, fed by three branches, 207-209. Manifold 205, however, is larger in order to reach more separated sources. Input branches 207 and 208 are each comprised of two oppositely oriented angle rotators. Upper branch 207 is shown as comprised of upward-curving first angle-rotator 207a and downward-curving subsequent angle-rotator 207b, with imaginary line 207d joining them. Upper branch 207 is for red LED R and lower branch 208 is for blue LED B, while a longer mixing rod, 209, is for green LED G.

Figure 21:
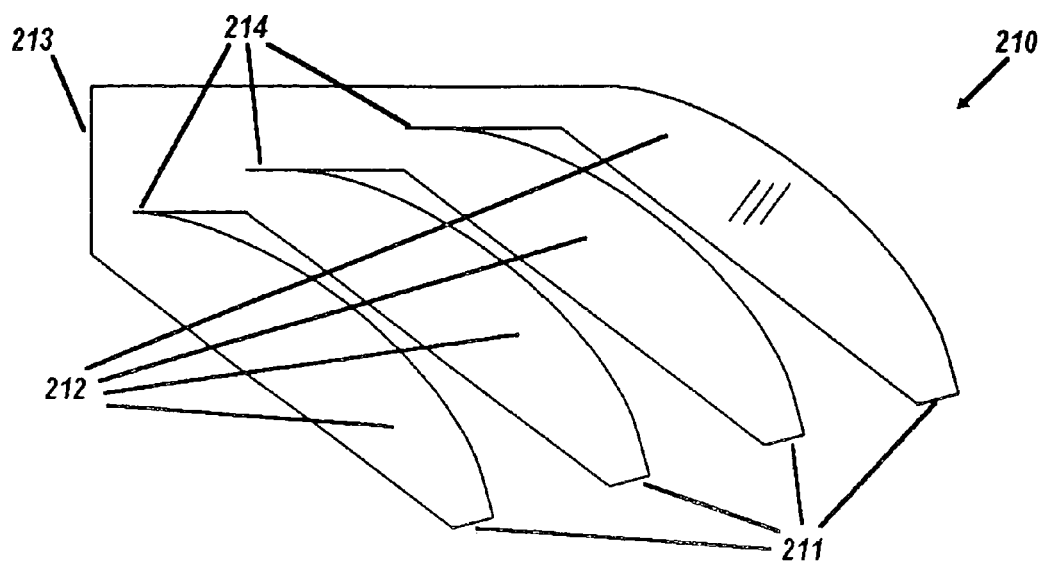
FIG. 21 is a cross-section of a 4:1 optical manifold with coplanar inputs having one angle-rotator each.

FIG. 21 is a cross-section of a 4:1 optical manifold 210, with coplanar input ports 211, angle rotators 212, and an output port 213 receiving over its entire span the light from each input port. Slit-like cracks 214, however, would in actual practice be slightly filleted, defined as the replacement of the tip of such a long crack with a wider rounded tip, perhaps a few thousandths of an inch wide.

Ray traces have shown that such practical departures from ideal form cause small losses of only a few percent, and only small deviations from uniformity across the exit face. Such design modifications are too small to be easily visible at the drawing scale of these Figures, and their performance costs are minor. In part this is due to the great integrative power of the optical transformer described herein, whereby large spatial variations of input light result in very small departures from output uniformity. For example, dark bonding pads on LEDs lead to only 5% departures from uniformity, far less than the unofficial 50% limit of commercial displays.

Figure 22:
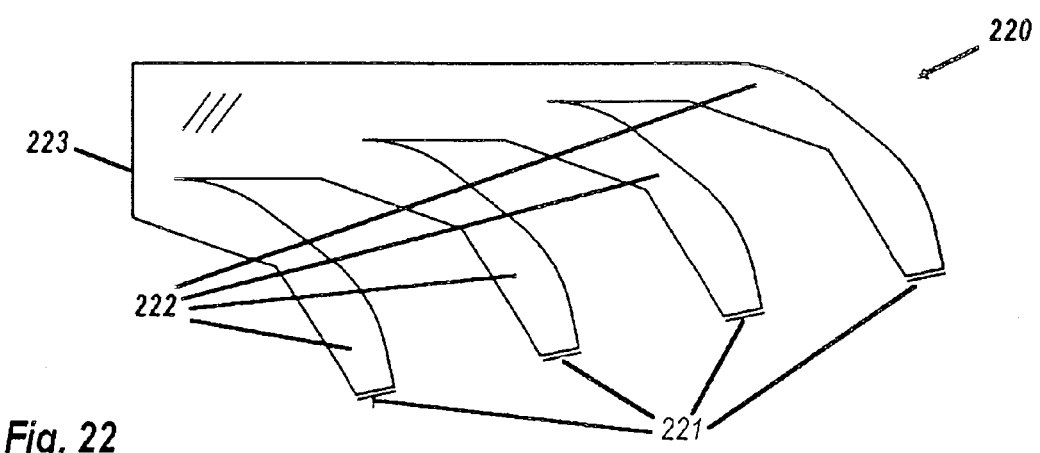
FIG. 22 is a cross-section of another 4:1 optical manifold, with coplanar inputs having two angle-rotators each.

FIG. 22 depicts a 4:1 optical manifold 220, with coplanar LEDs 221, dual angle-rotators 222, and an exit port 223. In FIG. 22, the coplanar LEDs 221 are spaced farther apart than those of FIG. 21.

The LEDs of FIGS. 21 and 22 inject their Lambertian light across air gaps, so that within the manifold the light is confined to the critical angle. FIG. 23 shows a 4:1 optical manifold 230, with coplanar LEDs 231 immersed in angle transformers 232, identical to that of FIG. 12. The light from them proceeds down angle rotators 233 to exit port 234. According to the principles taught herein, the distance between the input ports can be adjusted to any desired distance, while allowing the ports to reside on a common plane. This capability is particularly useful when designing a particular manifold combiner for plurality of LEDs that reside on a common circuit board, as the distance between the LEDs required for good thermal management can be easily accommodated.

FIG. 24 depicts arcuate 4:1 optical manifold 240, with input ports 241, angle rotators 242, and exit port 243. Outer walls 244, 245, and 246 and inner wall 247 are circular arcs concentric on point C. Radius R must be sufficiently large to prevent leakage out these arcuate walls. As is possible in virtually all the embodiments of this invention, the sharp creases of this device can be modified by either chamfering or filleting the creases, or a combination of both, without having any appreciable effect on the transfer efficiency or output uniformity.

FIG. 25 is a schematic view of an arcuate 4:1 optical manifold 250, comprising four input ports 251, each with small angle rotator 252, and a common output port 253. A small angle rotator 254, a medium size angle-rotator 255, and a large angle-rotator 256 enable the manifold 250 to have a radius of curvature varying from a small radius 257 through medium radius 258 to a large radius of curvature 259. These radii, and the inter-branch spacings, are controlled by the rotation angles and relative sizes of the various angle rotators comprising the particular manifold.

Figure 26A:
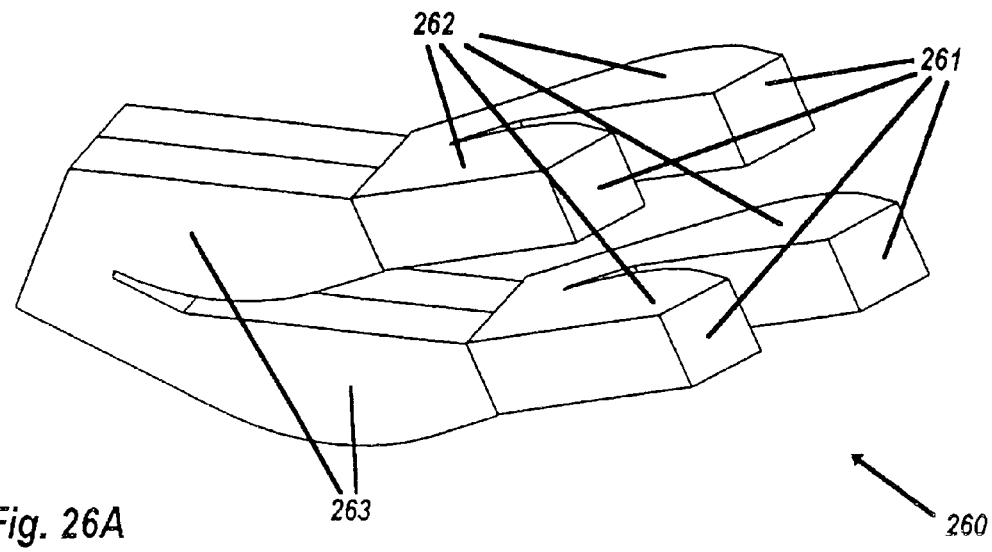
FIG. 26A is a perspective view of a 2×2:1 optical manifold with intermediate angle-rotators.

FIG. 26A is a perspective view of a 2×2:1 optical manifold 260 with non-coplanar square input ports 261, each with small angle rotator 262. Each pair of rotators 262 feeds a rectangular distribution to large angle-rotators 263. In FIG. 26A, each of the four ports 261 has been placed in arbitrarily different planes, but could as easily be in the same plane.

Figure 26B:
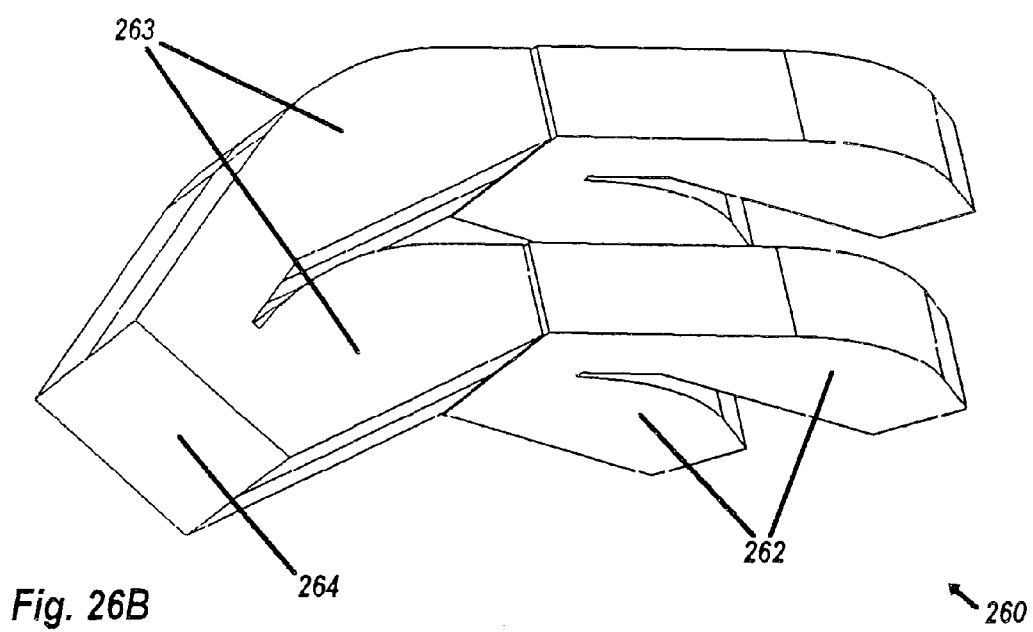
FIG. 26B is a perspective view of the 2×2:1 optical manifold with intermediate angle-rotators shown in FIG. 26A.

FIG. 26B is a perspective view of the 2×2:1 optical manifold 260 of FIG. 26A, also showing a square exit port 264 fed by the rectangular angle-rotators 263, which in turn are fed by the angle-rotators 262 acting in the plane orthogonal to that of the rotators 263.

Figure 26C:
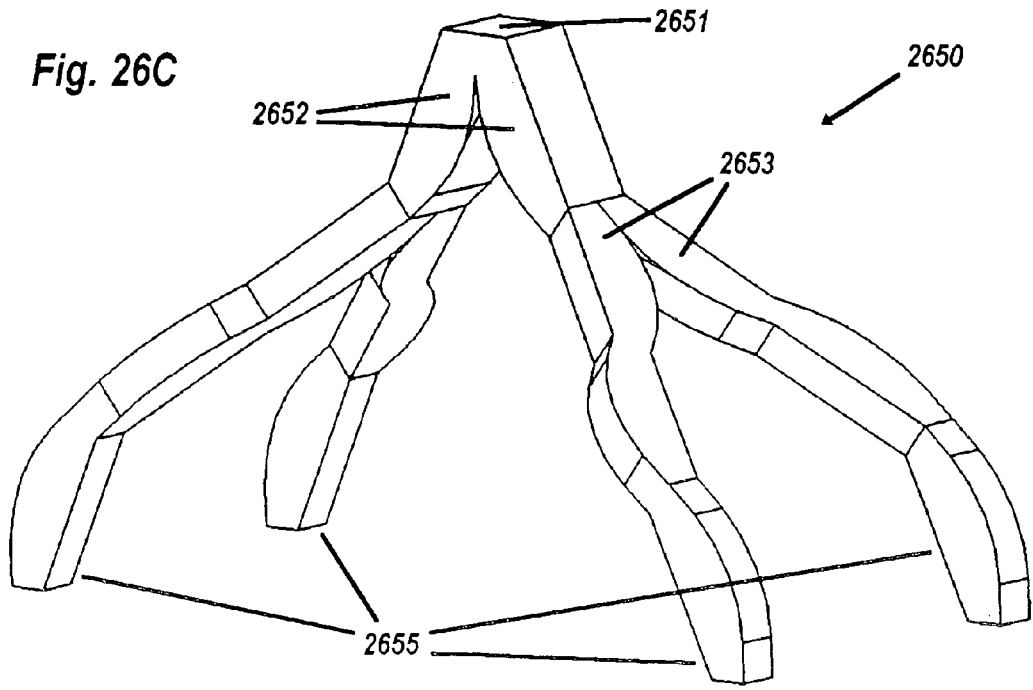
FIG. 26C is a view of a more openly branched 2×2:1 manifold.

FIG. 26C is a perspective view of a 4:1 manifold 2650, including an output port 2651 fed by two angle rotators 2652, each fed by a pair of angle rotators 2653 in the orthogonal plane. Each of these four rotators leads through two more rotators to form one of four legs 2655.

Figure 26D:
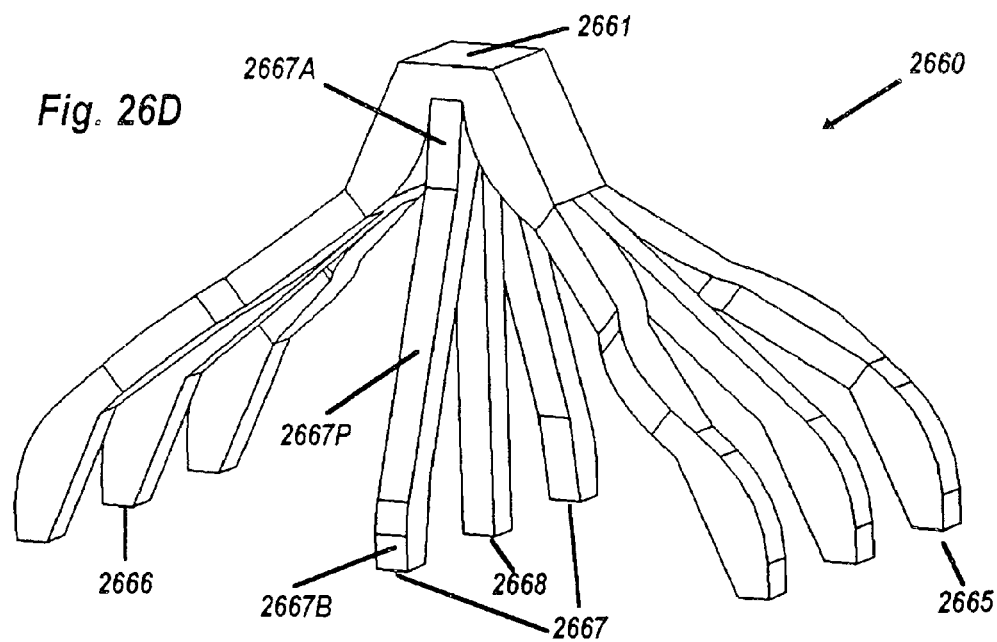
FIG. 26D is a view of a 3×3:1 manifold.

FIG. 26D is a perspective view of a 9:1 manifold 2660 with the same corner legs 2665 as 2655 of FIG. 26C, but having a larger output port 2661. Between the corner legs 2665 are central legs 2666 and side legs 2667, which comprise an upper angle rotator 2667A and a lower angle rotator 2667B, connected by light pipe 2667P. A central light pipe 2668 is at the very middle of this 3×3 array of optical ducts.

Figure 27A:
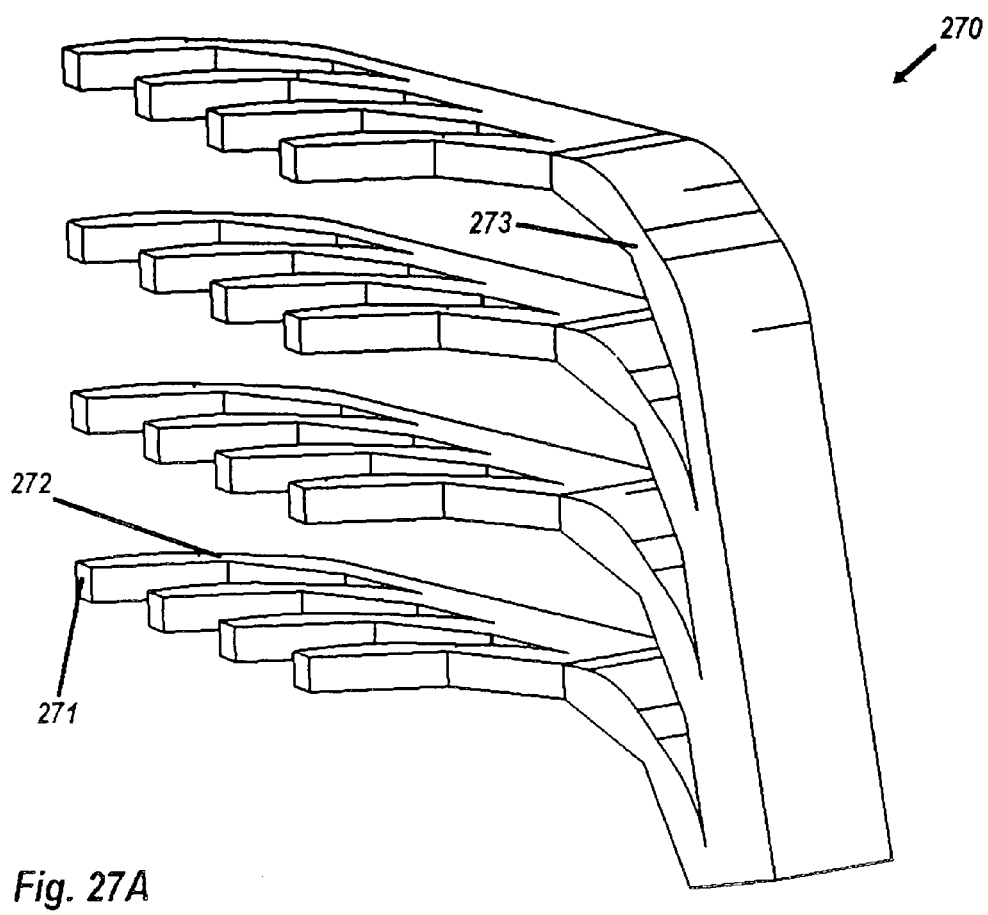
FIG. 27A is a perspective view of a 4×4:1 branched optical manifold.

FIG. 27A is a perspective view of a more elaborate 4×4:1 optical manifold 270 that has sixteen coplanar input ports 271, each with a dual angle rotator 272. Each column of four dual angle-rotators feeds a large dual angle-rotator 273.

Figure 27B:
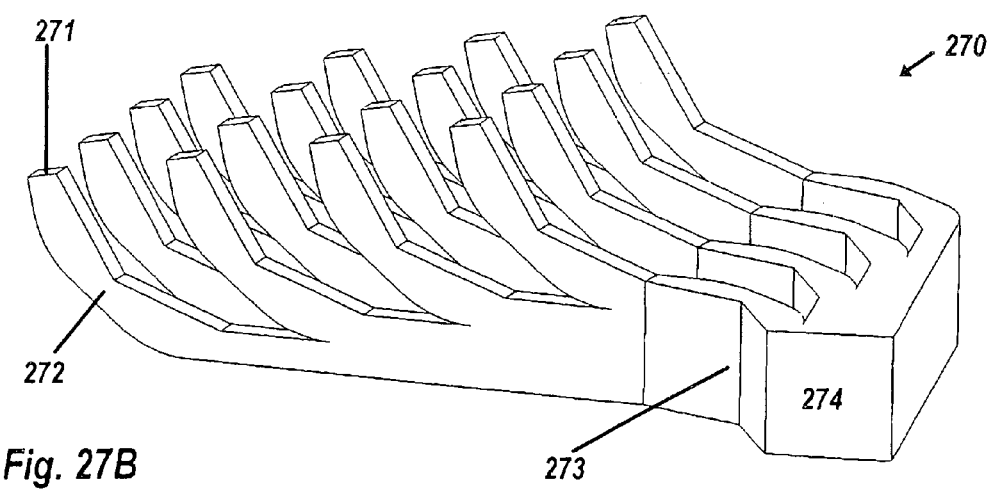
FIG. 27B is another perspective view of the 4×4:1 branched optical manifold shown in FIG. 27A, viewed from another angle.

FIG. 27B is a perspective view of the 4×4:1 optical manifold 270 of FIG. 27A from another view, showing a square output port 274.

Figure 28A:
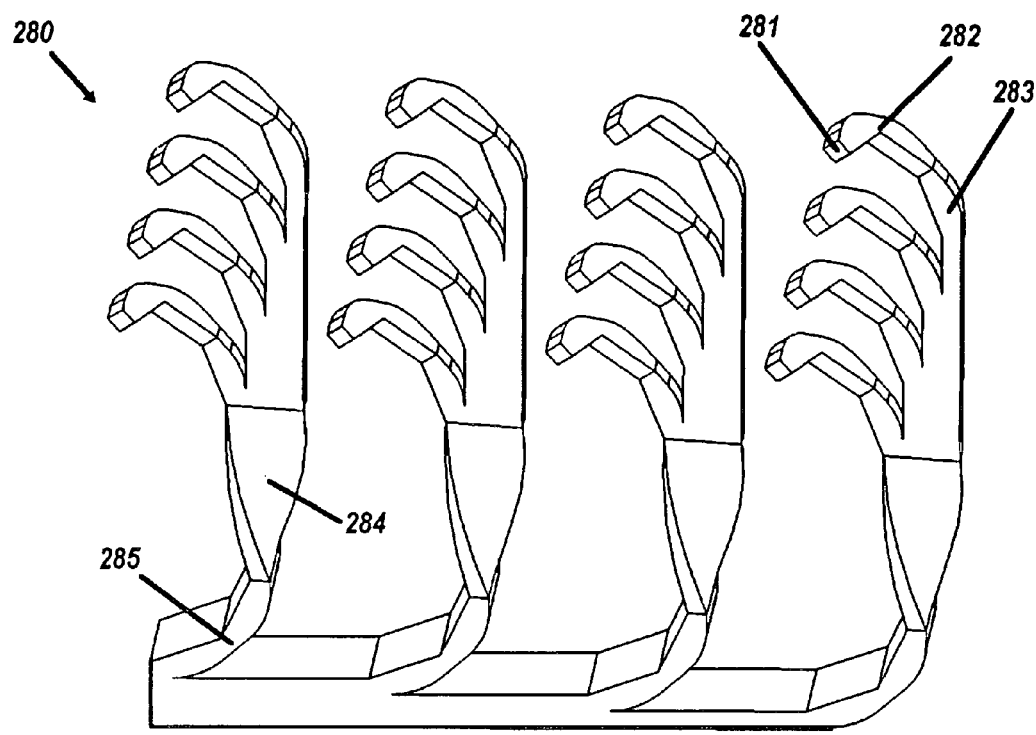
FIG. 28A is a perspective view of a 4×4:1 twisted-branch optical manifold.

FIG. 28A is a perspective view of a 4×4:1 optical manifold 280, comprising sixteen coplanar input ports 281, each having a dual angle-rotator 282 feeding 90°-turned second angle rotator 283. Columns of four of these dual angle rotators feed into four twisters 284, followed by large angle rotators 285.

Figure 28B:
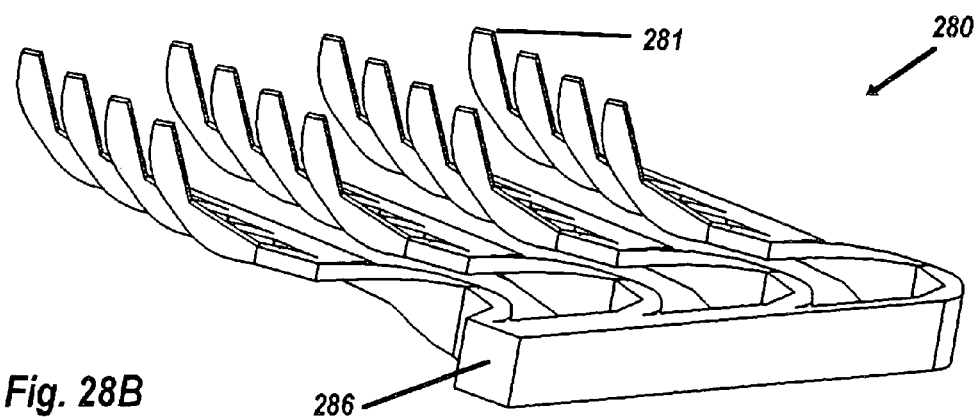
FIG. 28B is another perspective view of the 4×4:1 twisted-branch optical manifold shown in FIG. 28B, viewed from another angle.

FIG. 28B is a perspective view of a manifold 280 as in FIG. 28A viewed from another angle, showing a square exit port 286.

Figure 29:
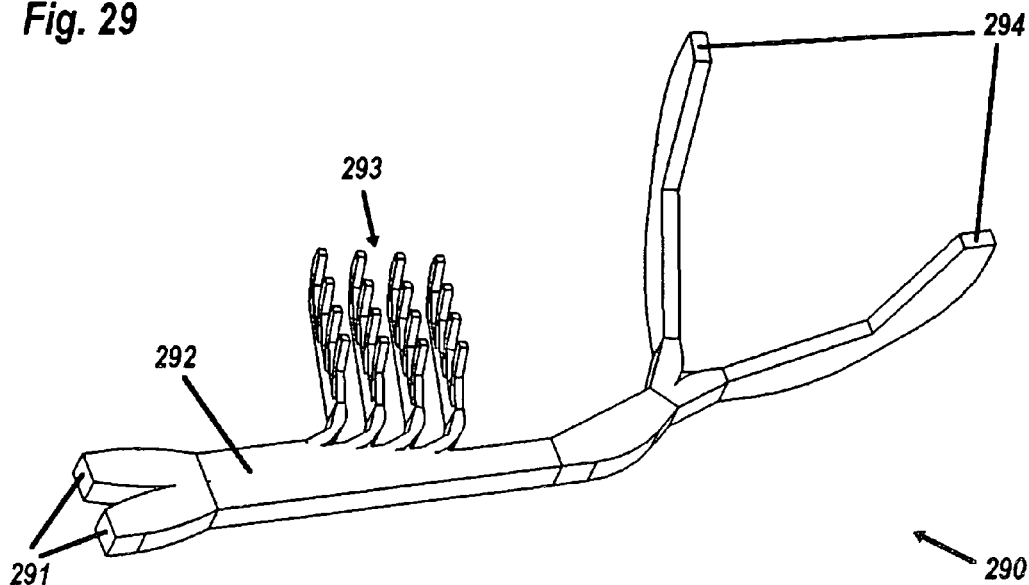
FIG. 29 is a perspective view of an alternative embodiment of an arbitrarily branched optical manifold.

To illustrate the versatility of the optical manifolds described herein, FIG. 29 is a perspective view of an optical manifold 290, similar to what might be utilized to illuminate the instruments of an automotive dashboard. For reliability, dual input LEDS 291 feed into the manifold 290, with the possibility of one operating as primary illuminator and the second as backup or daytime illuminator. Alternatively, the two LEDs could have different colors to signal different overall conditions. The input light splits in mixing rod 292, about half going to a 4×4 output array 293, and the other half proceeding to split and feed rectangular output ports 294.

Another advantage of the optical manifolds described herein are their ability to alter not only the limiting angle of light entering it, but also the spatial shape of the luminance entering it, particularly from square to rectangular. The luminance shifters of FIGS. 15A and 15B can be utilized for this purpose, enabling elongated luminance distributions to be produced.

Figure 30:
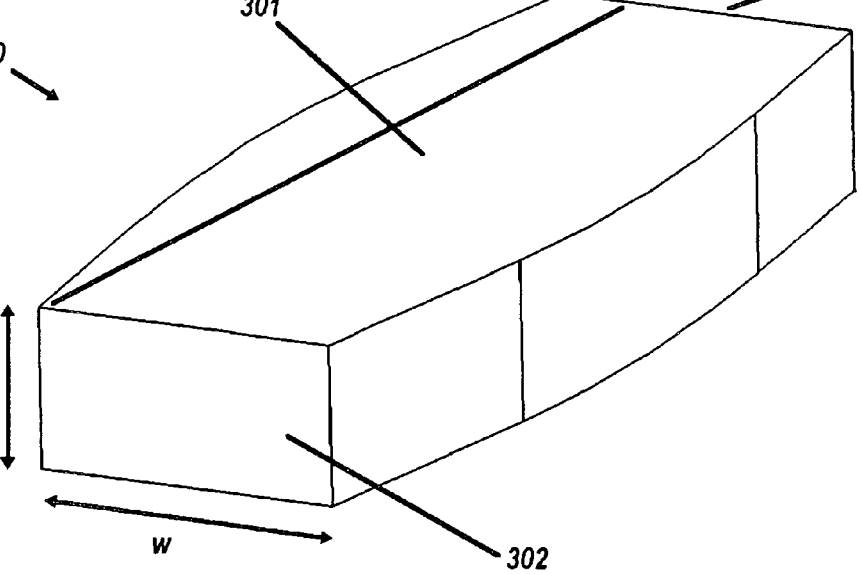
FIG. 30 is a perspective view of a luminance shifter.

FIG. 30 is a perspective view of a luminance shifter 300, formed from profile 301 of width w (at port 302), by an orthogonal sweep by w/2, so that first port 302 is a 2:1 rectangle. A second port 303 is shifted by w/4, rather than the w/2 shown in FIG. 15A.

FIG. 31A is an exploded, perspective view of another embodiment. An upper quarter-width shifter 300U is contiguous across line 300Ud with orthogonal shifter 305U, of width w/2, with lateral shift of w/4 and downward shift of w/2. A nearly identical but inverted lower shifter 300L is contiguous with shifter 305L, to provide an upward shift w/2.

FIG. 31B is a perspective view of the monolithic etendue-squeezer 310 shown in exploded view in FIG. 31A. In FIG. 31B, a square input face 311 is split into a top duct 311U and a lower duct 311L, also diverging to form a 4:1 rectangular output face (not shown). As previously, this device operates on light within the critical angle of its transparent material.

FIG. 31C is another perspective view of the etendue-squeezer 310 shown in FIG. 31B, showing a 4:1 rectangular output face 312, and also showing its width 2w and height w/2.

Figure 32:
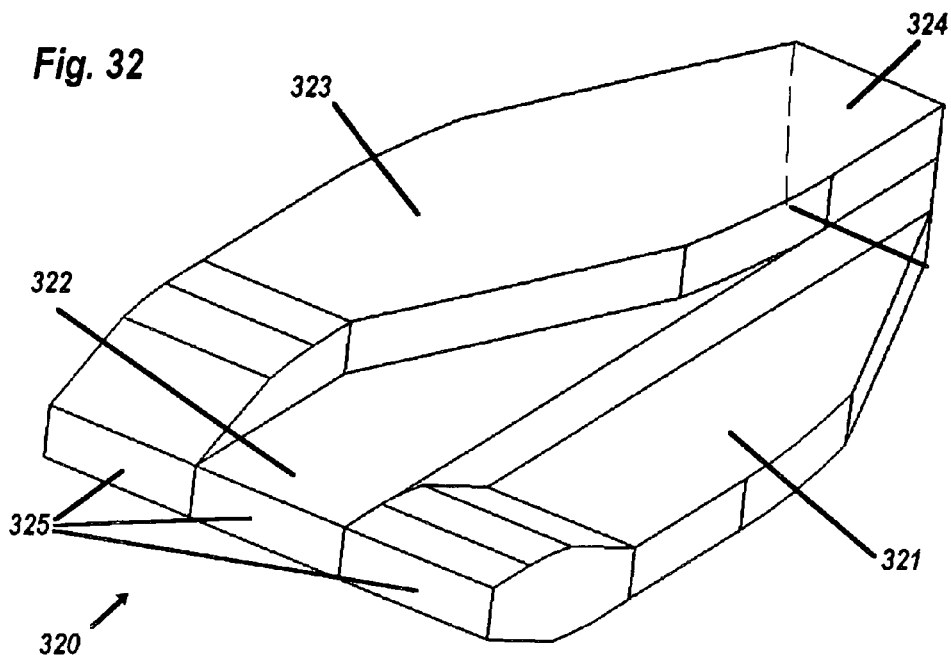
FIG. 32 is a perspective view of a monolithic 9:1 etendue-squeezer.

FIG. 32 is a perspective view of a monolithic 9:1 etendue-squeezer 320, comprising: an upper-to-left light-duct 321, a central rectangular duct 322, and a lower-to-right light-duct 323. These light-ducts divide square-face port 324 into three parts, each having a 3:1 ratio, which are displaced and rejoined as 9:1 elongated rectangular duct 325. The shape of rectangle 325 can be useful both as a fan-out for nine small light-ducts or as a synthetic light source for luminaires, particularly when phosphor-coated.

A practical issue with many embodiments of the optical manifold described herein is where to put attachment points for mounting a manifold in its proper position. When a surface is optically active, placing a mounting fixture thereupon will result in optical losses through diversion of light from its intended destination. Accordingly, it will be necessary to arrange for some optically inactive surfaces to be part of a manifold.

Figure 33A:
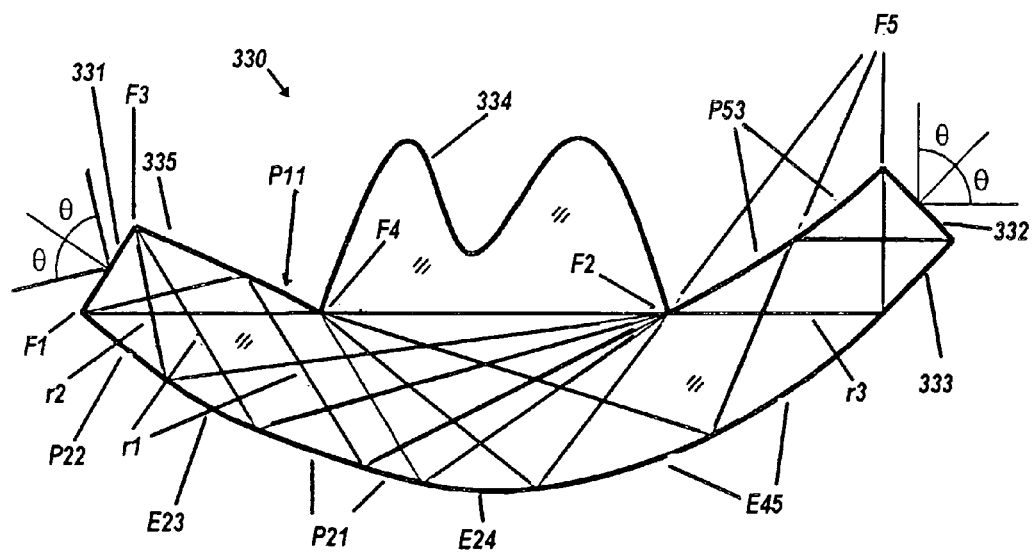
FIG. 33A is a cross-section of a luminance transfer duct with an optically inactive surface.

FIG. 33A is a cross-sectional view of a light duct 330 having an input port 331 and an output port 332, with limiting incidence angle θ upon both. The bottom side of duct 330 comprises flat mirror 333 perpendicular to face 332, elliptical arc E45 with foci at points $F_4$ and $F_5$, elliptical arc E24 with foci at points $F_2$ and $F_4$, parabolic arc P21 with focus at point $F_2$ and axis parallel to line $r_1$, elliptical arc E23 with foci at points $F_2$ and $F_3$, and parabolic arc P22 with focus at point $F_2$ with axis parallel to line $r_2$. The upper surface of duct 330 comprises parabolic arc P53 with focus at point $F_5$ and axis parallel to line $r_3$, inactive surface 334, parabolic arc P11 with focus at point $F_1$ and axis parallel to line $r_1$, and flat mirror 335. It can be seen that no light touches surface 334, in that the line joining points $F_2$ and $F_4$ represents an extreme ray.

Figure 33B:
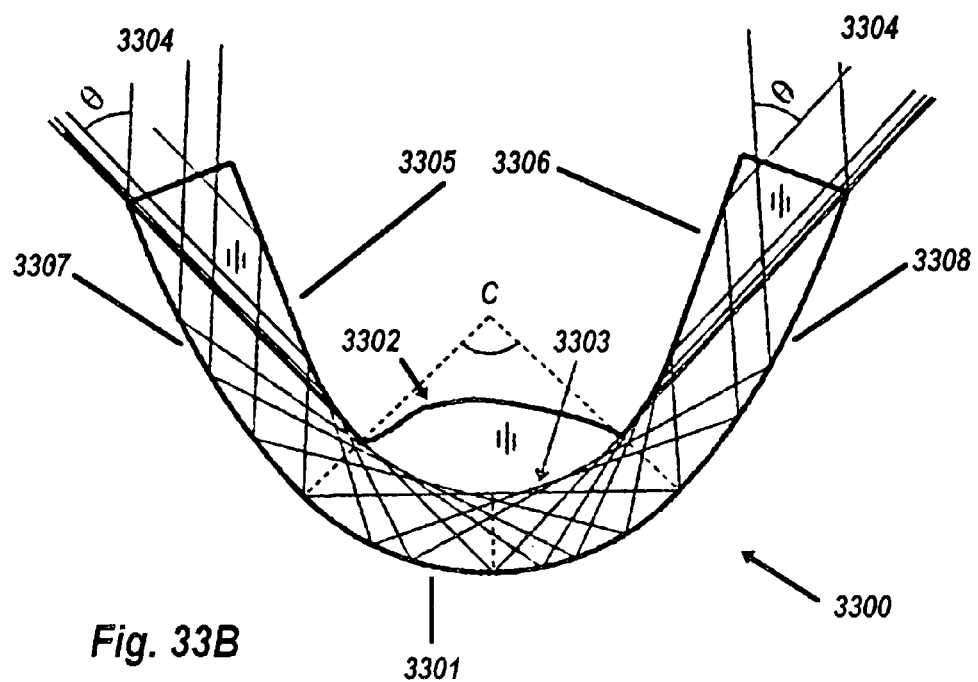
FIG. 33B is a cross-section of an angle-rotating luminance duct similar to the embodiment of FIG. 33A.

FIG. 33B is a cross-sectional view of an angle-rotating luminance duct 3300, resembling that of FIG. 13D, with a full 90° circular-arc outer profile 3301, but without a corresponding inner circular arc. Instead, inactive optical profile 3302 lies inside arcuate caustic 3303 formed by raypaths 3304, propagating within 3300 with directions spanning total angle θ. End-sections 3305 through 3308 are shaped to cause the formation of caustic 3303, dispensing with any active inner wall.

Figure 34:
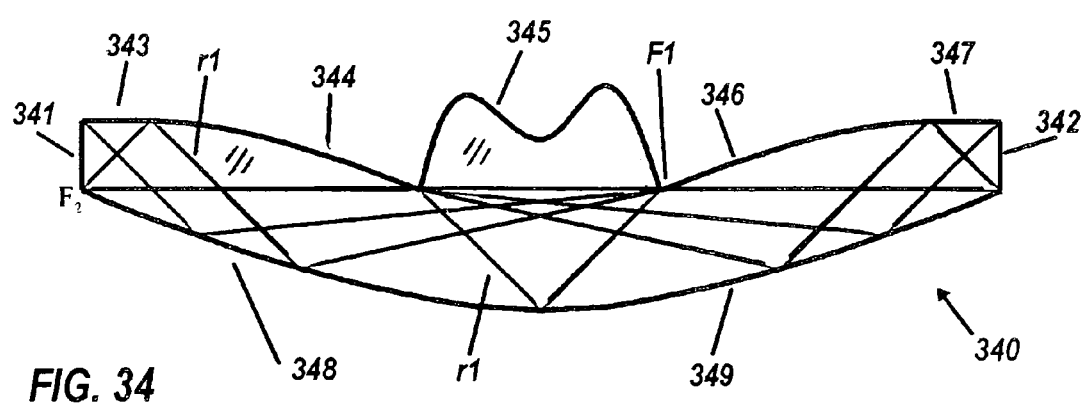
FIG. 34 is a cross-section of an angle-rotating luminance duct that has symmetrically placed ports.

FIG. 34 is a cross-sectional view of a light duct 340, which has symmetrically placed ports 341 and 342. Its upper surface comprises on the left flat mirror segment 343 and parabolic arc 344 having focus at $F_2$ and axis parallel to line $r_1$. At upper center is optically inactive surface 345. On the upper right are corresponding parabolic arc 346 and flat mirror 347. The lower surface comprises parabolic arc 348 with focus at F1 and axis parallel to line $r_1$, and its mirror image arc 349.

Figure 35:
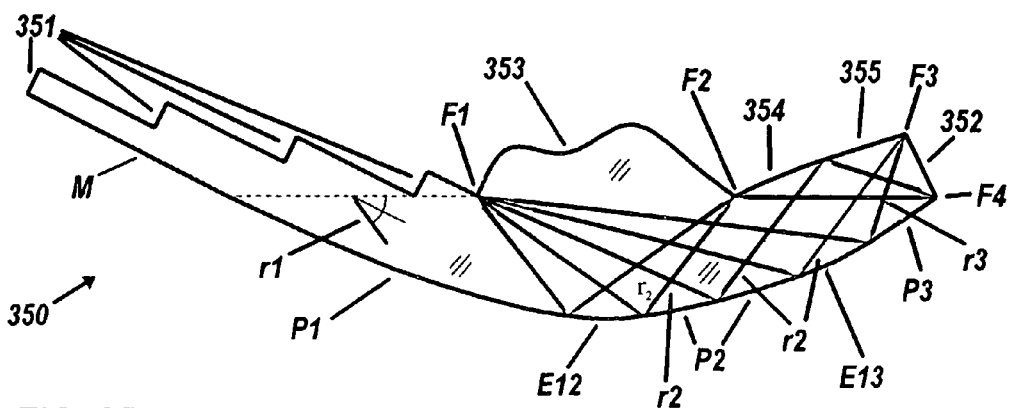
FIG. 35 is a cross-section of a 4:1 duct with an inactive surface.

FIG. 35 is a cross-sectional view of a light duct 350 that has plurality of input ports 351 and an exit port 352. A central optically inactive surface 353 is flanked by a parabolic segment 354 that defines a focus at $F_4$ with an axis parallel to line $r_2$, and by flat mirror 355. The bottom surface of light duct 350 comprises a flat mirror M, a parabolic arc P1 with focus at $F_2$ and an axis parallel to line $r_1$; an elliptical arc E12 with foci $F_1$ and $F_2$, a parabolic arc P2 with focus at $F_1$ and an axis parallel to line $r_2$, an elliptical arc E13 with foci at $F_1$ and $F_3$, and a parabolic arc P3 with focus at $F_1$ and an axis parallel to line $r_3$.

Figure 36:
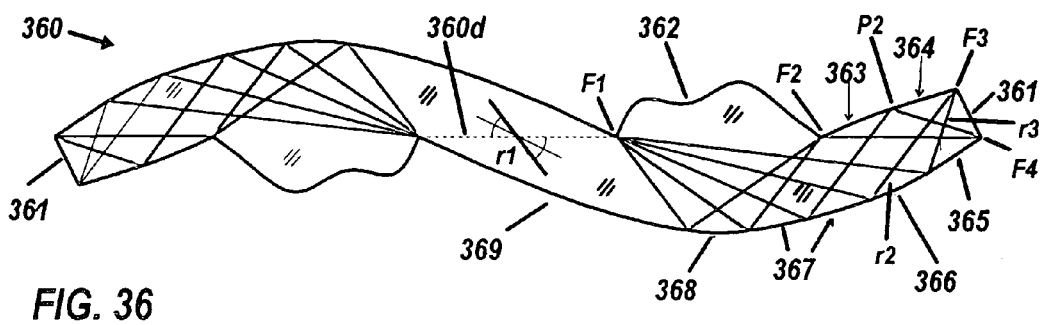
FIG. 36 is a cross-sectional view of a bilaterally symmetrical duct with two inactive surfaces.

FIG. 36 is a cross-sectional view of a luminance duct 360, having a configuration that is bilaterally symmetrical about dotted line 360d, and having ports 361. Also shown are an optically inactive surface 362, a parabolic arc 363 with focus at $F_4$ and axis parallel to line $r_2$, a flat mirror 364, a parabolic arc 365 with focus at $F_1$ and an axis parallel to line $r_3$, an elliptical arc 366 with foci at $F_1$ and $F_3$, a parabolic arc 367 with focus at $F_1$ and an axis parallel to line $r_2$, an elliptical arc 368 with foci at $F_1$ and $F_2$, and a parabolic arc 369 with focus at $F_2$ and an axis parallel to line $r_1$.

Figure 37A:
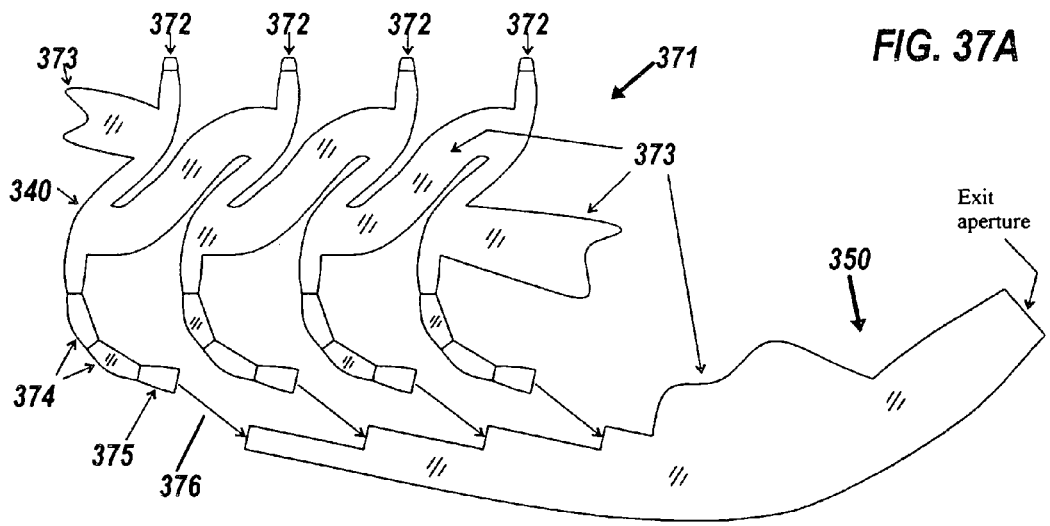
FIG. 37A is a cross-sectional view of a composite system comprising four joined ducts with the configuration of FIG. 35.

FIG. 37A is a cross-sectional view of an extended optical manifold comprising system 350 of FIG. 35, and a four-part manifold 371 fed by four LEDs 372. The optical manifold 371 comprises four sections 340 of FIG. 34, as well as angle rotators 374 and angle transformer 375, which are shown joining to duct 350 by arrows 376. Optically inactive surfaces 373 are available for mounting as well as for the location of injection gates and ejector pins in injection molding.

Figure 37B:
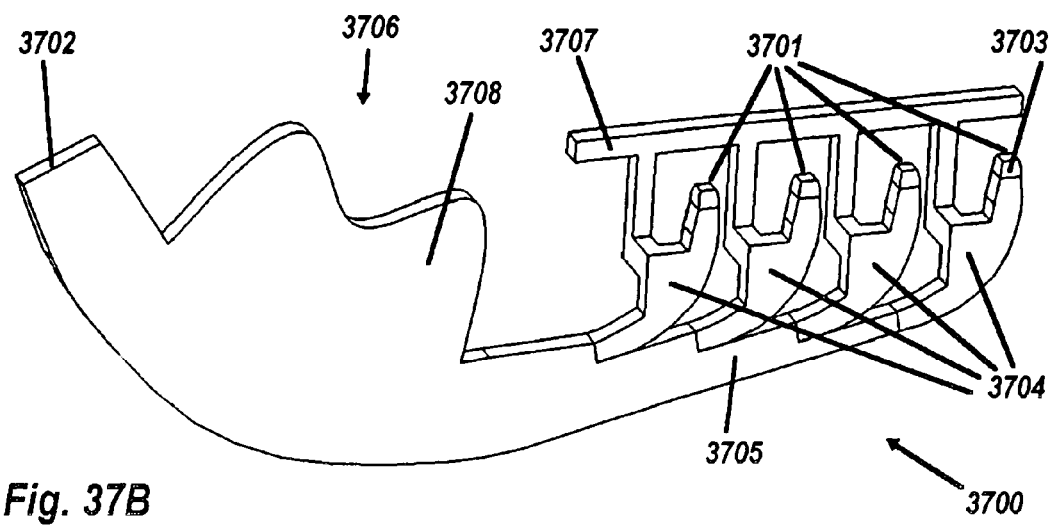
FIG. 37B is a cross-sectional view of another embodiment of an optical manifold in a further composite system.

FIG. 37B is a perspective view of another embodiment of an optical manifold. The optical manifold 3700 in FIG. 37B combines elements of previous Figures. In FIG. 37B, an optical manifold 3700 comprises four input ports 3701 (each with CPC 3703) and a single output 3702 having only their combined etendue, so that all light entering the input ports will be conveyed out the exit port. Each input port 3701 feeds one of the angle-rotators 3704, identical in profile to the embodiment of FIG. 33A. The rotators feed combiner 3705, identical to that of FIG. 37, which it turn connects with large rotator 3706. A structural beam 3707 connects with the optically inactive flanges of rotators 3704, providing secure mounting in a different plane than that of flange 3708.

Figure 37C:
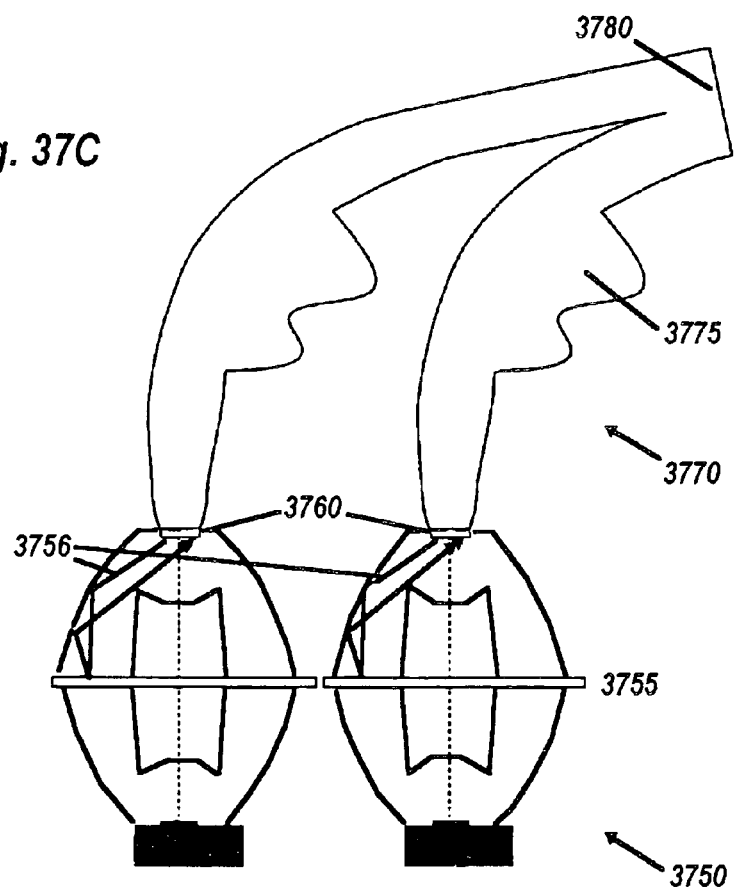
FIG. 37C is a cross-sectional view of another embodiment of an optical manifold in a composite system, also including a phosphor-coated surface.

FIG. 37C is a cross-sectional view of yet a further combination, showing two individual dual-lens LEDs with remote phosphors 3750, identical to that of FIG. 7E, including blue-pass dichroic filters 3755, seen to be recycling rays 3756 of phosphor back emission. Each phosphor feeds angle rotator 3770, their luminosity combined at output port 3780. Brackets 3775 provide sturdy support so that phosphors 3760 receive no structural loads.

FIG. 38A is a cross-sectional view of a dielectric CPC with source S1, emitting edge rays 383 illuminating dielectric CPC 382 with receiver R1. Nonuniformities across S1 will be smoothed out to give a uniform distribution at R1. The curved front faces enable this embodiment to be shorter than flat-faced CPCs.

FIG. 38A is a cross-sectional view of a dielectric CPC in alternative configuration. Because free-space propagation of edge-rays can be intolerant to position errors, FIG. 38B shows an alternate configuration that ensures light delivery. Flat-faced dielectric CPC 385 with source S2 illuminates dielectric block 387, which in turn illuminates CPC 386 with receiver R2. Air gap 388 is optional, dependent upon the particular choice of CPC length. Anti-reflective coatings can be applied to the faces of block 387 proximate to the air-gap to minimize the losses due to Fresnel reflections.

Figure 39B:
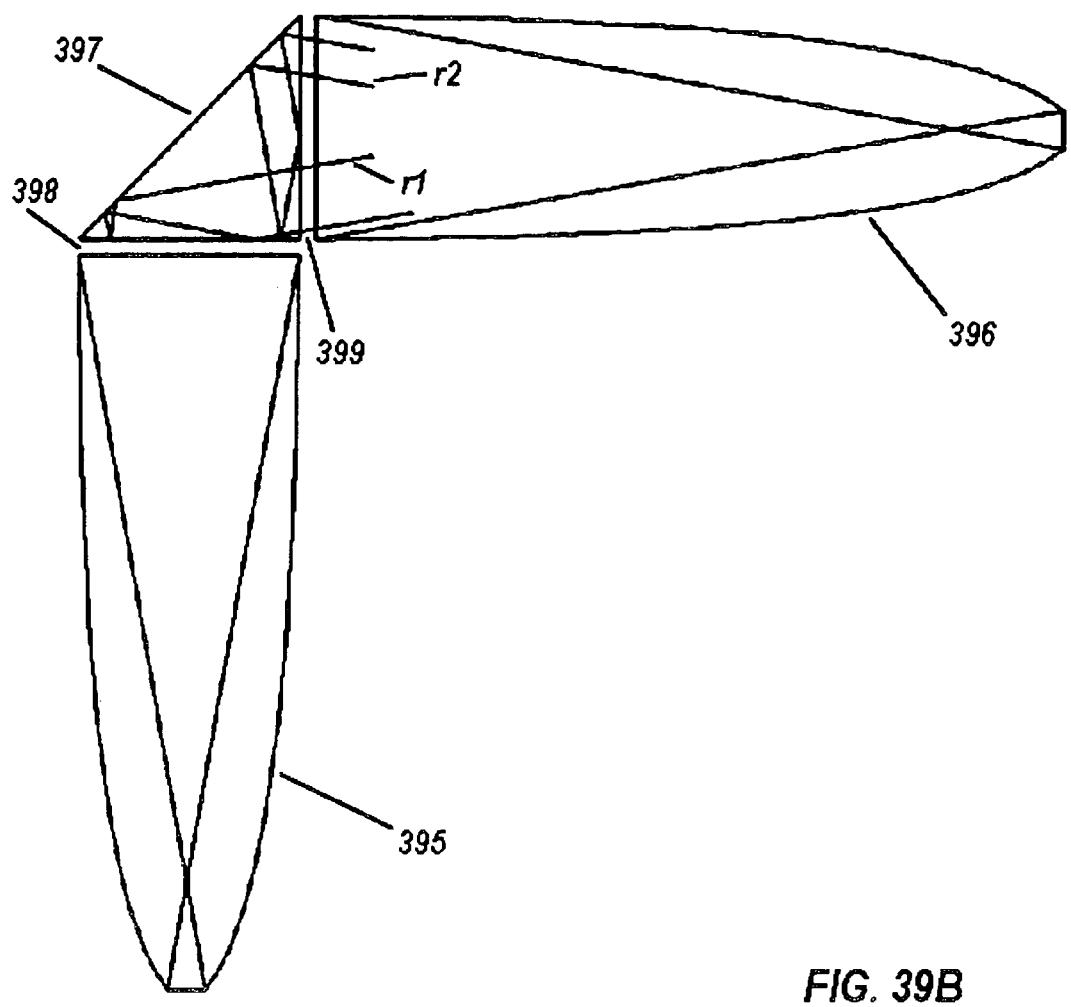
FIG. 39B is a cross-sectional view of an alternative optical manifold that includes two dielectric CPCs as in FIG. 39A, illustrating how an air gap prevents rays from escaping.

FIGS. 39A and 39B are cross-sectional views of an alternative arrangement that includes dielectric CPCs. When a 90° turn is desired, the configuration of FIG. 39A shows why such a prism coupler may be necessary or useful. Dielectric CPCs 391 and 392 have orthogonal orientations, joining at diagonal 393. Escaping rays r1 and r2 are exemplary of the optical losses incurred in this configuration. FIG. 39B shows separate dielectric CPCs 395 and 396, coupled by diagonal prism 397 situated with air gaps 398 and 399. Ray r1 has been internally reflected by gap 398 and thus remains within CPC 396. Similarly, ray 42 has been internally reflected by gap 399, onto the diagonal of 397 to be reflected therefrom into CPC 396.

Figure 40:
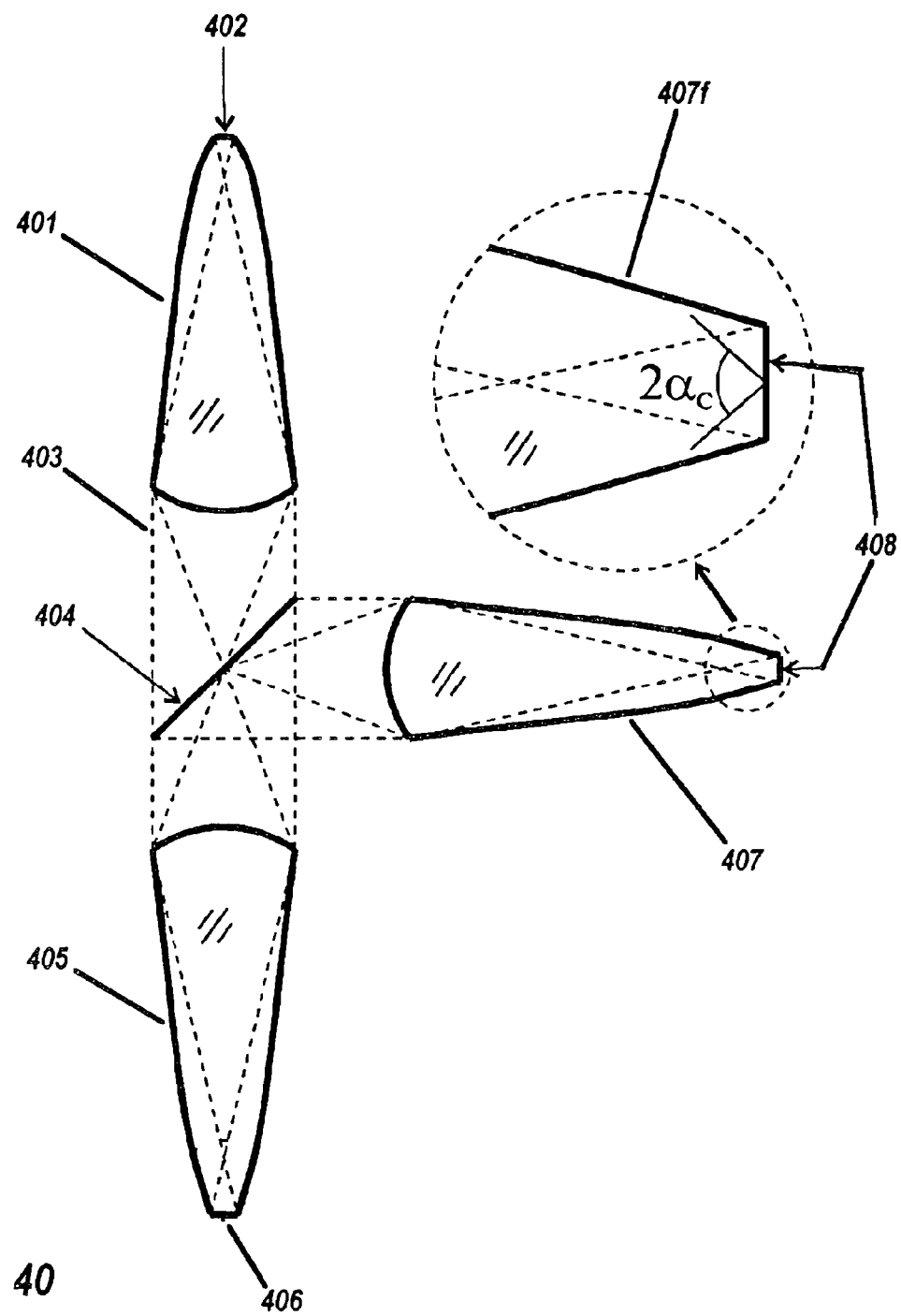
FIG. 40 is a cross-sectional view of an alternate configuration for utilizing phosphor back-emission.

FIG. 40 is a cross-sectional view of an alternative configuration of an optical manifold. The method shown and discussed with reference to FIG. 10D of recycling phosphor back-emission utilizes a blue-pass filter that returns this back-emission to the phosphor. This method utilizes low absorption in the phosphor. The configuration of FIG. 40 can be utilized for a phosphor that does have significant absorption of its own emission wavelengths. Dielectric CPC 401 has blue LED 402 coupled to it, with its directed output shown as edge rays 403. This blue light passes unimpeded through diagonal blue-pass filter 404 and proceeds into dielectric CPC 405 to illuminate phosphor patch 406. Phosphor back emission proceeds to filter 404 and is reflected into third dielectric CPC 407, which has exit face 408. Flat section 407f acts to restrict incidence angles to less than the critical angle $\alpha_C$, given by $\alpha_C = \sin^{-1}(1/n)$ for refractive index n of the dielectric material comprising CPC 407.

Figure 41:
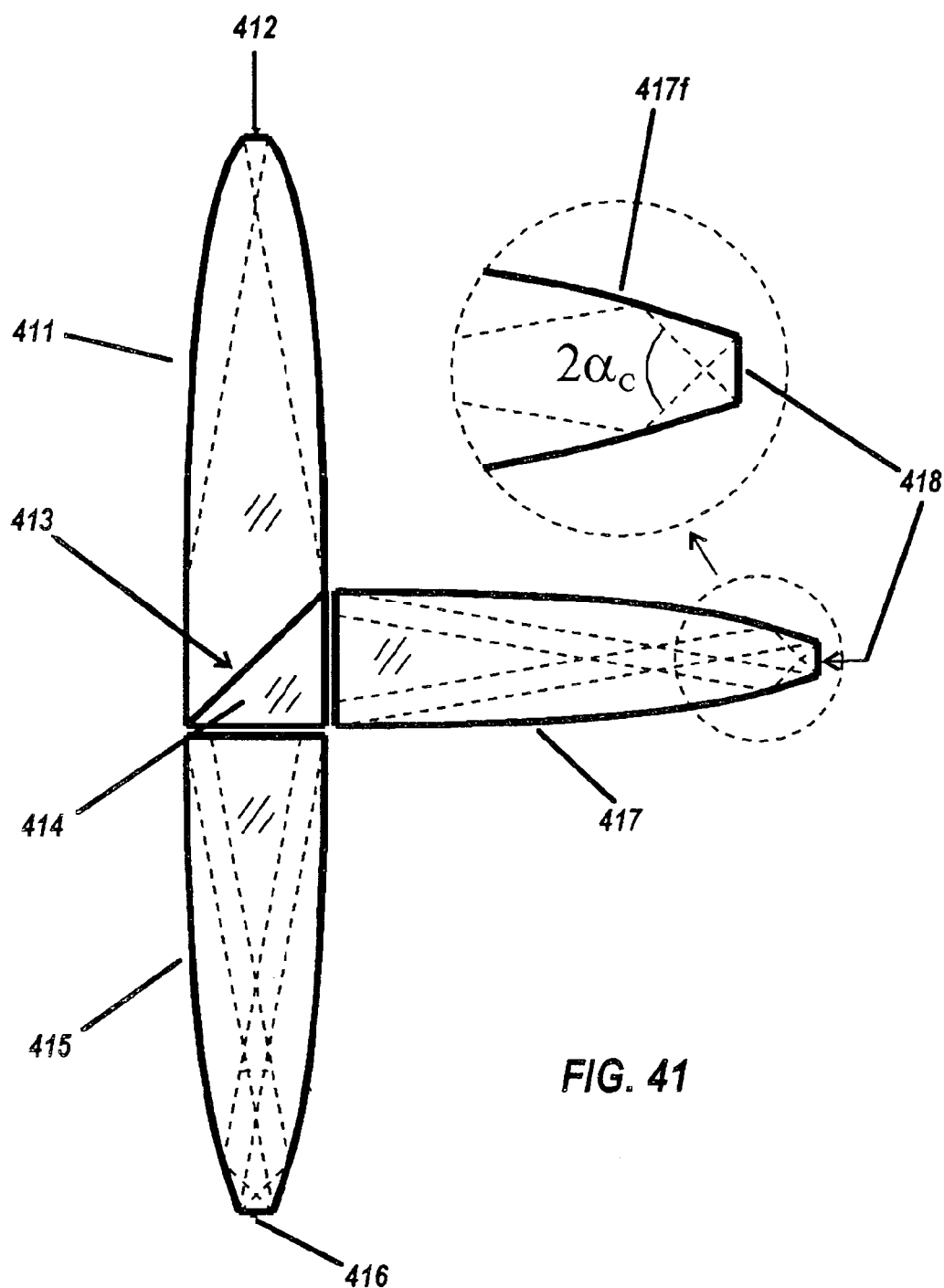
FIG. 41 is a cross-sectional view of another alternate configuration as in FIG. 40, also including a phosphor-coated surface.

FIG. 41 is a cross-sectional view of an alternative configuration of an optical manifold. FIG. 41 shows a similar configuration to FIG. 41, including a dielectric CPC 411 having a blue LED 412 coupled thereto. The CPC 411 has a diagonal exit face 413 with a blue-pass filter coated thereupon. Optically joined to face 413 is a diagonal prism 414. Adjacent to the prism 414 is a dielectric CPC 415, having a phosphor patch 416 on its exit face. Phosphor back-emission proceeds through prism 414, reflects off diagonal exit face 413 into dielectric CPC 417. This reflected back-emission forms a virtual source 418 at the exit face of CPC 417. An expanded view shows how flat section 417f acts to restrict incidence angles on face 418 to the critical angle $\alpha_C$.

Figure 42:
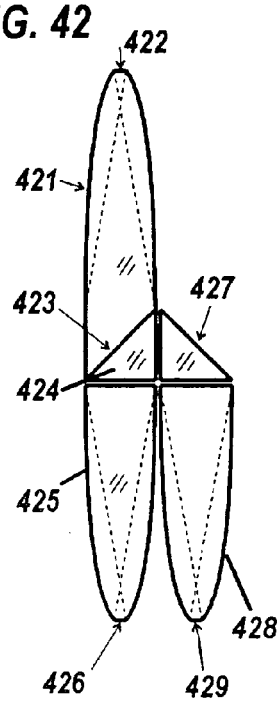
FIG. 42 is a cross-sectional view of another alternate configuration of FIG. 41, also including a phosphor-coated surface.

FIG. 42 is a cross-sectional view of an alternative configuration of an optical manifold. FIG. 42 depicts a similar configuration to FIG. 41. A dielectric CPC 421 is coupled to the blue LED 422 and has a diagonal exit face 423 with a blue-pass mirror coated thereupon and optically joined to prism 424. Dielectric CPC 425 receives the blue light from LED 422 and concentrates it on phosphor 426. The phosphor back-emission is reflected through prism 424 into diagonal prism 427. Third dielectric CPC 428 receives the back emission from prism 427 and concentrates it through the exit face 429.

Figure 43:
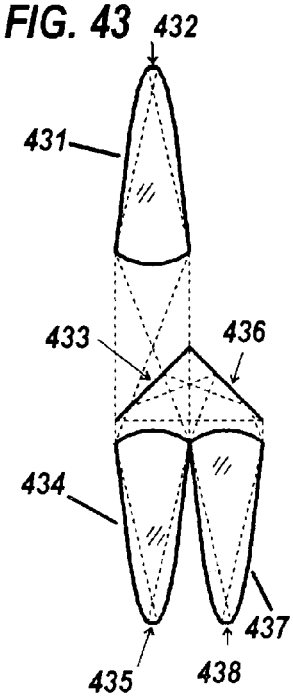
FIG. 43 is a cross-sectional view of a free-space version of FIG. 42, also including a phosphor-coated surface.

FIG. 43 is a cross-sectional view of a free-space version of FIG. 42. Curved-top dielectric CPC 431 is coupled to the blue LED 432 and sends its light through blue-pass filter 433 to the second dielectric CPC 434, having a phosphor patch 435 at its exit face. The phosphor back-emission is reflected by a filter 433 to the mirror 436, thence into the third CPC 437, where it is concentrated through the exit face 438.

Figure 44:
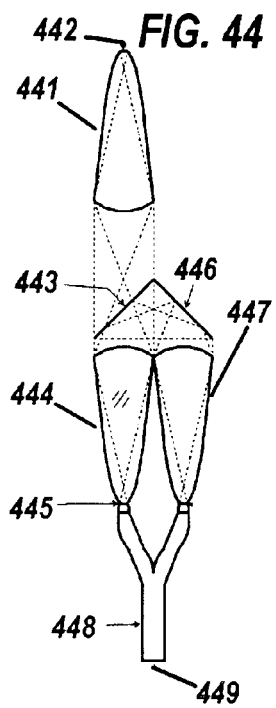
FIG. 44 is a cross-sectional view of an alternate configuration that adds a combiner to FIG. 43, also including a phosphor-coated surface.

FIG. 44 is a cross-sectional view of an alternative configuration of an optical manifold that resembles FIG. 43. FIG. 44 has a CPC 441, a blue LED 442, a blue-pass filter 443, a second CPC 444, a phosphor patch 445, a diagonal mirror 446, and a third CPC 447. A Y-shaped combiner 448 has an output face 449 with twice the area of the phosphor patch 445.

Figure 45:
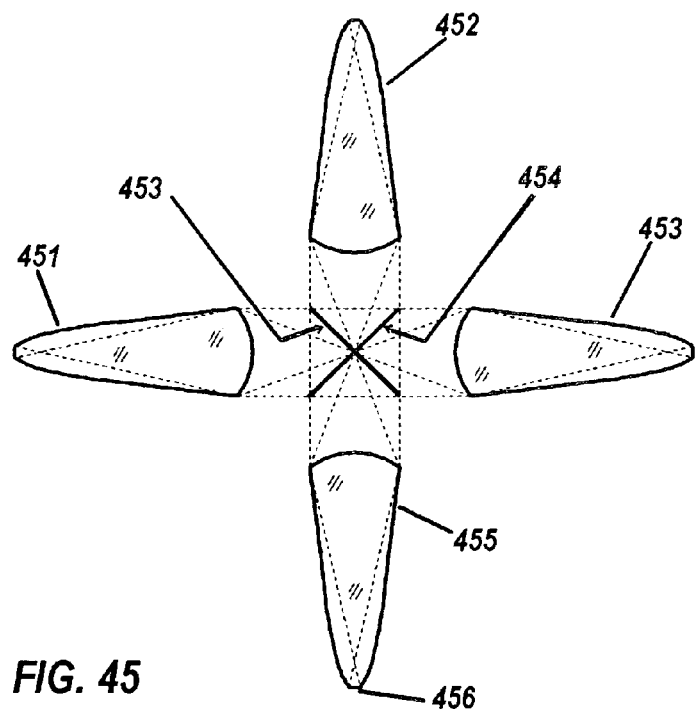
FIG. 45 is a cross-sectional view of an alternate configuration that includes an orthogonal three-color free-space combiner with the refracted output area of one source, not all three, to provide a multiwavelength output.

FIG. 45 is a cross-sectional view of an an optical manifold that can be used to combine a plurality of LEDS of different colors to provide a multiwavelength light output. When combining plurality of LEDs of different colors into a white resultant, it is advantageous if the output area is about the same as the input area of any one color, rather than their sum, since this would increase luminance, for example by a factor of about three. (It should be noted that strictly speaking that if the LED is embedded in a solid dielectric that in order for all the light to exit from the output area to the air, the size of the output area must be larger than the input area by a factor equal to the square of the index of refraction of the dielectric material.) FIG. 45 shows one way of accomplishing this. Three curved-face dielectric CPCs are shown, including a red CPC 451, a green CPC 452, and a blue CPC 453. Corresponding LED sources, R, G, and B are in optical contact with their respective CPCs, i.e., with no air gap. A diagonal filter 454 reflects only red light. Second diagonal filter 455 reflects only blue light. All three colors are thereby overlaid and sent into fourth CPC 456, which combines their light into a white resultant at exit face 457. The close-up view shows how face 475 is actually larger than faces R, G, or B, by a factor at least equal to refractive index n of the dielectric material comprising the four CPCs 451, 452, 453, and 456. (This factor holds only for the 2-dimensional case. In three dimensions the area of the exit face would be larger by a factor of $n^2$.) The CPC 456, however, also differs since it alone also comprises basal linear section 458, which acts to restrict incidence angles upon face 457 to a maximum of critical angle $\alpha_C$. Refracted rays exiting face 457 will range up to 90°, as shown by extreme ray 459.

Figure 46:
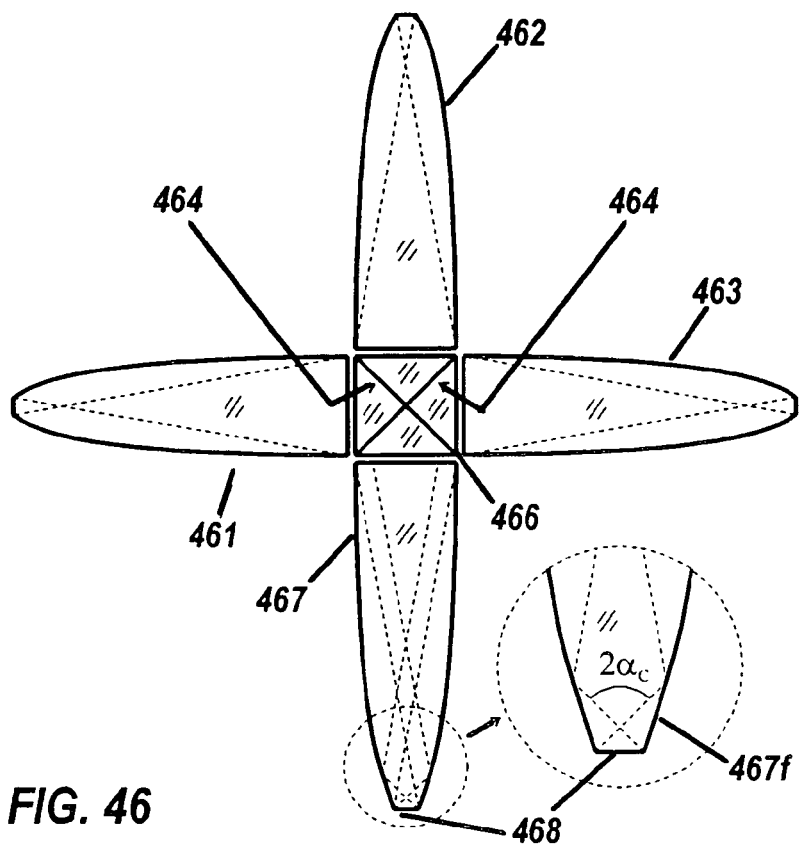
FIG. 46 is a cross-sectional view of an alternate configuration that includes a orthogonal combiner as in FIG. 45 to provide a multiwavelength output, but with a four-prism filter arrangement.

FIG. 46 is a cross-sectional view of an alternative configuration of an optical manifold that can be used to combine a plurality of different color LEDS to provide a multiwavelength light output. FIG. 46 shows a red dielectric CPC 461, a green CPC 462, and a blue CPC 463. A first diagonal filter 464 reflects only red light, and a second diagonal filter 465 reflects only blue light. A prism block 466 is assembled from four smaller prisms having these filter coatings upon them. A fourth dielectric CPC 467 receives three superimposed radiant inputs and combines them into a single white output at exit face 468, whose edge is n times the size of one of edges of the three colored CPCs. A straight section 467$f$ restricts incident rays to critical angle $\alpha_C$.

Figure 47:
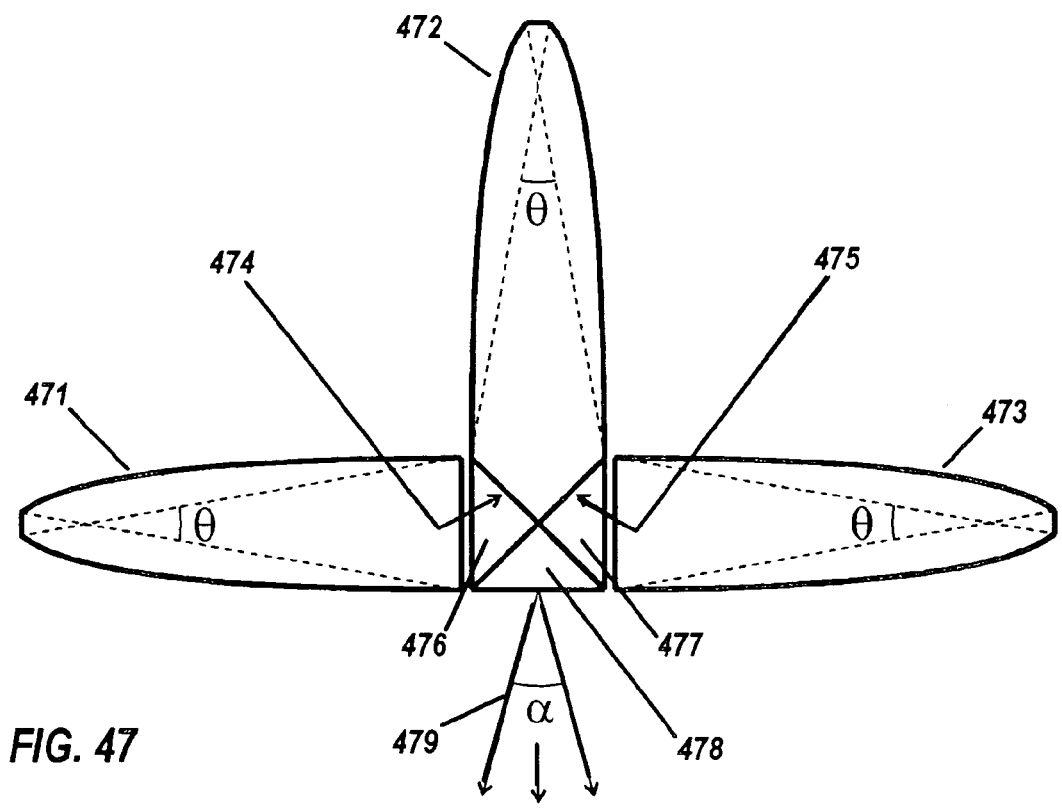
FIG. 47 is a cross-sectional view of an alternate configuration to provide a multiwavelength output that includes an orthogonal prism combiner with angularly narrow-output.

FIG. 47 is a cross-sectional view of an alternative configuration of an optical manifold that resembles FIG. 46. When a white resultant is desired with a narrow angle, the fourth CPC can be dispensed with. Also, an air gap is not strictly necessary between the prism block and the green CPC. FIG. 47 shows the result, with red dielectric CPC 471 and blue dielectric CPC 473 as before, but green CPC 472 has a dual-diagonal exit face. Red reflector 474 and blue reflector 475 are applied to the faces of diagonal sub-prisms 476, 477, and 478. The combined white output 479 has beamwidth $\alpha$ that is the Snellian resultant of internal angle $\theta$ of the three CPCs.

Figure 48:
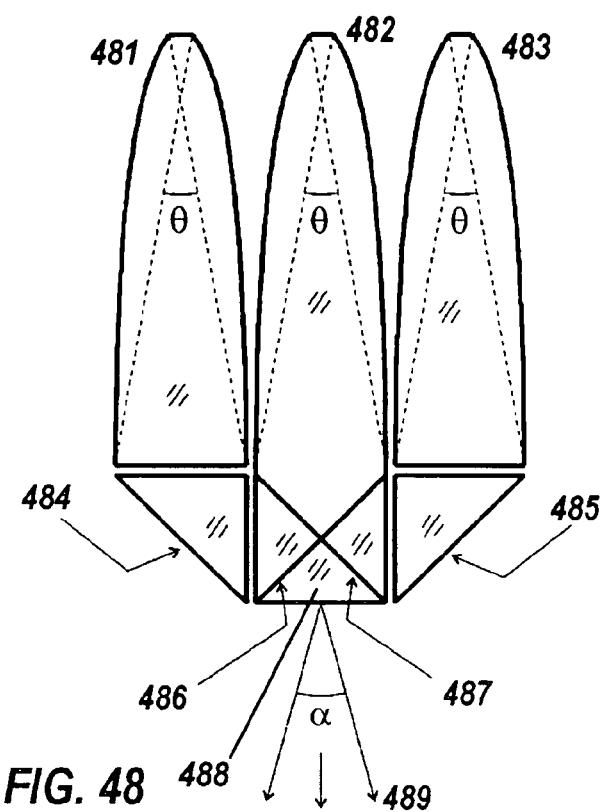
FIG. 48 is a cross-sectional view of an alternate configuration that shows a parallel three-color combiner with angularly narrow output.

FIG. 48 is a cross-sectional view of an alternative configuration of an optical manifold that can be used to combine a plurality of different color LEDs to provide a multiwavelength light output. It would be more convenient if the LEDs could be in the same plane. Accordingly, FIG. 48 shows a plurality of parallel dielectric CPCs, including a red CPC 481, a green CPC 482, and a blue CPC 483. First and second diagonal mirror-prisms 484 and 485 are also shown. Sub-prisms 486, 487, and 488 are as before, providing a white output 489.

Figure 49:
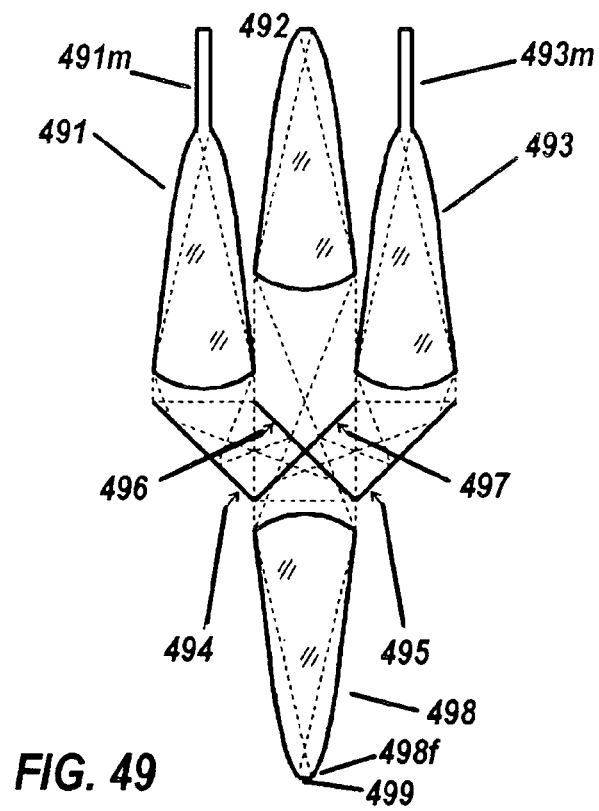
FIG. 49 is a cross-sectional view of an alternate configuration that includes a free-space parallel combiner with output area n times one input.

FIG. 49 is a cross-sectional view of an alternative configuration of an optical manifold that can be used to combine a plurality of different color LEDs to provide a multiwavelength light output. A free-space version of coplanar sources is also possible. FIG. 49 shows a red CPC 491 with a mixing rod 491$m$ and injector 491$i$, a green curved-top CPC 492, and a blue CPC 493 with configuration identical to CPC 491. A diagonal mirror 494 deflects red light onto red reflector 496, while mirror 495 deflects blue light onto blue reflector 497. Fourth CPC 498 combines these beams into a white output at exit face 499, with flat section 498$f$ restricting incidence angles at 499 to critical angle $\alpha_C$.

Figures 50, 51A:
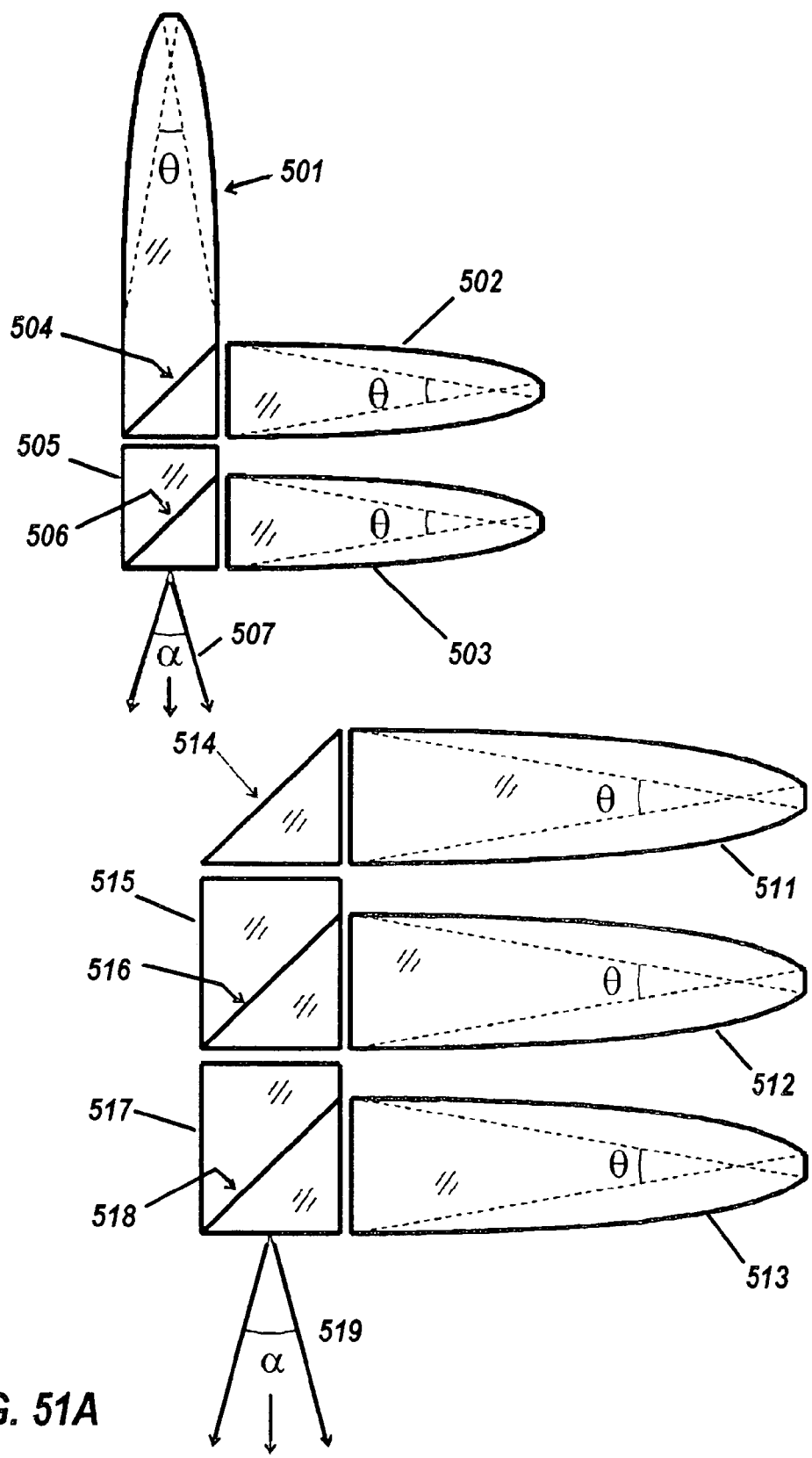
FIG. 50 is a cross-sectional view of an alternate configuration that can be used to combine a plurality of LEDs of different colors to provide a multiwavelength light output, including a prism combiner with two lateral CPCs.
FIG. 51A is a cross-sectional view of an alternate configuration that includes a prism combiner with three lateral CPCs arranged in parallel to combine light and provide a multiwavelength light output.

FIG. 50 is a cross-sectional view of an alternative configuration of an optical manifold that can be used to combine a plurality of different color LEDs to provide a multiwavelength light output. In FIG. 50 an optical manifold has a red CPC 501 with a diagonal exit face, a green CPC 502, and a blue CPC 503. Prism 504 has a red-pass green reflector on its diagonal face. Transition prism 505 receives the combined red and green light, and is optically joined to prism 506, which has a blue reflector on its diagonal and white output 507 exiting it.

FIG. 51A is a cross-sectional view of an alternative configuration of an optical manifold that utilizes coplanar sources. The embodiment of FIG. 51A includes a red dielectric CPC 511, a green dielectric CPC 512, and a blue dielectric CPC 513. A diagonal mirror prism 514 reflects red light downwards through transition prism 515. Optically coupled to prism 515 is diagonal prism 516 with a green reflector coating on its diagonal, which sends green light down through transition prism 517. Optically coupled to prism 517 is diagonal prism 518 with a blue reflector coating on its diagonal. White output 519 exits the bottom of prism 519 with beamwidth $\alpha$.

Figure 51B:
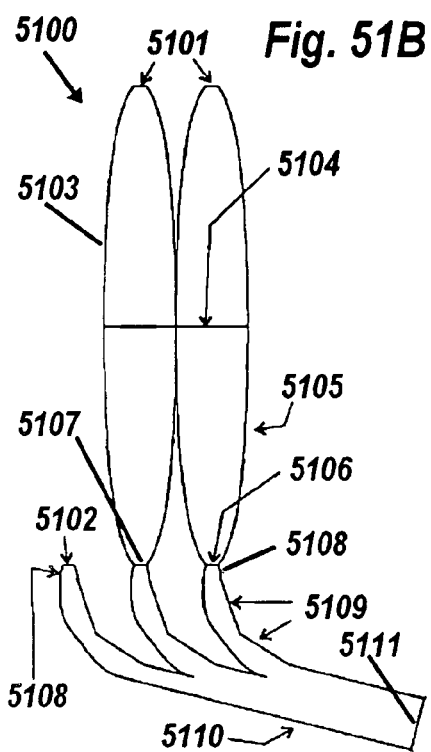
FIG. 51B is a cross-sectional view of a manifold that produces a multiwavelength output using different color LEDs, and a phosphor-coated surface.

Reference is now made to FIG. 51B. In some embodiments it is possible to employ two different phosphors in the blue-excitation embodiments of the optical transformer described herein. A green phosphor with good quantum efficiency could produce about the same luminosity as a green LED of the same radiant output as its blue-excitation LED, but its broader range of wavelengths is better for color rendition. The second phosphor could be a conventional yellow phosphor much like that now used in white LEDs, but doped to reduce the red portion of its emission. This is advantageous in that red wavelengths have a large Stokes loss when generated by photoluminescence. Instead, a red LED can be mixed with the two phosphors to produce an excellent white source. FIG. 51B is a cross-sectional view of a configuration of an optical manifold that generates a multiwavelength light output. Particularly, the optical system in FIG. 51B includes a white LED manifold 5100, and including two blue LEDs 5101 and a red LED 5102 as luminous inputs. The blue LEDs 5101 feed CPCs 5103, which collimate their light onto blue-pass dichroic filter 5104, which in turn lies atop CPCs 5105. Green phosphor 5106 and yellow phosphor 5107 have their back-emission recycled by filter 5104, and their enhanced forward emission collected by small CPCs 5108, which in turn feed angle-rotator pairs 5109. Each second rotator feeds output mixing rod 5110 that delivers uniform luminance and uniform white-chrominance at exit port 5111.

Figure 51C:
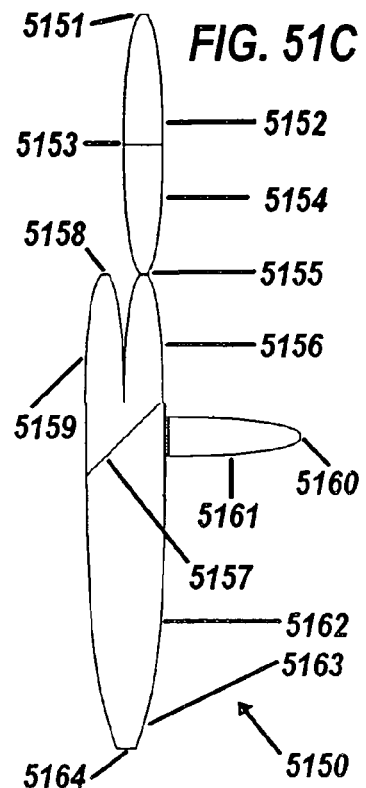
FIG. 51C is a cross-sectional view of an alternate configuration of a manifold that produces a multiwavelength output using different color LEDs, and a phosphor-coated surface.

FIG. 51C is a cross-sectional view of an alternative configuration of an optical manifold that generates a multi-wavelength light output. The embodiment of FIG. 51C has a green phosphor only. The optical system in FIG. 51C includes a manifold 5150 that has an input blue LED 5151 feeding a CPC 5152, which contacts a blue-pass filter 5153. A CPC 5154 has a green phosphor 5155 at its small end. A phosphor 5155 feeds a CPC 5156, which collimates the phosphor's light onto diagonal red-reflecting filter 5157. A blue LED 5158 feeds a CPC 5159, which sends collimated blue light through the filter 5157. The red LED 5150 feeds a CPC 5161, which sends collimated light onto filter 5157, which in turn reflects this light 90° along large CPC 5162. A large CPC 5162 mixes the light from small CPCs 5156, 5159, and 5161, conveying them to angle transformer 5163, which narrows their angle for refraction out exit face 5164.

The ability of the optical transformer described herein to integrate plurality of LED sources enables more than three wavelengths to be used and combined. Because the chromatic aberrations of the human eye tend to disturbingly separate the red and blue images of RGB video, the addition of amber and cyan colors can be added to reduce such effects. For example, the stacked configuration of FIG. 51A can be augmented with two more CPCs and filters for the amber and cyan sources.

Figure 52:
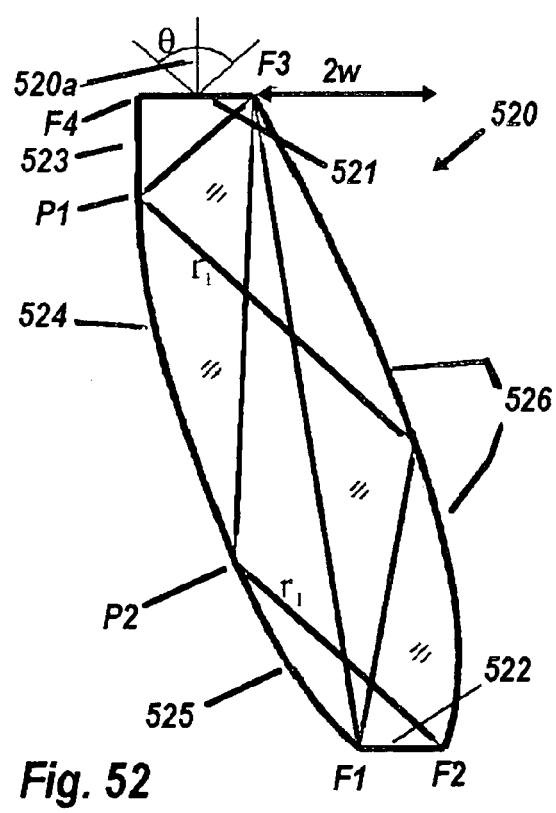
FIG. 52 is a cross-sectional view of an alternate configuration of an optical manifold that includes a double-width luminance shifter.

Reference is now made to FIG. 52, which is a cross-sectional view of an alternative configuration of an optical manifold. Returning to the subject of luminance shifters and continuing the sequence of the half-width lateral shifter 150 in FIG. 15A and full-width shifter 155 in 15B, the embodiment of FIG. 52 includes a luminance shifter 520 capable of a double-width lateral shift, shown as arrow designated 2w. As shown, light is restricted to angle θ from axis 520a drawn on exit port 521. Input port 522 has the same width (w) and is laterally shifted with respect to port 521 by twice its width. The left profile comprises flat 523 running from point F4 to point P1, parabolic arc 524 running between points P1 and P2, with focus at $F_3$ and axis parallel to lines $r_1$, and elliptical arc 525, running from point P2 to focus F1, with foci at $F_2$ and $F_3$. The right profile comprises parabolic arc 526 with focus at F1 and axis parallel to lines $r_1$.

FIG. 53A is a plan view of a triplex optical manifold 530 comprising left luminance shifter 531 of FIG. 52 (imaged to the left), middle luminance duct 532, and right luminance shifter 533 of FIG. 52, all three having respective input ports 531$i$, 532$i$, and 533$i$, each of width of about 1.2 mm in this example. The two shifters mesh with a middle duct 532 along the length of the straight sections of these two shifters (523 of FIG. 52). At the start of the juncture with duct 531 (nearest the input port), a horizontal width 534 of shifter 531 and 533 is double that of their input ports. The middle duct has a CPC profile 535 at its entry port selected to limit the output to approximately the same exit angle in the horizontal direction as the left and right shifters. This resulting optical system results in a combined exit surface 530e with a width of about 7.2 mm in this example.

FIG. 53B is a side view of the triplex optical manifold 530 shown in FIG. 53A, illustrating its width which is about 2.33 mm in this embodiment. All three manifolds in FIG. 53A have a CPC profile 530c in the orthogonal direction to the profile of FIG. 53A. The height of the CPC is about 2.28 mm. The entry section of middle duct 532 therefore utilizes a dielectric cross-CPC to adjust the vertical and horizontal exit angles to the desired specifications. The output angles for the three-fold manifold in the vertical and horizontal directions can be set independent of each other.

FIG. 54A is a graph that shows the contour diagram 540 of the far-field intensity emitted from the manifold of FIGS. 53A and 53B, with a horizontal angular scale 541 running from 50° left (50L) to right (50R) and vertical scale 542 running from 50° up (50U) to down (50D). Contour lines 540c show intensity levels up to a maximum of 3.25 Watts per steradian. The contour line has sharp horizontal boundaries at about ±30°. The vertical boundaries of the contour line are less steep, extending to about ±40°.

FIG. 54B is a graph that shows a horizontal intensity profile 545 and a vertical intensity profile 546 emitted from the manifold of FIGS. 53A and 53B. Both profiles have well-defined borders and steep skirts. Their overall form is quite reproducible despite individual differences in the LEDs feeding the manifold.

Figure 55:
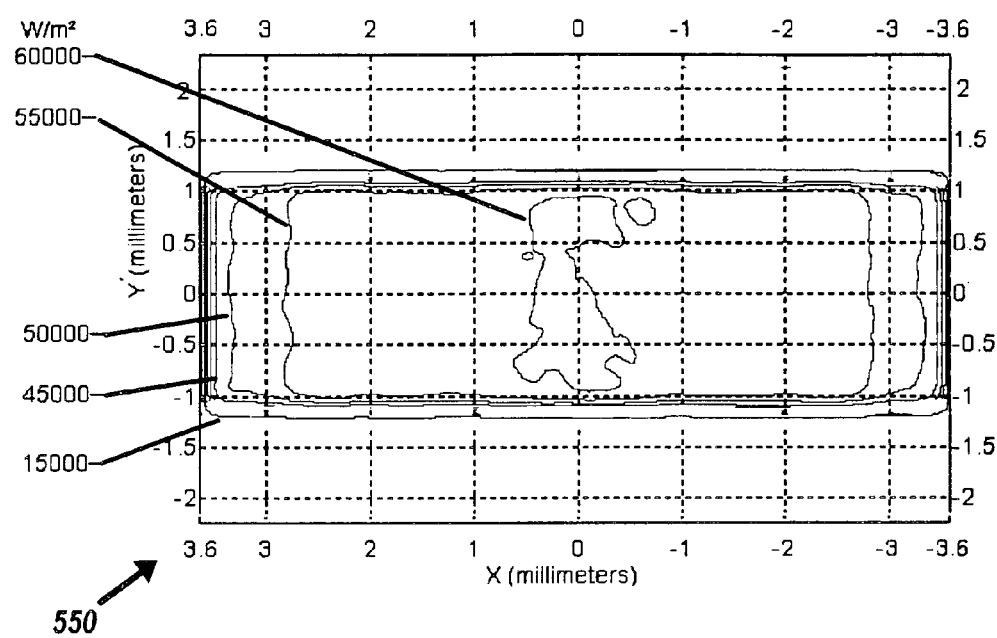
FIG. 55 is a contour graph of the spatial output from the output face of the manifold of FIGS. 53A and 53B.

FIG. 55 is a graphical depiction that shows a spatial luminance map 550, scaled in millimeters, of output face 530e of the manifold of the embodiment shown in FIGS. 53A and 53B. The LEDs 532$i$ of FIG. 53A were modeled with central dark zones, a strong form of input nonuniformity. Nonetheless, map 550 has outstanding uniformity compared to the LEDs feeding the manifold, with sharp well-defined edges. This distribution is little affected by the usual positional tolerances of the LEDs, or their individual differences in luminance. Its uniformity and definition are also superior to other high-luminance light sources such as incandescent filaments or arcs. Contours are labeled for 15,000 W/m$^2$ at the very edge, to over 60,000 at the center. This high power density comes from a single radiant Watt of input.

Figure 56A:
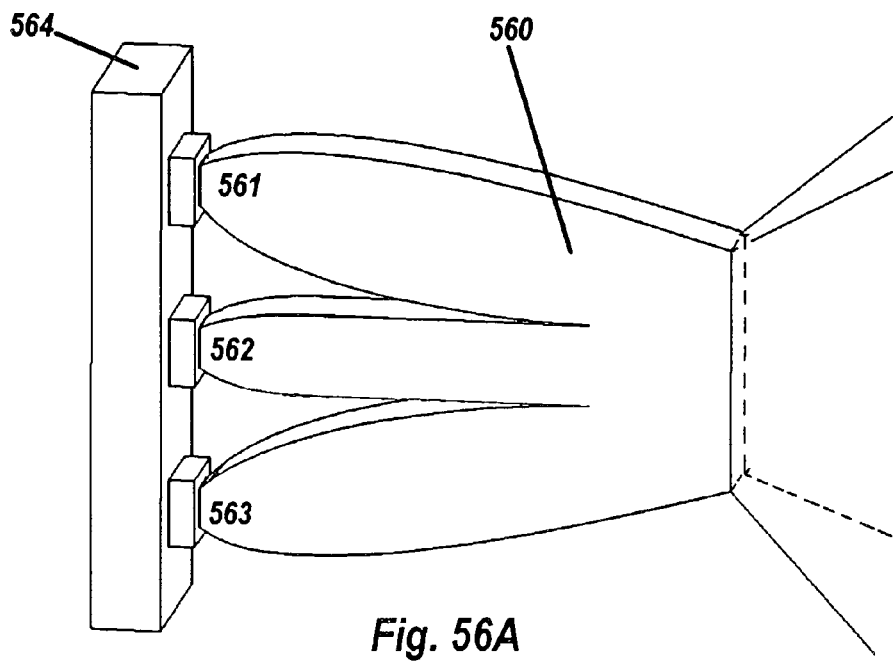
FIG. 56A is a perspective view of another embodiment of a triplex optical manifold, along with three input LEDs, on a circuit board.
Figure 56B:
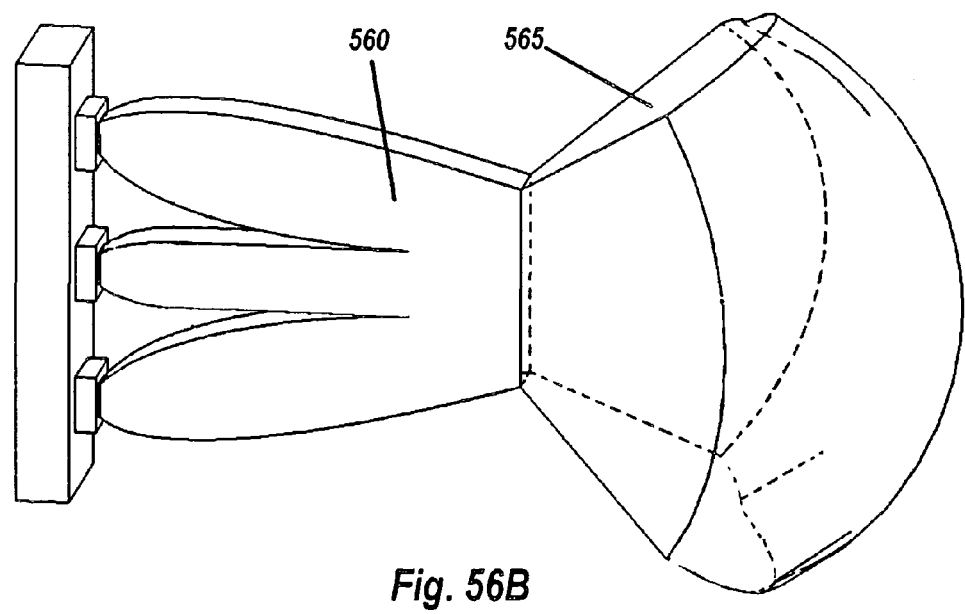
FIG. 56B is a perspective view of the optical-manifold of FIG. 56A, also including a free-form beam-shaping lens.
Figure 56C:
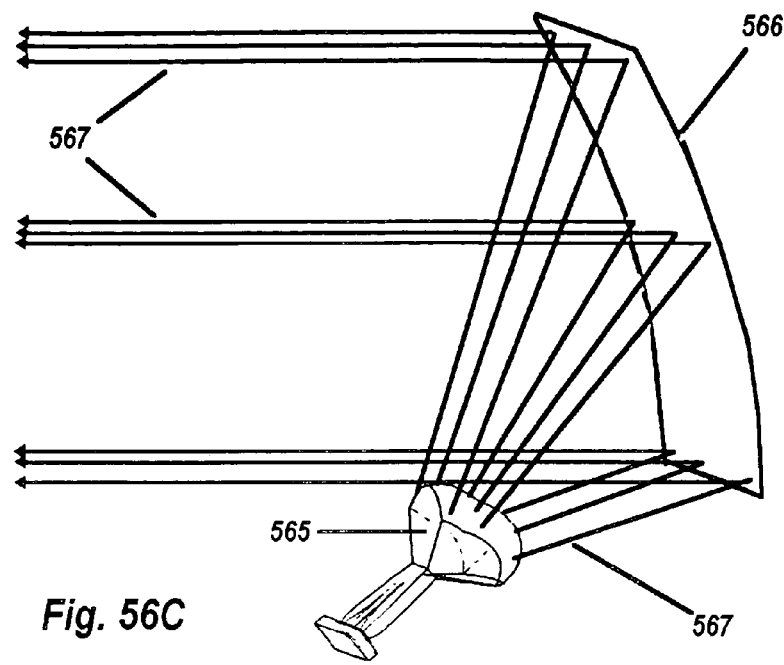
FIG. 56C is a perspective view of the optical-manifold and beam-shaping lens of FIG. 56B, and a ray trace of its output shining on a beam-shaping reflector.

FIGS. 56A, 56B, and 56C illustrate an alternative configuration of a triplex optical manifold. FIG. 56A is a perspective view of a triplex optical manifold 560, along with three input LEDs 561, 562, and 563, all on circuit board 564.

FIG. 56B is a perspective view of a triplex optical manifold 560 as in FIG. 56A, also showing a bulbous free-form lens 565 that shapes the luminous output of manifold 560.

FIG. 56C is a perspective view of the optical manifold 560 as in FIG. 56A, also showing curved rectangular mirror 566, acting to form collimated beam 568 from luminous output 567 of lens 565. Beam 568 fulfills an automotive lighting prescription for a headlamp or other requirements.

Figure 57:
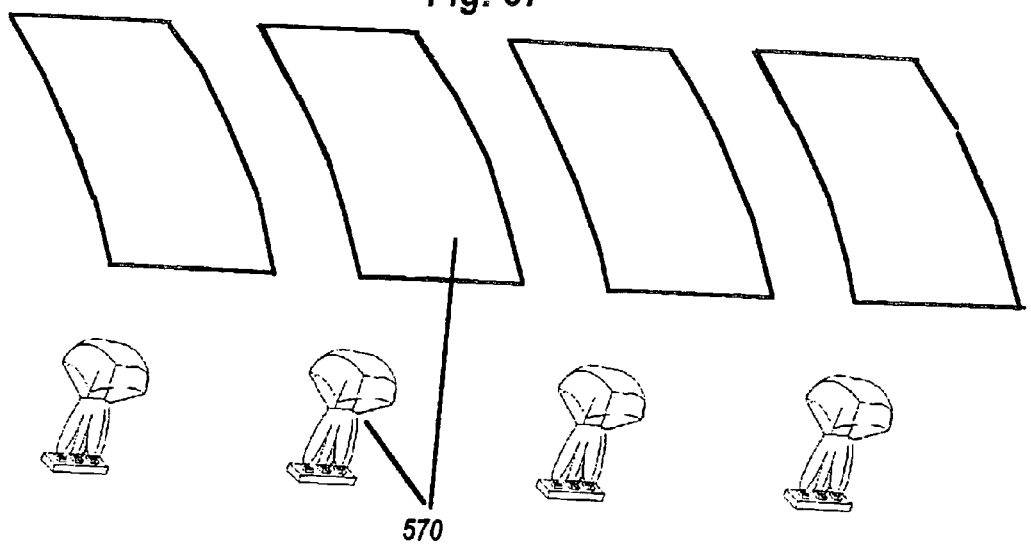
FIG. 57 is a perspective view that includes four such configurations as in FIG. 56C, forming an automotive lamp for example fulfilling a prescription.

FIG. 57 is a perspective view of a bank of four luminaires 570 (see FIG. 32 and related discussion) forming an optically complete automotive lamp.

Figure 58A:
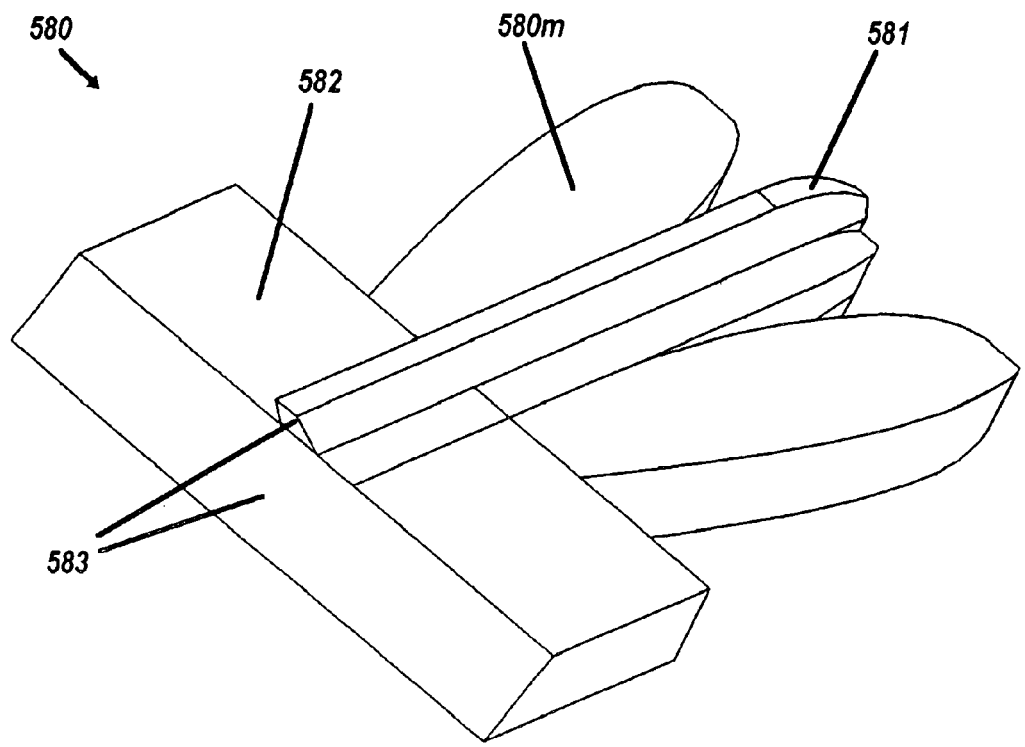
FIG. 58A is a perspective view of an asymmetric manifold for producing an exit aperture in the shape of a beam illuminance pattern approximately matching those of automotive headlamp lighting requirements.
Figure 58B:
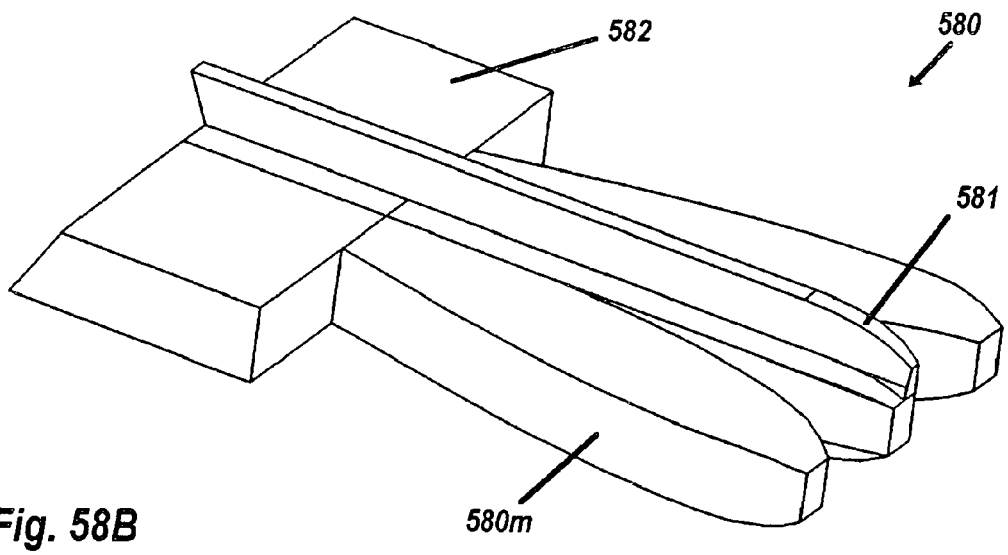
FIG. 58B is another perspective view of the asymmetric manifold of FIG. 58A.

FIGS. 58A and 58B illustrate another approach to producing an asymmetrical beam pattern for such applications as automotive lighting, in particular automotive headlamps. FIG. 58A shows an out-side perspective view of asymmetric manifold 580 with the shape of triplex manifold 530 of FIG. 53A, also comprising secondary duct 581 meshed with primary duct 582. FIG. 58B is another perspective view. Duct 582 has a cross-sectional shape at exit surface 583 whose outer boundary approximately matches the shape of a far field automotive headlamp beam illuminance or intensity pattern. Duct 582 can be tapered in one or more directions along its length to adjust the intensity at various points on exit surface 583. The angular output of 580 in the vertical and horizontal directions can also be adjusted by the design of triplex manifold 580m. The output from exit surface 581 can than be further adjusted by secondary optics that employ either imaging or nonimaging principles.

The description herein describes both individual optical elements and several embodiments that combine them as building blocks. One common theme of these elements and their combinations is preservation of source luminance through etendue preservation, using novel applications of the principles of non-imaging optics.

The preceding description of the presently contemplated best mode of practicing the optical transformer described herein is not to be taken in a limiting sense, but is made merely for the purpose of describing the general principles of the invention. The scope of the invention should be determined with reference to the claims.

It will be appreciated by those skilled in the art, in view of these teachings, that alternative embodiments may be implemented without deviating from the spirit or scope of the invention. This invention is to be limited only by the following claims, which include all such embodiments and modifications when viewed in conjunction with the above specification and accompanying drawings.

What is claimed is:

1. A multiwavelength light source comprising:
   at least one LED that emits light at a dominant wavelength;
   an optical filter that transmits light about a prescribed wavelength and reflects other wavelengths;
   an input collimating optical system that directs light from said at least one LED through said optical filter;
   an output optical system coupled to receive said light throughput from said optical filter, said output optical system configured as a concentrator and having an exit port on the opposite end;
   a phosphor patch formed on said exit port, said phosphor having a composition that luminesces in response to excitation from light generated by said LEDs, said phosphor patch also being transinissive to light from said LED; and
   wherein said output optical system has a shape that recycles and approximately collimates backscattered luminescence from said phosphor by directing said backscattered luminescence to said optical filter from which it is reflected back to said exit port.

2. The multiwavelength light source of claim 1 wherein said optical filter comprises one of a bandpass filter and a shortpass filter.

3. The multiwavelength light source of claim 1 wherein:
   said input collimating system comprises a two stage collimator that includes a stage one collimating angle transformer, comprising a transparent material having a higher index of refraction than the stage two collimator, said stage one collimator being coupled to at least one LED.

4. A multiwavelength light source comprising:
   a plurality of LEDs that emit light at and about a dominant wavelength;
   a plurality of noiiimaging input collimators comprising a dielectric material, each input collimator connected respectively to one of said plurality of LEDs;
   a nonimaging output concentrator comprising a dielectric material, said output concentrator coupled to collectively receive the light output from each of said input collimators on one end, said output concentrator having an exit port on the opposite end;
   a shortpass filter at the interface between the input collimators and the output concentrator, said sbortpass filter transmitting light below a prescribed wavelength and reflecting light above a prescribed wavelength; and
   a phosphor patch formed on said exit port, said phosphor having a composition that luminesces in response to excitation from light generated by said LEDs, said phosphor patch also being partially transinissive to light from said LEDs.

5. The multiwavelength light source of claim 4 wherein: said LEDs emit a blue color light; said shortpass filter comprises a blue-pass filter; and said phosphor has a composition that emits approximately yellow luminescence in response to excitation by the blue light generated by said LEDs, thereby providing an approximately white light source.

6. The multiwavelength light source of claim 4 wherein said noniniaging devices in the input optical system comprise at least one of a compound parabolic concentrator.

7. The multiwavelength light source of claim 4 wherein said nonimaging collimators and collimators are cross-CPCs tat have an approximately square cross section along their length.

8. The multiwavelength light source of claim 7 wherein said plurality of said collimators are ranged in a square configuration.

9. The multiwavelength light source of claim 8 wherein said output concentrator has an approximately square cross-section along its length.

10. The multiwavelength light source of claim 4 wherein said LEDs comprise immersed LEDs.

11. The multiwavelength light source of claim 4 wherein:
    said plurality of LEDs comprise a first plurality of LEDs that emit approximately at said first dominant wavelength, and a second plurality of LEDs that emit approximately about a second dominant wavelength, and further comprising:
    a dual shortpass filter at the interface between the input optical system and the output optical system, said dual shortpass filter transmitting light below a first and a second prescribed wavelengths; and
    said phosphor has a composition that luminesces in response to excitation by at least one of said first and second wavelengths.

12. An optical manifold for distributing light, comprising:
    a transparent body defining on outer surface, at least one entry port, and at least one exit port, said transparent body comprising a material suitable for propagating light, said material having an index of refraction suitable for providing total internal reflection at the surface of said body;
    said outer surface comprising optically active surfaces angled for total internal reflection of light issuing into and out of said entry and exit ports;
    said entry and exit ports operable for light-transmittance at substantially all incidence angles up to the critical angle of said material;
    said entry and exit ports comprising a plurality of small ports acting in parallel and one large port optically connected to said plurality of small ports; said optically active surfaces operable as connecting surfaces between said plurality of ports and said single port; said connecting surfaces operable for conveying light by total internal reflection at all incidence angles past the critical angle of said transparent material; and said connecting surfaces comprising nonimaging configurations that spatially mix said light.

13. The system of claim 12 wherein said transparent body defines a plurality of small nonimaging transformers connected to said plurality of small ports and a large nonimaging transformer connected to said large port, said plurality of nonimaging concentrators spatially arrayed to connect to said large noniniaging transformer.

14. The system of claim 13 wherein said nonimaging optical transformer comprises at least one of a collimator, a concentrator, and an angle-rotator.

15. The system of claim 13 wherein said nonimaging optical transformer comprises at least one of a collimator, a concentrator, and a luminance shifter.

16. The system of claim 13 wherein said nonimaging optical collimator comprises an SMS optic.

17. The system of claim 13 wherein said nonimaging optical concentrator comprises an SMS optic.

18. The system of claim 13 further comprising a plurality of LEDs connected to said plurality of small ports so tat said plurality of small ports define a corresponding plurality of entry apertures, and said plurality of small nonimaging transformers comprise a plurality in an arry configuration, said plurality of small ports arranged to optically couple respectively with said plurality of LEDs.

19. The system of claim 12 further comprising a high index transparent material surrounding said transparent body proximate to said entry port, said high index transparent material having an index of refraction higher than said material of said transparent body.

20. The system of claim 12 wherein said plurality of small ports are spatially separated and said connecting surfaces comprise a branching structure defined by separate light channels issuing from a single channel optically connected to said single large port.

21. The system of claim 12 further comprising:
a plurality of LEDs of different colors connected to said plurality of small ports so that said plurality of small ports receive light of different colors; and
a plurality of wavelength-dependent filters arranged to combine the light from the plurality of small ports at the plurality of wavelengths into a single multiwavelength beam.

22. The system of claim 12 wherein said plurality of small ports comprise circularly symmetric TIR lenses adjacently arrayed hexagonally and said single large port comprises a single large circularly symmetric TIR lens optically coupled to said small TIR lenses.

23. An N:1 optical manifold, where N is an integer having a value of two or greater, comprising:
N LEDs tat generate light said LEDs arranged in an approximately coplanar configuration;
N coplanar input ports optically coupled, respectively to said N LEDs;
N angle rotators connected respectively to said input ports;
an output manifold coupled to said angle rotators to receive the collective light propagated from said LEDs and through said angle rotators;
an exit port on said output manifold, said angle rotators arranged with respect to said output port to direct light approximately toward said output port; and
a plurality of slits, each slit formed proximate to its respective angle rotator to provide total internal reflection at the intersection between said LEDs and said angle rotators and direct the ligbt output from the angle rotators toward the exit port.

24. The N:1 optical manifold of claim 23 wherein an air gap is defined between each of said LEDs and said angle rotators, so that within said manifold the light is confined within a critical angle for total internal reflection.

25. A triplex optical manifold for collecting and emitting light from a first, second, and third LED comprising:
a first luminance shifter having an input port connected to the first LED and an exit aperture on its opposite end;
a second luminance shifter having an input port connected to the second LED, and an exit aperture on its opposite end;
a luminance duct arranged between said first and second luminance shifters, said luminance duct having an input port connected to the third LED, said luminance duct having a configuration selected to output light from its exit aperture with an exit angle approximately equal to the light from the exit apertures of said first and second Luminance shifters;
an output manifold coupled to receive the light output from said luminance shifters and said luminance duct;
said first and second luminance shifters and said luminance duct arranged in a converting, non-parallel configuration, and so that their exit apertures converge to said output manifold; and
an output port on said output manifold.

26. A multiwavelength light source according to claim 1, wherein the output optical system configured as a concentrator comprises a concentrator that is etendue-limited from the short-pass filter to the phosphor patch.

27. A multiwavelength light source according to claim 26, wherein the etendue-limited concentrator comprises a concentrator selected from the group consisting of parabolic concentrators and elliptical concentrators.

28. A multiwavelength light source according to claim 26, wherein the etendue-limited concentrator comprises a compound parabolic concentrator.

* * * * *